(12) United States Patent
Ohashi et al.

(10) Patent No.: US 9,411,225 B2
(45) Date of Patent: Aug. 9, 2016

(54) PHOTO ACID GENERATOR, CHEMICALLY AMPLIFIED RESIST COMPOSITION, AND PATTERNING PROCESS

(71) Applicant: SHIN-ETSU CHEMICAL CO., LTD., Tokyo (JP)

(72) Inventors: Masaki Ohashi, Jyoetsu (JP); Masahiro Fukushima, Jyoetsu (JP); Kenichi Oikawa, Jyoetsu (JP); Koji Hasegawa, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/728,620

(22) Filed: Jun. 2, 2015

(65) Prior Publication Data

US 2016/0004155 A1    Jan. 7, 2016

(30) Foreign Application Priority Data

Jul. 4, 2014   (JP) .................. 2014-139019

(51) Int. Cl.
| | |
|---|---|
| G03F 7/004 | (2006.01) |
| G03F 7/039 | (2006.01) |
| G03F 7/20 | (2006.01) |
| G03F 7/30 | (2006.01) |
| G03F 7/38 | (2006.01) |
| G03F 7/09 | (2006.01) |
| G03F 7/11 | (2006.01) |
| G03F 1/20 | (2012.01) |

(52) U.S. Cl.
CPC .............. *G03F 7/0045* (2013.01); *G03F 1/20* (2013.01); *G03F 7/0392* (2013.01); *G03F 7/0397* (2013.01); *G03F 7/09* (2013.01); *G03F 7/11* (2013.01); *G03F 7/2041* (2013.01); *G03F 7/2053* (2013.01); *G03F 7/2059* (2013.01); *G03F 7/30* (2013.01); *G03F 7/38* (2013.01)

(58) Field of Classification Search
None
See application file for complete search history.

(56) References Cited

U.S. PATENT DOCUMENTS

| | | | |
|---|---|---|---|
| 3,676,143 A * | 7/1972 | Himmelmann et al. ................... | G03C 7/3046 430/426 |
| 5,650,483 A | 7/1997 | Malik et al. | |
| 6,312,867 B1 | 11/2001 | Kinsho et al. | |
| 2006/0228648 A1 | 10/2006 | Ohsawa et al. | |
| 2008/0090172 A1 | 4/2008 | Hatakeyama et al. | |
| 2008/0118860 A1 | 5/2008 | Harada et al. | |
| 2008/0187860 A1 | 8/2008 | Tsubaki et al. | |
| 2009/0011366 A1 | 1/2009 | Tsubaki et al. | |
| 2009/0081588 A1 | 3/2009 | Hatakeyama et al. | |
| 2009/0111047 A1 | 4/2009 | Yamashita | |
| 2009/0208867 A1 | 8/2009 | Harada et al. | |
| 2009/0208873 A1 | 8/2009 | Harada et al. | |
| 2009/0274978 A1 | 11/2009 | Ohashi et al. | |
| 2009/0280434 A1 | 11/2009 | Harada et al. | |
| 2010/0035185 A1 | 2/2010 | Hagiwara et al. | |
| 2010/0055608 A1 | 3/2010 | Ohashi et al. | |
| 2010/0099042 A1 | 4/2010 | Ohashi et al. | |
| 2010/0112482 A1 | 5/2010 | Watanabe et al. | |
| 2010/0119970 A1 | 5/2010 | Ohsawa et al. | |
| 2010/0136482 A1 | 6/2010 | Harada et al. | |
| 2010/0209827 A1 | 8/2010 | Ohashi et al. | |
| 2010/0266957 A1 | 10/2010 | Harada et al. | |
| 2011/0008735 A1 | 1/2011 | Ohsawa et al. | |
| 2012/0045724 A1 | 2/2012 | Ohsawa et al. | |

FOREIGN PATENT DOCUMENTS

| | | |
|---|---|---|
| JP | 2000-336121 A | 12/2000 |
| JP | 3790649 B2 | 6/2006 |
| JP | 2007-145797 A | 6/2007 |
| JP | 3991462 B2 | 10/2007 |
| JP | 2008-111103 A | 5/2008 |
| JP | 2008-122932 A | 5/2008 |
| JP | 2008-281974 A | 11/2008 |
| JP | 2008-281975 A | 11/2008 |
| JP | 2009-007327 A | 1/2009 |

(Continued)

OTHER PUBLICATIONS

Dammel, Ralph et al., "193 nm Immersion Lithography—Taking the Plunge", Journal of Photopolymer Science and Technology, vol. 17, No. 4 (2004) pp. 587-601.

*Primary Examiner* — Sin Lee

(74) *Attorney, Agent, or Firm* — Oliff PLC

(57) ABSTRACT

A photo acid generator represented (1a),

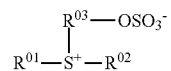

(1a)

wherein $R^{01}$ and $R^{02}$ each independently represent a linear monovalent hydrocarbon group having 1 to 20 carbon atoms or a branched or cyclic monovalent hydrocarbon group having 3 to 20 carbon atoms which may be substituted with or interposed by a heteroatom; $R^{03}$ represents a linear divalent hydrocarbon group having 1 to 30 carbon atoms or a branched or cyclic divalent hydrocarbon group having 3 to 30 carbon atoms which may be substituted with a heteroatom, or interposed by a heteroatom; and $R^{01}$ and $R^{02}$ may be mutually bonded to form a ring together with the sulfur atom in the formula. A photo acid generator can give a pattern excellent in resolution and LER and having a rectangular profile in the photolithography using a high energy beam like ArF excimer laser light, EUV, and electron beam as a light source.

19 Claims, 3 Drawing Sheets

(56) References Cited

FOREIGN PATENT DOCUMENTS

| | | |
|---|---|---|
| JP | 2009-098638 A | 5/2009 |
| JP | 2009-109595 A | 5/2009 |
| JP | 2009-191151 A | 8/2009 |
| JP | 2009-192784 A | 8/2009 |
| JP | 2009-269953 A | 11/2009 |
| JP | 2009-276363 A | 11/2009 |
| JP | 2010-077404 A | 4/2010 |
| JP | 2010-107695 A | 5/2010 |
| JP | 2010-113209 A | 5/2010 |
| JP | 2010-116550 A | 5/2010 |
| JP | 2010-134012 A | 6/2010 |
| JP | 2010-215608 A | 9/2010 |
| JP | 4554665 B2 | 9/2010 |
| JP | 2010-250105 A | 11/2010 |
| JP | 2011-016746 A | 1/2011 |
| JP | 2011-042789 A | 3/2011 |
| JP | 2012-041320 A | 3/2012 |
| JP | 2012-046501 A | 3/2012 |
| JP | 2012-150449 A | 8/2012 |
| WO | WO2012/112421 A1 * | 8/2012 |

* cited by examiner

PHOTO ACID GENERATOR, CHEMICALLY AMPLIFIED RESIST COMPOSITION, AND PATTERNING PROCESS

BACKGROUND OF THE INVENTION

1. Field of the Invention

The present invention relates to a photo acid generator, a chemically amplified resist composition containing the photo acid generator, and a patterning process using the chemically amplified resist composition.

2. Description of the Related Art

In recent years, as LSI advances toward a higher integration and a more rapid processing speed, finer pattern rules are being requested. In this trend, a far ultraviolet lithography and a vacuum ultraviolet lithography are promising for the next generation fine patterning technologies. Especially, a photolithography using an ArF excimer laser light as a light source is an indispensable technology for an ultrafine patterning process with a size of 0.13 µm or less.

The ArF lithography started to be used partially from the fabrication of 130-nm node devices, and then it became a main lithography technology from 90-nm node devices. As the lithography technology for the next 45-nm node devices, a 157-nm lithography using a $F_2$ laser was initially considered as a promising technology; however, a delay in development thereof due to several problems was indicated. Accordingly, an ArF immersion lithography rapidly emerged. In the ArF immersion lithography, a liquid whose refractive index is higher than air, such as water, ethylene glycol, and glycerin, is placed between a projection lens and a wafer. This enables the number of aperture (NA) of the projection lens to be designed so as to be 1.0 or more, thereby attaining a high resolution (for example, see Non-Patent Document 1); and this is now in the stage of practical use. For this immersion lithography, a resist composition not readily eluting into water is being requested.

In the ArF lithography, in order to prevent deterioration of a precise and expensive optical material, a highly sensitive resist composition that can express a sufficient resolution with a small exposure dose is requested. To realize this, the most generally used method is to select each component having a high transparency at a wavelength of 193 nm. For example, as to a base resin, polyacrylic acid, derivatives thereof, norbornene-maleic anhydride alternating copolymer, polynorbornene, ring-opened metathesis polymers, hydrogenated ring-opened metathesis polymers, and the like have been proposed; and these bring a certain level of results in enhancing a transparency of a resin.

Also, in recent years, a negative tone resist by an organic solvent development as well as a positive tone resist by an alkaline development has been receiving an attention. In order to resolve a very fine hole pattern, which cannot be achieved by a positive tone exposure, by a negative tone exposure, a negative pattern is formed by an organic solvent development using a positive resist composition having a high resolution. In addition, an attempt to double the resolution by combining two developments of the alkaline development and the organic solvent development is under study.

As to the ArF resist composition for the negative tone development by an organic solvent, an existing positive ArF resist composition can be used; and patterning processes using these are disclosed in Patent Document 1 to 3.

Also, an electron beam lithography has been utilized as ultrafine patterning technology as well as the ArF lithography, and has become indispensable as a method for processing a photomask blank in producing a photomask used for semiconductor manufacturing.

Generally, as a base polymer of a positive resist composition for an electron beam or an extreme ultraviolet (EUV), a material whose acid-labile protective group that protects an acidic functional group of a phenolic side chain contained in the base polymer is deprotected by an acid catalyst generated from a photo acid generator by high energy beam exposure thereby being made soluble in an alkaline developer is mainly used. As the acid-labile protective group mentioned above, a tertiary alkyl group, a tert-butoxycarbonyl group, an acetal group, and the like have been mainly used. Here, the use of a protective group having a relatively low activation energy required for deprotection, such as an acetal group, can advantageously provide a resist film with high sensitivity. However, if diffusion of the generated acids is insufficiently controlled, deprotection reaction takes place even in an unexposed part of the resist film, thereby causing problems such as deterioration of line edge roughness (LER) and decrease in in-plane uniformity of the pattern line width (that is, CDU: Critical Dimension Uniformity).

Thus, in accordance with a rapidly request for miniaturization, the effect of acid diffusion on lithography performance becomes further serious in a resist composition. This is because the pattern size is approaching the acid diffusion length, whereby resolution, LER, etc. are deteriorated. Accordingly, to gain more benefits from a shorter wavelength of a light source and a higher NA, suppression of acid diffusion is necessary ever than before in the material.

One of effective means for controlling acid diffusion is to introduce a bulky substituent or a polar group into a photo acid generator. Patent Document 4 discloses a photo acid generator having 2-acyloxy-1,1,3,3,3-pentafluoropropane-1-sulfonic acid that is excellent in solubility into a resist solvent and stability and allows various molecular designs. In particular, a photo acid generator having 2-(1-adamantyloxy)-1,1,3,3,3-pentafluoropropane-1-sulfonic acid into which a bulky substituent has been introduced shows reduced acid diffusion. However, the resist composition using it is still insufficient to highly control acid diffusion, and its lithography performance is not satisfactory in overall view of resolution, pattern profile, LER, and so on. Moreover, in the electron beam lithography, a superacidic photo acid generator that generates sulfonic acid partially fluorinated as mentioned above is too highly sensitive to improve resolution and LER. This is because the base resin used in the electron beam lithography is mainly composed of protective units with highly reactivity, such as acetal, whereby acid diffusion is apparently increased.

PRIOR ART DOCUMENTS

Patent Documents

Patent Document 1: Japanese Patent Laid-Open Publication No. 2008-281974
Patent Document 2: Japanese Patent Laid-Open Publication No. 2008-281975
Patent Document 3: Japanese Patent No. 4554665
Patent Document 4: Japanese Patent Laid-Open Publication No. 2007-145797

Non-Patent Document

Non-Patent Document 1: Journal of photopolymer Science and Technology Vol. 17, No. 4, p 587 (2004)

SUMMARY OF THE INVENTION

It is desired that an acid generated from a photo acid generator has acid strength sufficient to cut an acid-labile group in a resist composition, a high sensitivity, a sufficiently controlled acid diffusion in the resist composition, and a low volatility. However, the resist composition using the conventional photo acid generator does not satisfy these requirements.

The present invention was accomplished in view of the circumstances, and has an object to provide a photo acid generator that can give a pattern excellent in resolution and LER and having a rectangular profile in the photolithography using a high energy beam such as ArF excimer laser light, EUV, and electron beam as a light source, and further provide a chemically amplified resist composition containing the photo acid generator and a patterning process using the chemically amplified resist composition.

To solve the above-mentioned problems, the present invention provides a photo acid generator represented by the following general formula (1a),

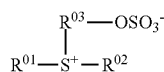

(1a)

wherein $R^{01}$ and $R^{02}$ each independently represent a linear monovalent hydrocarbon group having 1 to 20 carbon atoms or a branched or cyclic monovalent hydrocarbon group having 3 to 20 carbon atoms which may be substituted with a heteroatom, or interposed by a heteroatom; $R^{03}$ represents a linear divalent hydrocarbon group having 1 to 30 carbon atoms or a branched or cyclic divalent hydrocarbon group having 3 to 30 carbon atoms which may be substituted with a heteroatom, or interposed by a heteroatom; and $R^{01}$ and $R^{02}$ may be mutually bonded to form a ring together with the sulfur atom in the formula.

Such a photo acid generator can give a pattern excellent in resolution and LER and having a rectangular profile in the photolithography using a high energy beam such as ArF excimer laser light, EUV, and electron beam as a light source.

In this case, the photo acid generator represented by the general formula (1a) is preferably represented by the following general formula (1b),

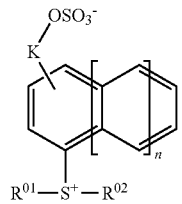

(1b)

wherein $R^{01}$ and $R^{02}$ have the same meanings as defined above; K represents a single bond or a linear divalent hydrocarbon group having 1 to 20 carbon atoms or a branched or cyclic divalent hydrocarbon group having 3 to 20 carbon atoms which may be substituted with a heteroatom, or interposed by a heteroatom; and "n" is 0 or 1.

By using such a photo acid generator, a chemically amplified resist composition that gives a pattern excellent in resolution and LER and having a rectangular profile can be obtained more reliably, and thus the chemically amplified resist composition is extremely useful for a precise and fine processing.

In addition, the present invention provides a chemically amplified resist composition comprising (A) a base resin, (B) the above-mentioned photo acid generator, and (C) an organic solvent.

Such a chemically amplified resist composition can give a pattern excellent in resolution and LER and having a rectangular profile, thereby being extremely useful for a precise and fine processing.

The component (A) is preferably a polymer compound having a repeating unit represented by the following general formula (2) and a repeating unit represented by the following general formula (3),

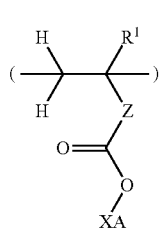

(2)

(3)

wherein $R^1$ represents a hydrogen atom, a fluorine atom, a methyl group or a trifluoromethyl group; Z represents any of a single bond, a phenylene group, a naphthylene group, and a (main chain)—C(=O)—O—Z'—; Z' represents a phenylene group, a naphthylene group, or a linear alkylene group having 1 to 10 carbon atoms or a branched or cyclic alkylene group having 3 to 10 carbon atoms which may have any of a hydroxyl group, an ether bond, an ester bond, and a lactone ring; XA represents an acid-labile group; and YL represents a hydrogen atom, or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride.

The chemically amplified resist composition containing such a base resin can give a pattern further excellent in resolution and LER and having a rectangular profile particularly in the ArF lithography and the EUV lithography, thereby being extremely useful for a precise and fine processing.

Alternatively, the component (A) is preferably a polymer compound having a repeating unit represented by the following general formula (4) and a repeating unit represented by the following general formula (5),

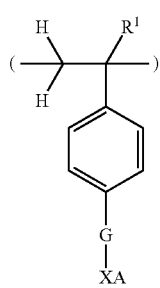

(4)

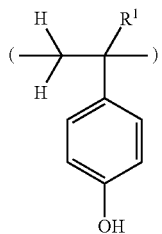 (5)

wherein R¹ represents a hydrogen atom, a fluorine atom, a methyl group or a trifluoromethyl group; XA represents an acid-labile group; and G represents an oxygen atom or a carbonyloxy group, with the proviso that when G is a carbonyloxy group, a carbon atom of the carbonyloxy group is bonded to the benzene ring in the general formula (4).

The chemically amplified resist composition containing such a base resin can give a pattern further excellent in resolution and LER and having a rectangular profile particularly in the KrF lithography, the EUV lithography, and the electron beam lithography, thereby being extremely useful for a precise and fine processing.

Also, the chemically amplified resist composition preferably further contains a photo acid generator besides the component (B).

Also, the chemically amplified resist composition preferably further contains a quencher.

When such a chemically amplified resist composition is employed, not only resist sensitivity can be readily adjusted, but also diffusion rate of acids in the resist film is suppressed to improve resolution, change in sensitivity after exposure is suppressed, environmental dependency on a substrate can be lowered, and exposure margin and a pattern profile, etc., can be improved. Moreover, substrate adhesiveness can be also improved.

Also, the chemically amplified resist composition preferably further contains a surfactant insoluble in water and soluble in alkaline developer.

Such a chemically amplified resist composition can reduce penetration and leaching of water by orientating at the resist surface after spin coating when a resist top coat is not used in the ArF immersion exposure. Thus, damage to the exposure apparatus can be lowered by suppressing elution of the water-soluble component from the resist film. Further, after the exposure, it becomes soluble during alkaline development after post baking whereby it hardly becomes foreign matters that causes defects.

In addition, the present invention provides a patterning process comprising the steps of: applying the above-mentioned chemically amplified resist composition onto a substrate; performing exposure by a high energy beam after heat treatment; and performing development by using a developer.

When such a patterning process is used, a pattern excellent in resolution and LER and having a rectangular profile can be formed since acid diffusion and the profile is highly controlled.

At this time, in the exposure step, a liquid having a refractive index of 1.0 or more may be placed between a resist coat film and a projection lens to perform immersion exposure.

Thus, in the present invention, the exposure step can be performed by using an immersion method in which immersion is conducted by placing a liquid having a refractive index of 1.0 or more between a resist coat film and a projection lens.

At this time, it is preferred that a top coat be applied on the resist coat film, and the liquid having a refractive index of 1.0 or more be placed between the top coat and the projection lens to perform the immersion exposure.

In this way, a more precise pattern can be formed since the surface of the resist coat film can be protected during the immersion exposure.

Also, the high energy beam for exposure is preferably a KrF excimer laser, an ArF excimer laser, an electron beam, or a soft X-ray having a wavelength range of 3 to 15 nm.

Such a light source is suitably used for the patterning process of the present invention.

In addition, the present invention provides a patterning process comprising the steps of: applying the above-mentioned chemically amplified resist composition onto a substrate having a layer containing chromium at an outermost layer; imagewise writing with an electron beam after heat treatment; and performing development by using a developer.

Such a patterning process enables a pattern excellent in LER to be formed even when a substrate to be processed whose outermost surface is composed of a material that readily affects a resist pattern shape, such as a material containing chromium, is used.

In addition, the present invention provides a patterning process comprising the steps of: applying the above-mentioned chemically amplified resist composition onto a photomask blank formed with a chromium compound film; imagewise writing with an electron beam after heat treatment; and performing development by using a developer.

Such a patterning process enables a pattern excellent in LER to be formed even when a photomask blank is used.

The chemically amplified resist composition containing the photo acid generator of the present invention can highly control acid diffusion and a profile. Therefore, when a pattern is formed by using the chemically amplified resist composition containing the photo acid generator of the present invention, the obtained pattern is excellent in LER, CDU, and resolution, and has a rectangular profile. Also, the chemically amplified resist composition containing the photo acid generator of the present invention can be suitably used for a patterning process by the immersion lithography or the electron beam lithography with a substrate containing chromium.

DETAILED DESCRIPTION OF THE PREFERRED EMBODIMENTS

Figure 1:
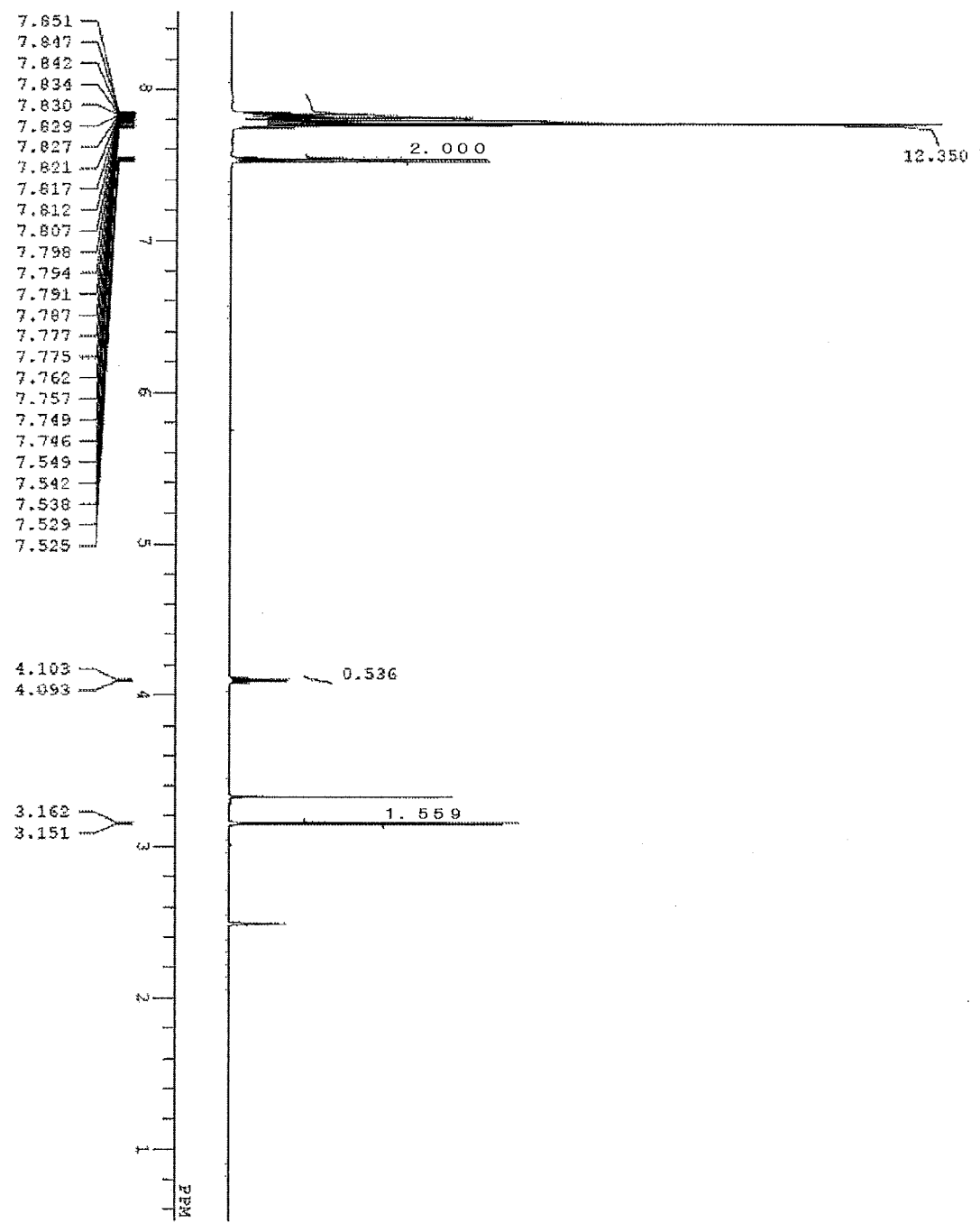
FIG. 1 shows ¹H-NMR/DMSO-d₆ of PAG-1 in Synthesis Example 1-1-2.

Hereinafter, the present invention will be described in detail, but the present invention is not limited to these.

As mentioned above, a photo acid generator that can give a pattern excellent in resolution and LER and having a rectangular profile in the photolithography using a high energy beam such as ArF excimer laser light, EUV, and electron beam as a light source is desired.

The present inventors have earnestly studied to achieve the objects and consequently found that a resist composition using the photo acid generator having a specific structure can give a pattern excellent in resolution and LER and having a rectangular profile, and thus the resist composition is extremely useful for a precise and fine processing, thereby bringing the present invention to completion.

That is, the present invention is a photo acid generator represented by the general formula (1a),

(1a)

wherein $R^{01}$ and $R^{02}$ each independently represent a linear monovalent hydrocarbon group having 1 to 20 carbon atoms or a branched or cyclic monovalent hydrocarbon group having 3 to 20 carbon atoms which may be substituted with a heteroatom, or interposed by a heteroatom; $R^{03}$ represents a linear divalent hydrocarbon group having 1 to 30 carbon atoms or a branched or cyclic divalent hydrocarbon group having 3 to 30 carbon atoms which may be substituted with a heteroatom, or interposed by a heteroatom; and $R^{01}$ and $R^{02}$ may be mutually bonded to form a ring together with the sulfur atom in the formula.

In the general formula (1a), illustrative examples of $R^{01}$ and $R^{02}$ include alkyl groups such as a methyl group, an ethyl group, a n-propyl group, an isopropyl group, a n-butyl group, a tert-butyl group, a cyclopropyl group, a cyclopentyl group, a cyclohexyl group, a cyclopropylmethyl group, a 4-methylcyclohexyl group, a cyclohexylmethyl group, a norbornyl group, and an adamantyl group; alkenyl groups such as a vinyl group, an allyl group, a propenyl group, a butenyl group, a hexenyl group, and a cyclohexenyl group; aryl groups such as a phenyl group, a naphthyl group, and a thienyl group; and aralkyl groups such as a benzyl group, a 1-phenylethyl group, and a 2-phenylethyl group; and aryl groups are preferable. A part of hydrogen atoms of these groups may be substituted with a heteroatom such as an oxygen atom, a sulfur atom, a nitrogen atom, and a halogen atom; or a heteroatom such as an oxygen atom, a sulfur atom, and a nitrogen atom may be placed in these groups. As a result, these groups may form or may be interposed by a hydroxyl group, a cyano group, a carbonyl group, an ether bond, an ester bond, a sulfonate ester bond, a carbonate bond, a lactone ring, a sultone ring, a carboxylic anhydride, a haloalkyl group, etc. Also, $R^{01}$ and $R^{02}$ may be mutually bonded to form a ring together with the sulfur atom in the formula. In this case, the groups represented by the following formulae may be mentioned.

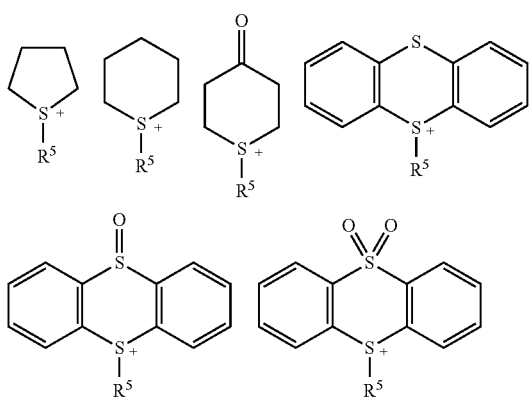

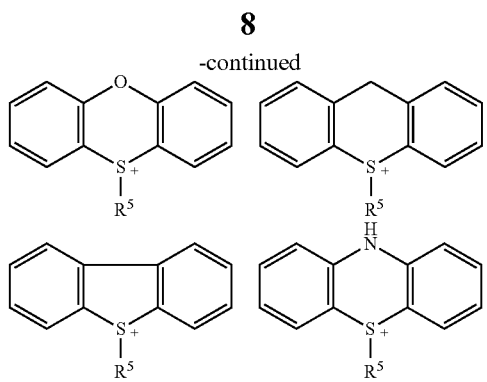

In the above formula, $R^5$ is $-R^{03}-OSO_3^-$, and $R^{03}$ has the same meaning as defined above.

In the general formula (1a), illustrative examples of $R^{03}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and an unsaturated cyclic hydrocarbon group such as a phenylene group and a naphthylene group. A part of hydrogen atoms of these groups may be substituted with an alkyl group such as a methyl group, an ethyl group, a propyl group, a n-butyl group, and a tert-butyl group; or may be substituted with a heteroatom such as an oxygen atom, a sulfur atom, a nitrogen atom, and a halogen atom. As a result, a hydroxyl group, a cyano group, a carbonyl group, an ether bond, an ester bond, a sulfonate ester bond, a carbonate bond, a lactone ring, a sultone ring, a carboxylic anhydride, a haloalkyl group, etc., may be formed.

The photo acid generator represented by the general formula (1a) preferably has a structure represented by the general formula (1b),

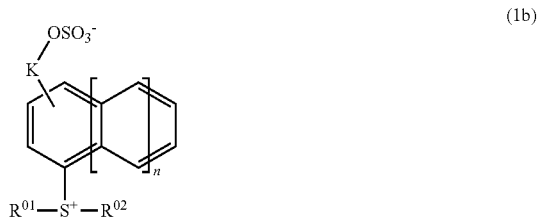

(1b)

wherein $R^{01}$ and $R^{02}$ have the same meanings as defined above; K represents a single bond or a linear divalent hydrocarbon group having 1 to 20 carbon atoms or a branched or cyclic divalent hydrocarbon group having 3 to 20 carbon atoms which may be substituted with a heteroatom, or interposed by a heteroatom; and "n" is 0 or 1.

In the general formula (1b), illustrative examples of K include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and an unsaturated cyclic hydrocarbon group such as a phenylene group and a naphthylene group. A part of hydrogen atoms of these groups may be substituted with an alkyl group such as a methyl group, an ethyl group, a propyl group, a n-butyl group, and a tert-butyl group, or may be substituted with a heteroatom such as an oxygen atom, a sulfur atom, a nitrogen atom, and a halogen atom. As a result, a hydroxyl group, a cyano group, a carbonyl group, an ether bond, an ester bond, a sulfonate ester bond, a carbonate bond, a lactone ring, a sultone ring, a carboxylic anhydride, a haloalkyl group, etc., may be formed.

The preferable structure of the photo acid generator represented by the general formula (1a) or (1b) may be specifically exemplified by the following. However, the present invention is not limited to these.

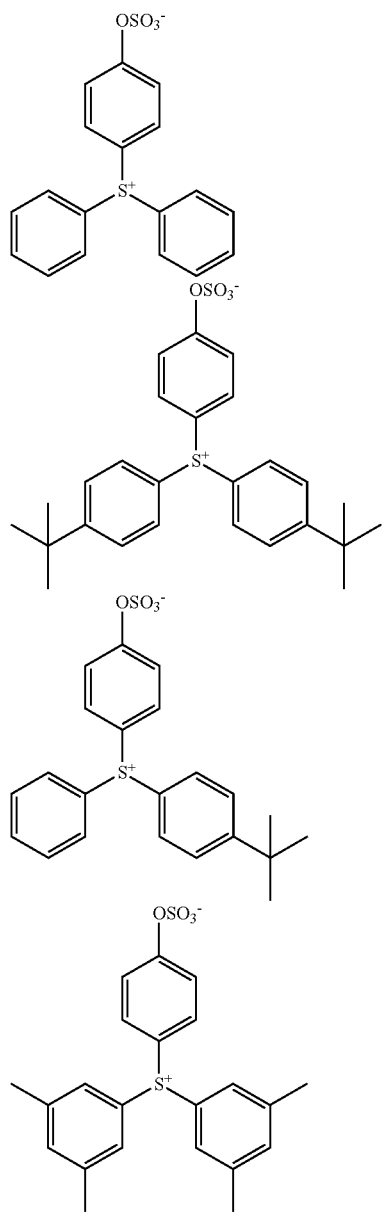

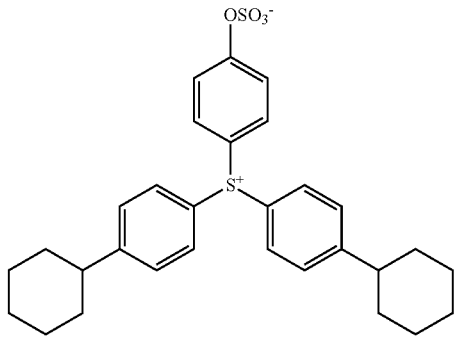

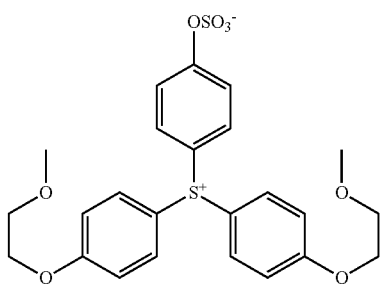

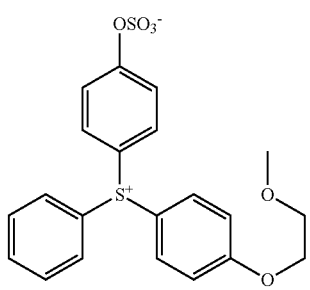

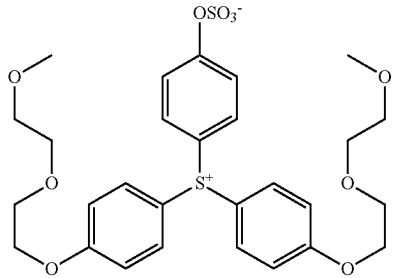

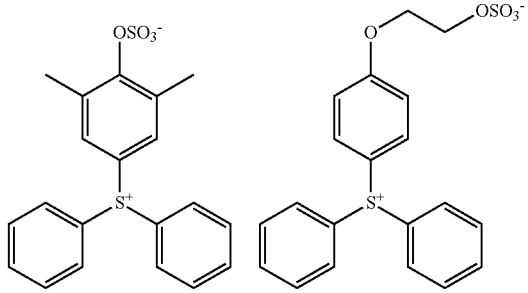

-continued

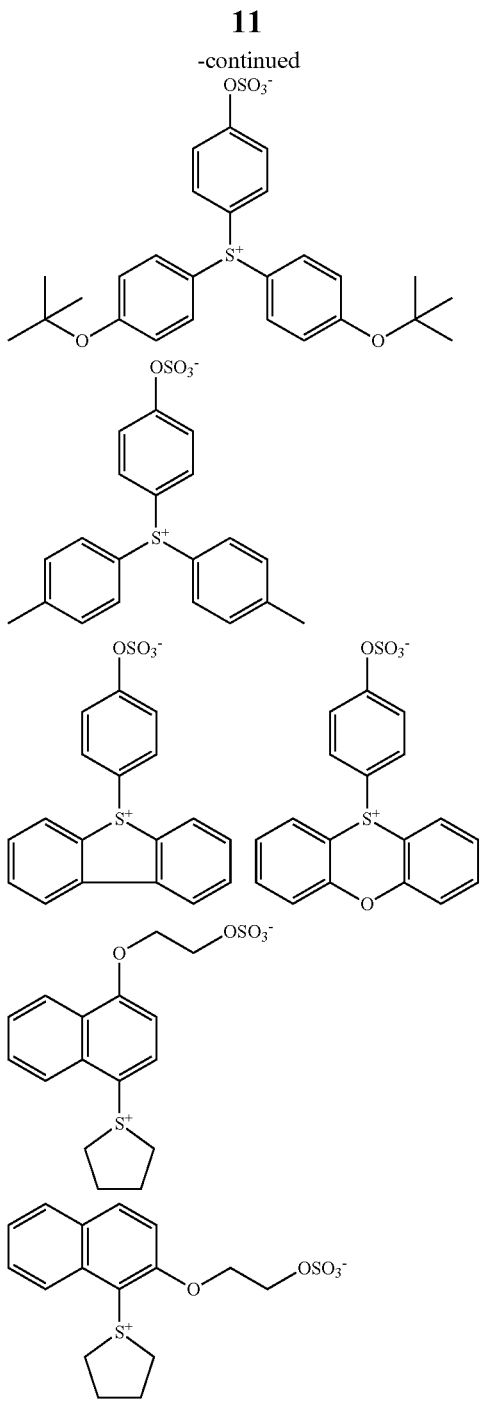

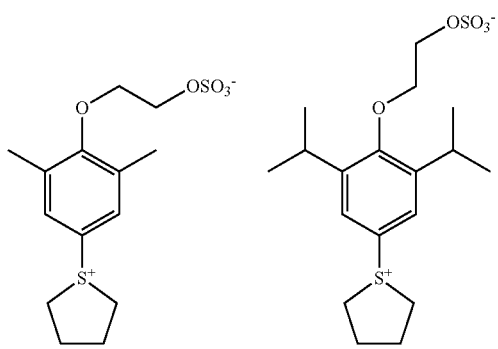

-continued

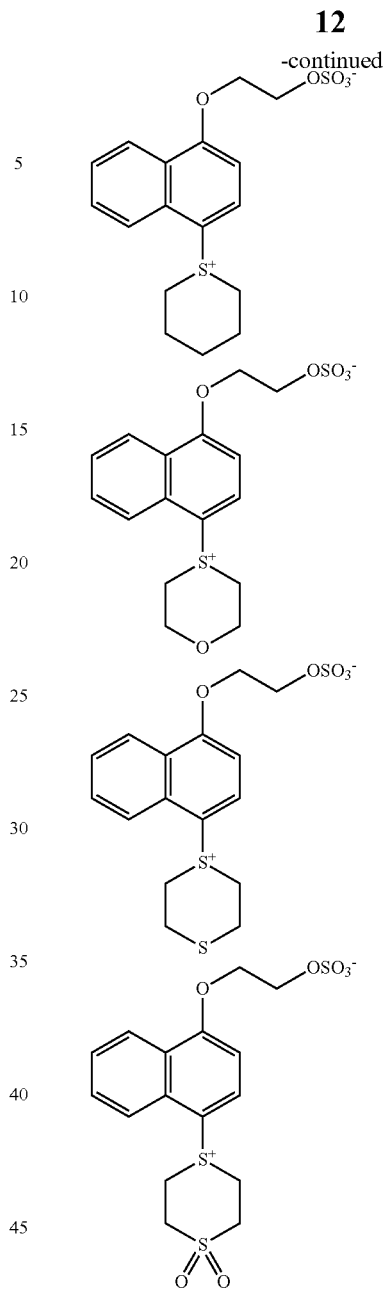

The photo acid generator of the present invention has two important features: (1) it has betaine structure, and (2) it is a sulfonium salt of alkyl sulfuric acid or aryl sulfuric acid. The feature (1) gives high polarity to the photo acid generator of the present invention, and therefore, acid diffusion can be significantly controlled even without relatively bulky structure. For example, Japanese Patent Laid-Open Publication No. 2012-150449 discloses a resist composition using a sulfonium salt of alkyl sulfuric acid, and gives examples in which a bulky structure such as an adamantyl group is used as the alkyl group. However, this composition is insufficient to control acid diffusion since it does not have structure with high polarity derived from betaine structure like the present invention.

Also, an acid generated from the sulfonium salt of alkyl sulfuric acid or aryl sulfuric acid is not as highly sensitive as an acid generated from an onium salt generating α,α-fluorosulfonic acid in the lithography. In other words, acid diffusion is small. This is attributable to the acidity of the generated acid, and this characteristics causes the behavior that the acid diffusion is apparently controlled.

On the other hand, an onium salt generating alkane sulfonic acid or aryl sulfonic acid has lower sensitivity than an onium salt generating α,α-fluorosulfonic acid. However, acidity of the generated acid thereof is not stronger than alkyl sulfuric acid or aryl sulfuric acid, therefore its sensitivity is insufficient. Thus, the photo acid generator of the present invention is effective especially for the ArF lithography, the EUV lithography, and the electron lithography, which require to highly control acid diffusion. By controlling acid diffusion, a desired pattern can be formed, and resist performance such as LER and CDU can be improved.

When the photo acid generator of the present invention represented by the general formula (1a) or (1b) is blended in a chemically amplified resist composition, the blending amount is preferably in the range of 0.1 to 40 parts by mass, more preferably 1 to 20 parts by mass based on 100 parts by mass of the base resin in the chemically amplified resist composition. If the amount is 0.1 parts by mass or more, the photo acid generator sufficiently functions. If the amount is 40 parts by mass or less, sufficient sensitivity can be obtained, thereby enabling to prevent performance deterioration including the occurrence of foreign matters due to the lack of solubility.

The photo acid generator of the present invention can be synthesized in a known organic chemical manner. For example, it may be prepared by reaction of sulfonium cation having a hydroxyl group with chlorosulfuric acid under basic conditions. Alternative manner is to form an alkylsulfate portion or an arylsulfate portion, and then convert it to sulfonium cation form.

By using such a photo acid generator, a chemically amplified resist composition that gives a pattern excellent in resolution and LER and having a rectangular profile can be obtained, and thus the chemically amplified resist composition is extremely useful for a precise and fine processing.

The present invention provides a chemically amplified resist composition containing, as essential component, (A) a base resin, (B) a photo acid generator represented by the general formula (1a) or preferably represented by the general formula (1b), and (C) an organic solvent; and optionally containing (D) a photo acid generator besides the component (B), (E) a quencher, (F) a surfactant insoluble or difficultly soluble in water and soluble in an alkaline developer and/or a surfactant insoluble or difficultly soluble in water and an alkaline developer (a hydrophobic resin), and (G) an organic acid derivative and/or a fluorine-substituted alcohol, etc.

(A) Base Resin

The base resin to be used in the chemically amplified resist composition of the present invention is preferably a polymer compound having a repeating unit represented by the general formula (2) and a repeating unit represented by the general formula (3), particularly in the ArF lithography and the EUV lithography,

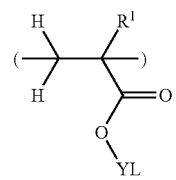

(2)

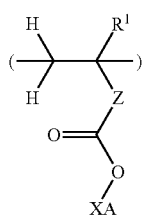

(3)

wherein $R^1$ represents a hydrogen atom, a fluorine atom, a methyl group or a trifluoromethyl group; Z represents any of a single bond, a phenylene group, a naphthylene group, and a (main chain)—C(=O)—O—Z'—; Z' represents a phenylene group, a naphthylene group, or a linear alkylene group having 1 to 10 carbon atoms or a branched or cyclic alkylene group having 3 to 10 carbon atoms which may have any of a hydroxyl group, an ether bond, an ester bond, and a lactone ring; XA represents an acid-labile group; and YL represents a hydrogen atom, or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride.

A structure in which Z in the general formula (2) is changed may be specifically exemplified by the following.

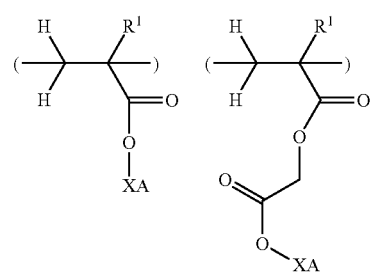

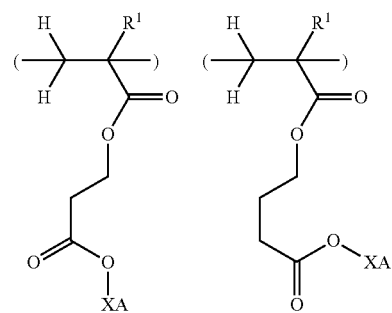

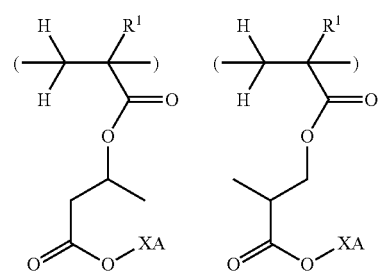

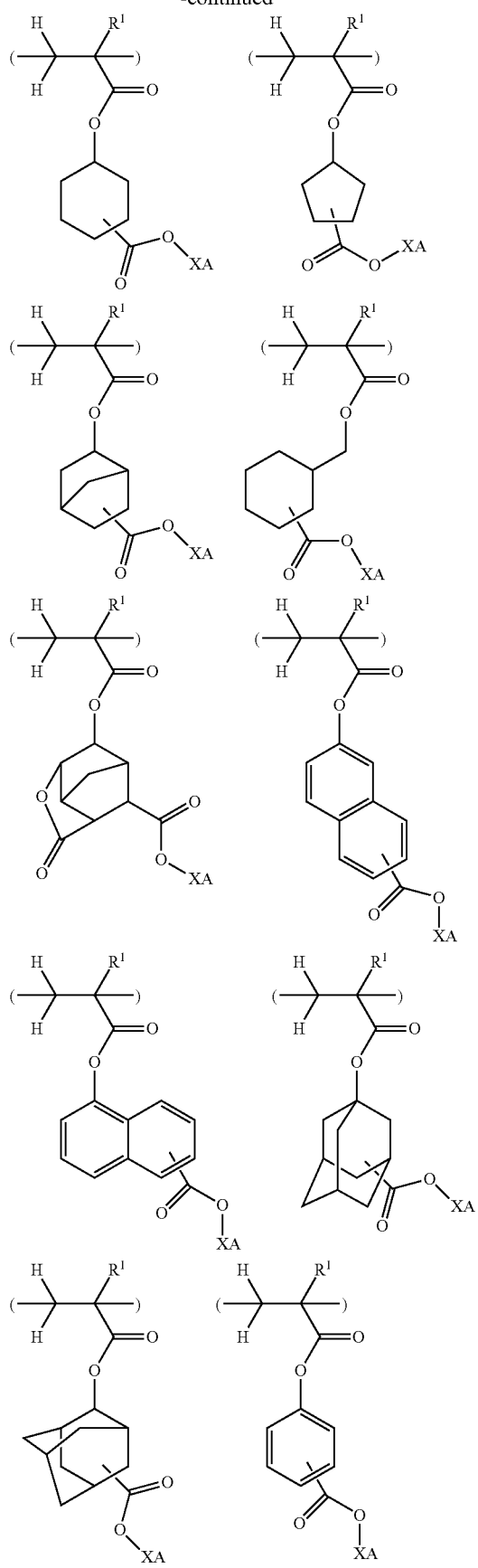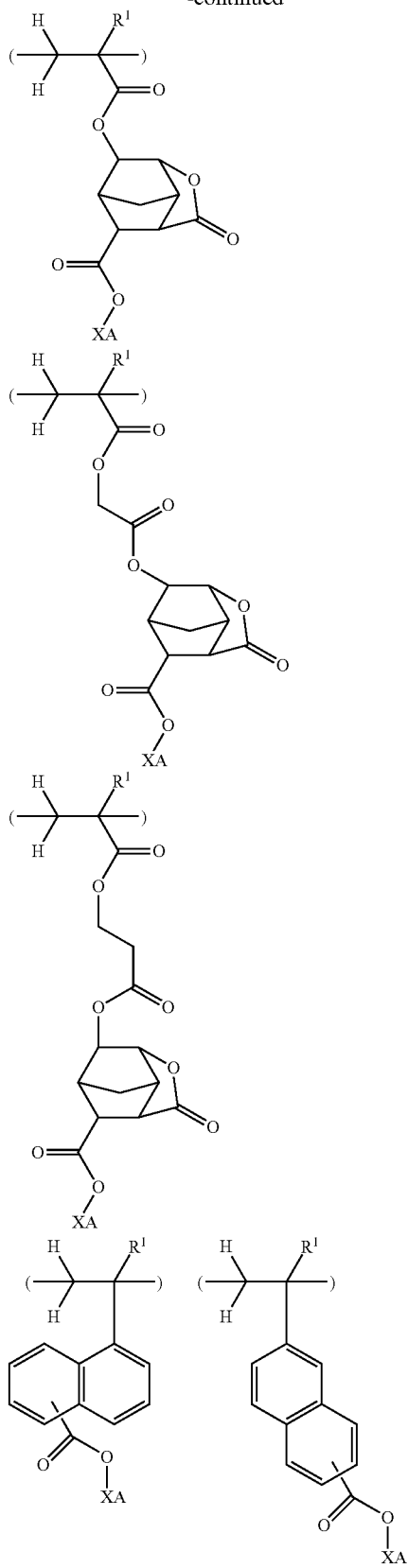
The polymer having the repeating unit represented by the general formula (2) is decomposed by the action of an acid to generate a carboxylic acid, and provides an alkali-soluble polymer. The acid-labile group XA may be used various kinds, and illustrative examples thereof include groups represented by the following general formulae (L1) to (L4), a tertiary alkyl group having 4 to 20 carbon atoms, preferably 4 to 15 carbon atoms, a trialkylsilyl group in which each alkyl group has 1 to 6 carbon atoms, and an oxoalkyl group having 4 to 20 carbon atoms.

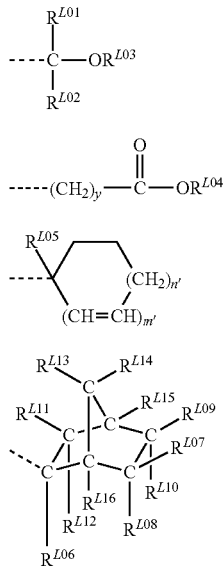

Here, the dotted line represents a bonding arm (hereinafter the same).

In the formula (L1), $R^{L01}$ and $R^{L02}$ represent a hydrogen atom or a linear, branched, or cyclic alkyl group having 1 to 18 carbon atoms, preferably 1 to 10 carbon atoms, and illustrative examples thereof include a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a norbornyl group, a tricyclodecanyl group, a tetracyclododecanyl group, and an adamantyl group. $R^{L03}$ represents a monovalent hydrocarbon group having 1 to 18 carbon atoms, preferably 1 to 10 carbon atoms which may have a heteroatom such as an oxygen atom; and may be exemplified by a linear, branched, or cyclic alkyl group, those in which a part of hydrogen atoms of these groups is substituted with a hydroxyl group, an alkoxy group, an oxo group, an amino group, an alkylamino group, etc., and those in which an oxygen atom is placed between the carbon atoms. Illustrative examples of the linear, branched, or cyclic alkyl group include a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a norbornyl group, a tricyclodecanyl group, a tetracyclododecanyl group, and an adamantyl group. The substituted alkyl groups may be specifically exemplified by the following.

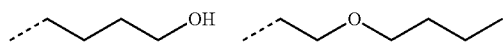

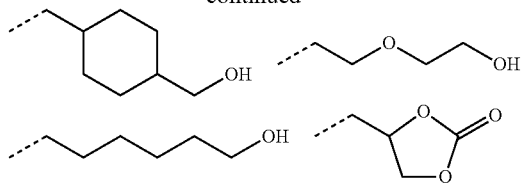

$R^{L01}$ and $R^{L02}$, $R^{L01}$ and $R^{L03}$, and $R^{L02}$ and $R^{L03}$ may be mutually bonded to form a ring with the carbon atom or the oxygen atom to which they are bonded. When the ring is formed, groups that participate in the ring formation among $R^{L01}$, $R^{L02}$, and $R^{L03}$ each represent a linear or branched alkylene group having 1 to 18 carbon atoms, preferably 1 to 10 carbon atoms.

In the formula (L2), $R^{L04}$ represents a tertiary alkyl group having 4 to 20 carbon atoms, preferably 4 to 15 carbon atoms, a trialkylsilyl group each alkyl group of which having 1 to 6 carbon atoms, an oxoalkyl group having 4 to 20 carbon atoms, or the group represented by the formula (L1). Illustrative examples of the tertiary alkyl group include a tert-butyl group, a tert-amyl group, a 1,1-diethylpropyl group, a 2-cyclopentylpropane-2-yl group, a 2-cyclohexylpropane-2-yl group, a 2-(bicyclo[2.2.1]heptan-2-yl)propane-2-yl group, a 2-(adamantane-1-yl)propane-2-yl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, and a 2-ethyl-2-adamantyl group. Illustrative examples of the trialkylsilyl group include a trimethylsilyl group, a triethylsilyl group, and a dimethyl-tert-butylsilyl group. Illustrative examples of the oxoalkyl group include a 3-oxocyclohexyl group, a 4-methyl-2-oxooxan-4-yl group, and a 5-methyl-2-oxooxolan-5-yl group. "y" is an integer of 0 to 6.

In the formula (L3), $R^{L05}$ represents a linear, branched, or cyclic alkyl group having 1 to 8 carbon atoms which may be substituted, or an aryl group having 6 to 20 carbon atoms which may be substituted. Illustrative examples of the alkyl group which may be substituted include linear, branched, or cyclic alkyl groups such as a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group, and those in which a part of hydrogen atoms of these groups is substituted with a hydroxyl group, an alkoxy group, a carboxyl group, an alkoxycarbonyl group, an oxo group, an amino group, an alkylamino group, a cyano group, a mercapto group, an alkylthio group, a sulfo group, etc. Illustrative examples of the aryl group which may be substituted include a phenyl group, a methylphenyl group, a naphthyl group, an anthryl group, a phenanthryl group, and a pyrenyl group. m' is 0 or 1, n' is any one of 0, 1, 2, and 3, and m' and n' are numbers satisfying 2m'+n'=2 or 3.

In the formula (L4), $R^{L06}$ represents a linear, branched, or cyclic alkyl group having 1 to 8 carbon atoms which may be substituted or an aryl group having 6 to 20 carbon atoms which may be substituted, and illustrative examples thereof include the same substances as exemplified for $R^{L05}$. $R^{L07}$ to $R^{L16}$ each independently represent a hydrogen atom or a monovalent hydrocarbon group having 1 to 15 carbon atoms, and illustrative examples thereof include linear, branched, or cyclic alkyl groups such as a methyl group, an ethyl group, a propyl group, an isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a cyclopentylmethyl group, a cyclopentylethyl group, a cyclopentylbutyl group, a cyclohexylmethyl group, a cyclohexylethyl group, and a cyclohexylbutyl group, and those in which a part of hydrogen atoms of these groups is substituted with a hydroxyl group, an alkoxy group, a carboxyl group, an alkoxycarbonyl group, an oxo group, an amino group, an alkylamino group, a cyano group, a mercapto group, an alkylthio group, a sulfo group, etc. Two of $R^{L07}$ to $R^{L16}$ may be mutually bonded to form a ring with the carbon atoms to which these are bonded (e.g. $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, $R^{L13}$ and $R^{L14}$). In this case, groups that participate in the bonding represent a divalent hydrocarbon group having 1 to 15 carbon atoms, and may be specifically exemplified by substances obtained by removing one hydrogen atom from the above-exemplified monovalent hydrocarbon group. Also, two of $R^{L07}$ to $R^{L16}$ that are attached to adjacent carbon atoms may be mutually bonded to form a double bond without any interposition (e.g. $R^{L07}$ and $R^{L09}$, $R^{L09}$ and $R^{L15}$, $R^{L13}$ and $R^{L15}$, $R^{L14}$ and $R^{L15}$).

Among the acid-labile group represented by the formula (L1), a linear or branched one may be specifically exemplified by the following groups.

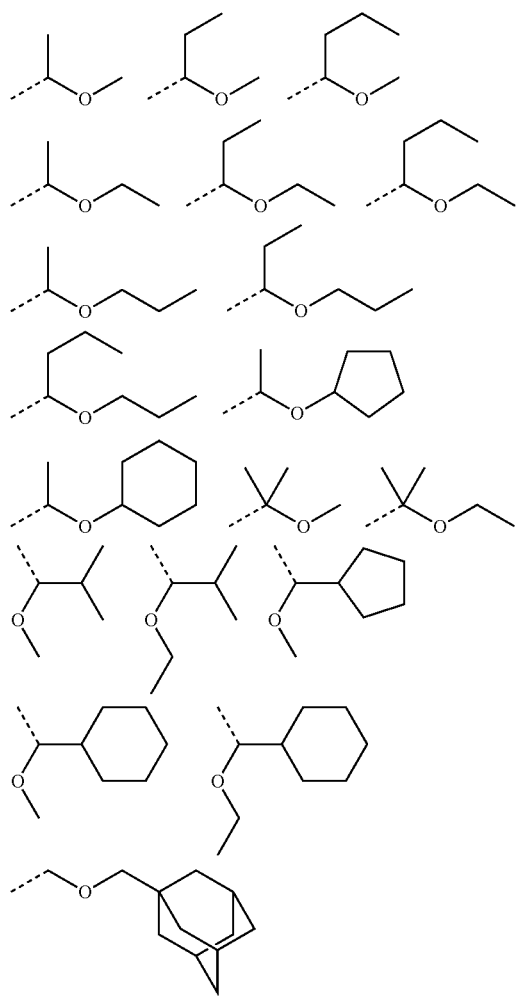

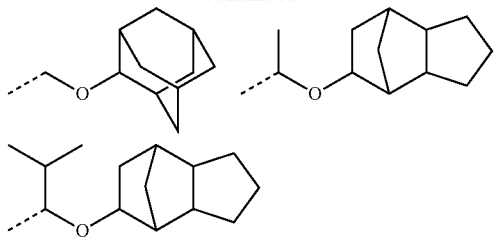

Among the acid-labile group represented by the formula (L1), a cyclic one may be specifically exemplified by a tetrahydrofuran-2-yl group, a 2-methyltetrahydrofuran-2-yl group, a tetrahydropyran-2-yl group, a 2-methyltetrahydropyran-2-yl group, etc.

Illustrative examples of the acid-labile group of the formula (L2) include a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

Illustrative examples of the acid-labile group of the formula (L3) include a 1-methylcyclopentyl group, a 1-ethylcyclopentyl group, a 1-n-propylcyclopentyl group, a 1-isopropylcyclopentyl group, a 1-n-butylcyclopentyl group, a 1-sec-butylcyclopentyl group, a 1-cyclohexylcyclopentyl group, a 1-(4-methoxy-n-butyl)cyclopentyl group, a 1-methylcyclohexyl group, a 1-ethylcyclohexyl group, a 3-methyl-1-cyclopenten-3-yl group, a 3-ethyl-1-cyclopenten-3-yl group, a 3-methyl-1-cyclohexen-3-yl group, and a 3-ethyl-1-cyclohexen-3-yl group.

As the acid-labile group of the formula (L4), groups represented by the following general formulae (L4-1) to (L4-4) is particularly preferable.

(L4-1)

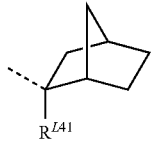

(L4-2)

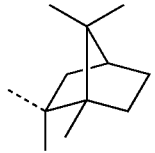

(L4-3)

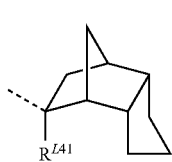

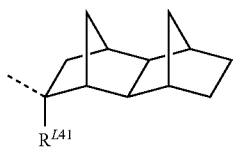
(L4-4)

In the formulae (L4-1) to (L4-4), the dotted line shows a bonding position and a bonding direction. Each $R^{L41}$ independently represents a monovalent hydrocarbon group such as a linear, branched, or cyclic alkyl group having 1 to 10 carbon atoms, and illustrative examples thereof include a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group.

In the formulae (L4-1) to (L4-4), an enantiomer or a diastereomer can exist. The formulae (L4-1) to (L4-4) represent all of these stereoisomers. These stereoisomers may be used alone or as a mixture.

For example, the formula (L4-3) collectively represents one group or a mixture of two groups selected from the groups represented by the formulae (L4-3-1) and (L4-3-2).

(L4-3-1)

(L4-3-2)

Also, the formula (L4-4) collectively represents one group or a mixture of two or more groups selected from the groups represented by the formulae (L4-4-1) to (L4-4-4).

(L4-4-1)

(L4-4-2)

(L4-4-3)

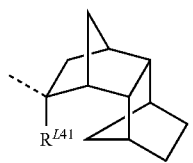
(L4-4-4)

The formulae (L4-1) to (L4-4), (L4-3-1), (L4-3-2), and (L4-4-1) to (L4-4-4) also represent enantiomers thereof and a mixture of the enantiomers.

Meanwhile, a high reactivity in the acid-catalyzed elimination reaction is realized when each bonding direction of the formulae (L4-1) to (L4-4), (L4-3-1), (L4-3-2), and (L4-4-1) to (L4-4-4) is placed at exo-side of the bicyclo[2.2.1]heptane ring (see Japanese Patent Laid-Open Publication No. 2000-336121). In the production of a monomer having a tertiary exo-alkyl group that has a bicyclo[2.2.1]heptane skeleton as a substituent, there is a case that a monomer substituted with the endo-alkyl group represented by the following general formulae (L4-1-endo) to (L4-4-endo) is included. In such a case, to accomplish good reactivity, the exo-ratio is preferably 50 mol % or more, further preferably 80 mol % or more.

(L4-1-endo)

(L4-2-endo)

(L4-3-endo)

(L4-4-endo)

The acid-labile group of the formula (L4) may be specifically exemplified by the following groups.

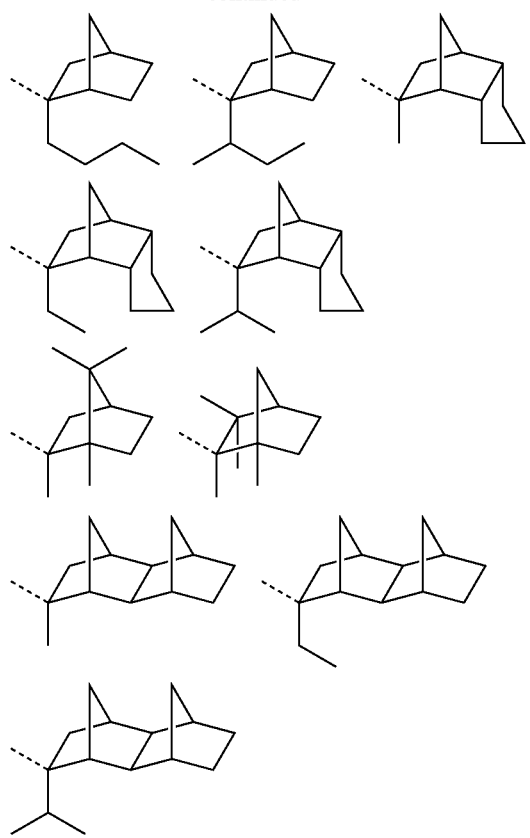

Illustrative examples of the tertiary alkyl group having 4 to 20 carbon atoms, the trialkylsilyl group in which each alkyl group has 1 to 6 carbon atoms, and the oxoalkyl group having 4 to 20 carbon atoms include the same substances as exemplified for $R^{LO4}$, etc.

The repeating unit represented by the general formula (2) may be specifically exemplified by the followings, but is not limited to these.

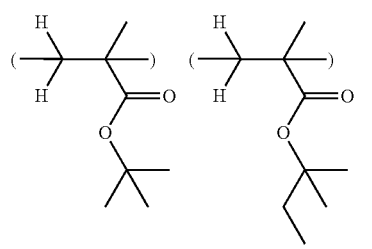

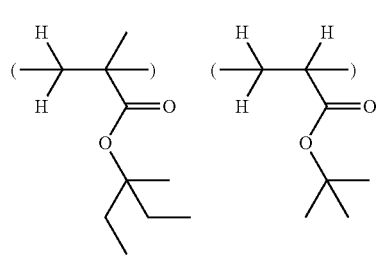

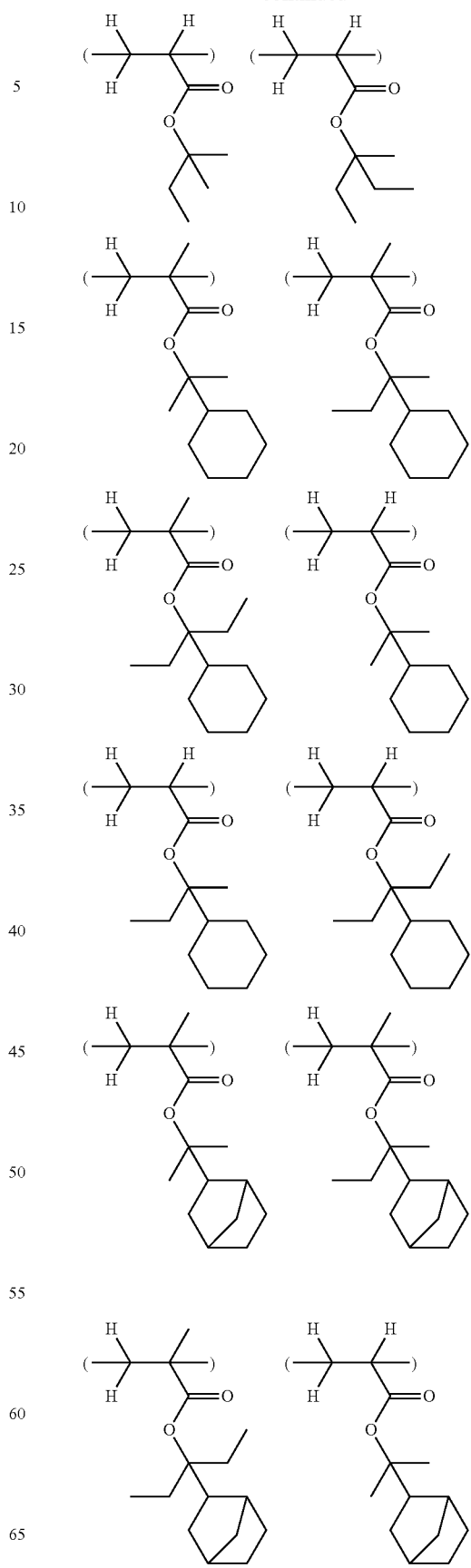

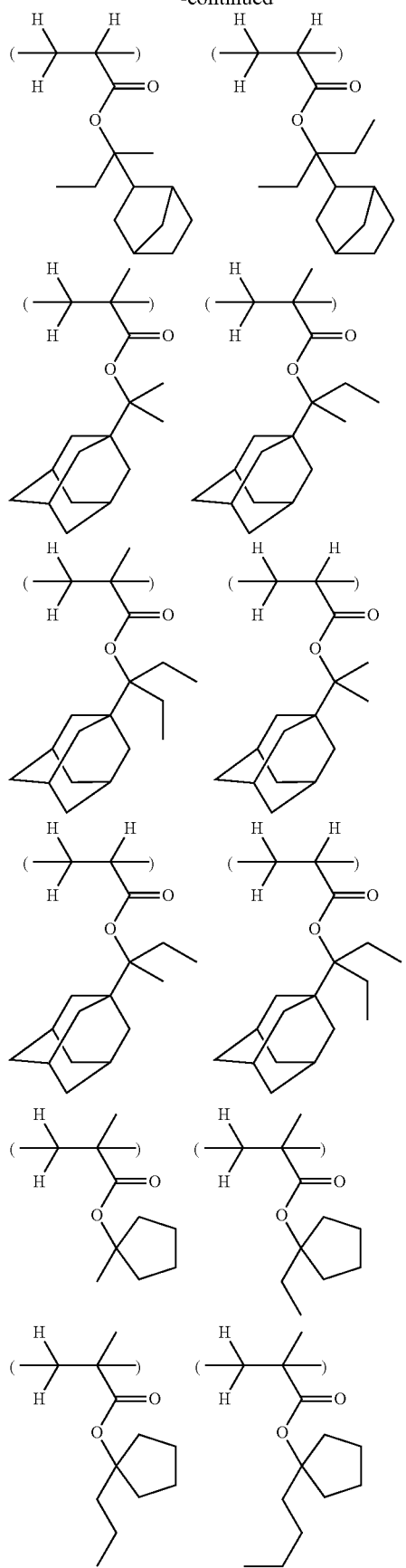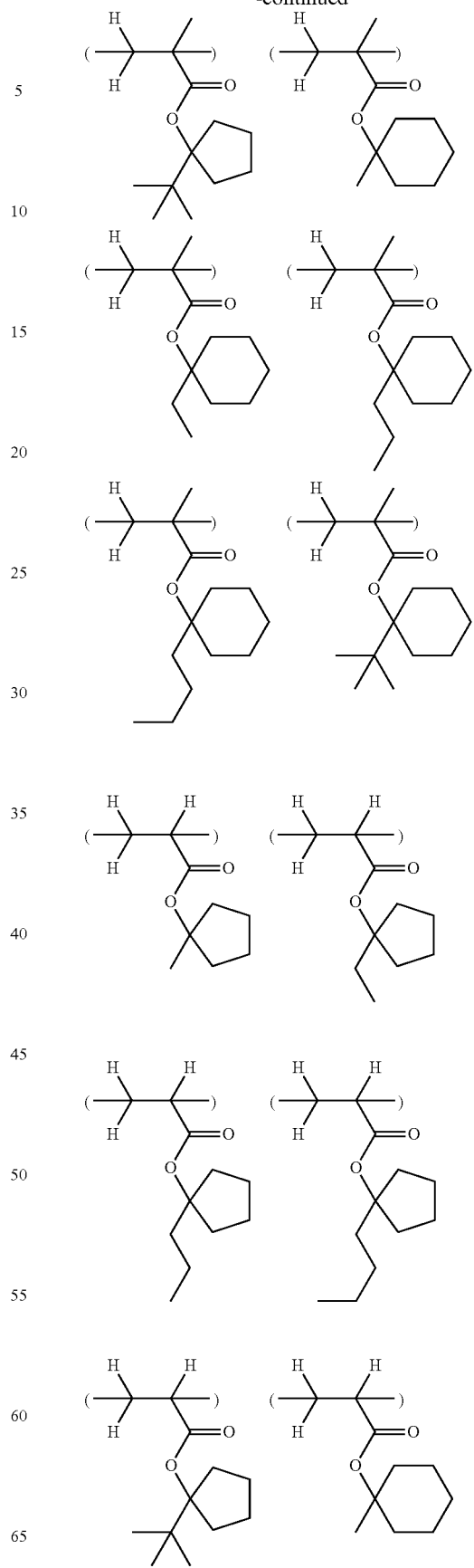

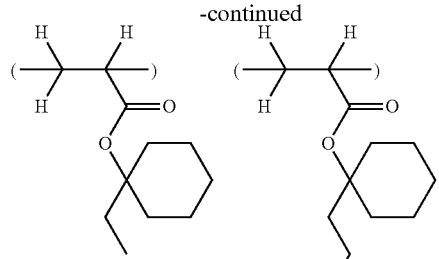
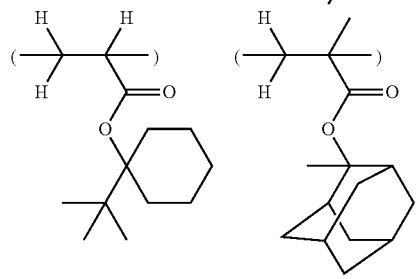
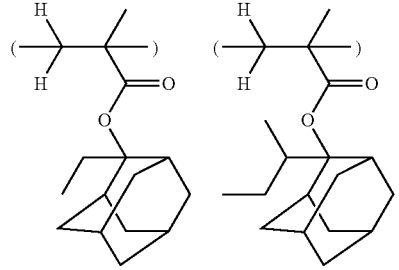
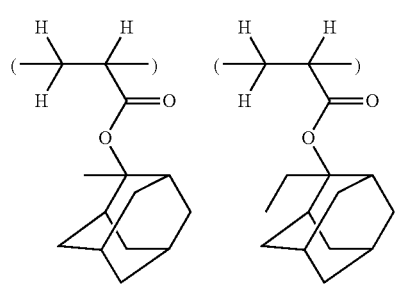
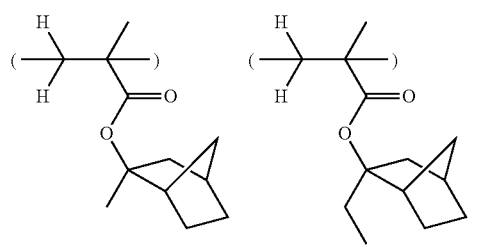
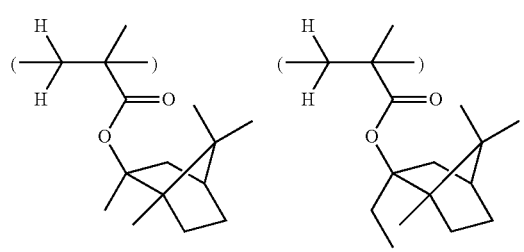
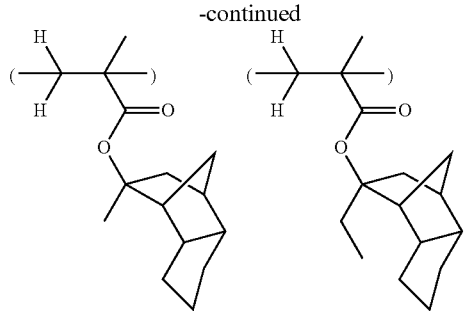
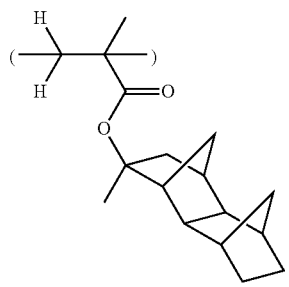
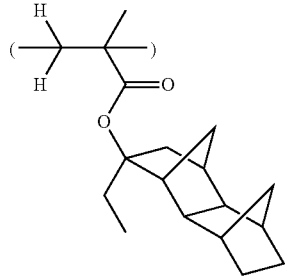
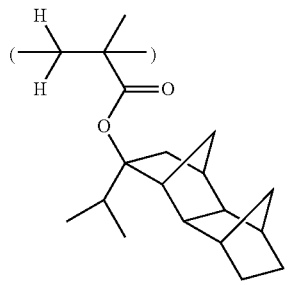
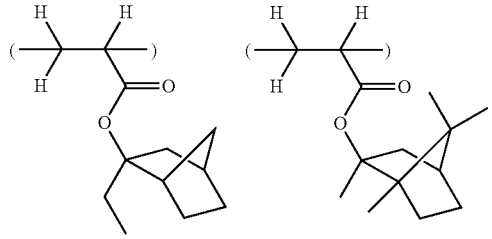
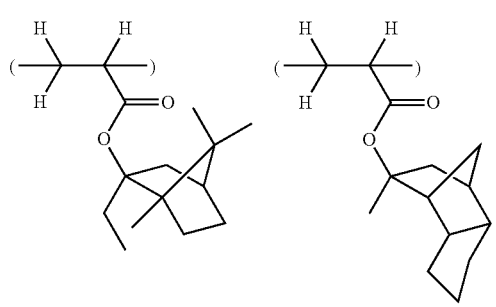

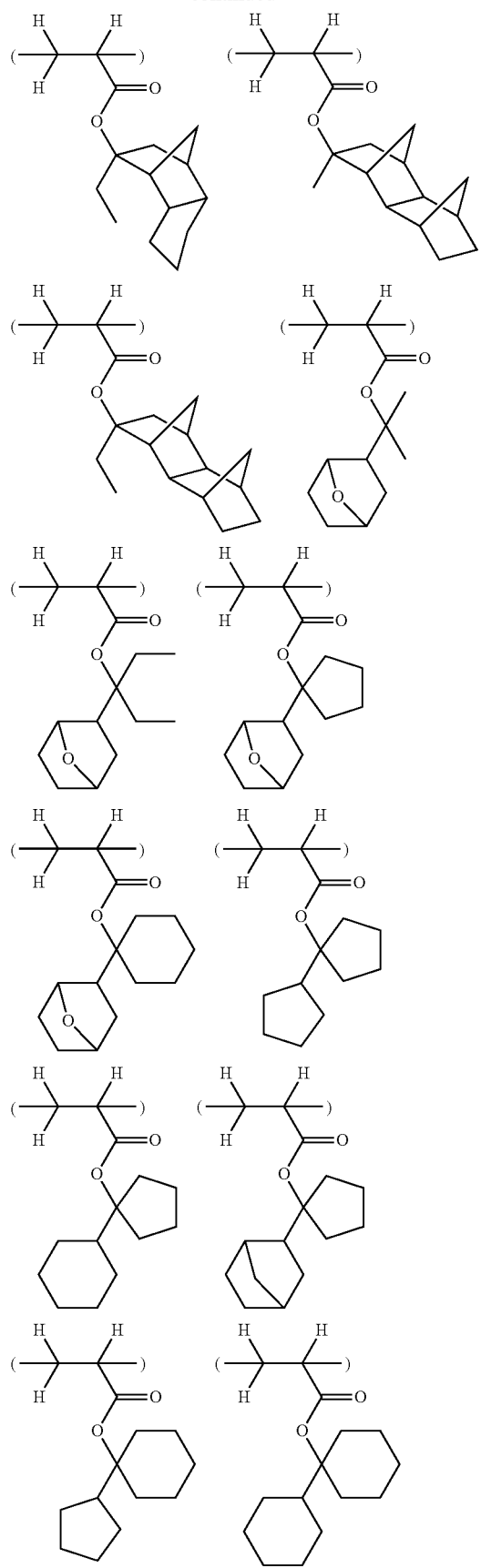
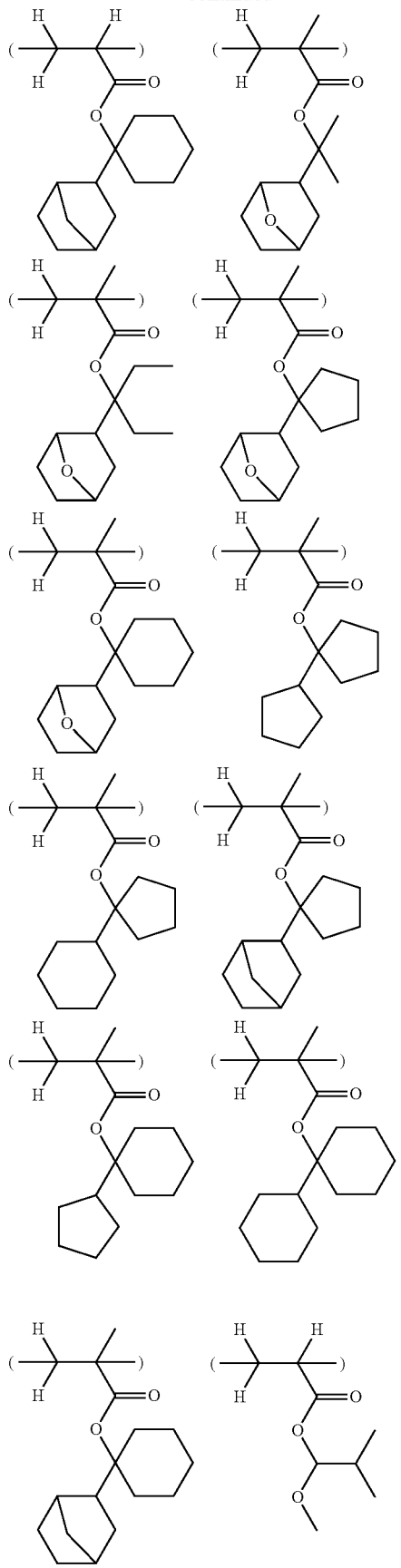

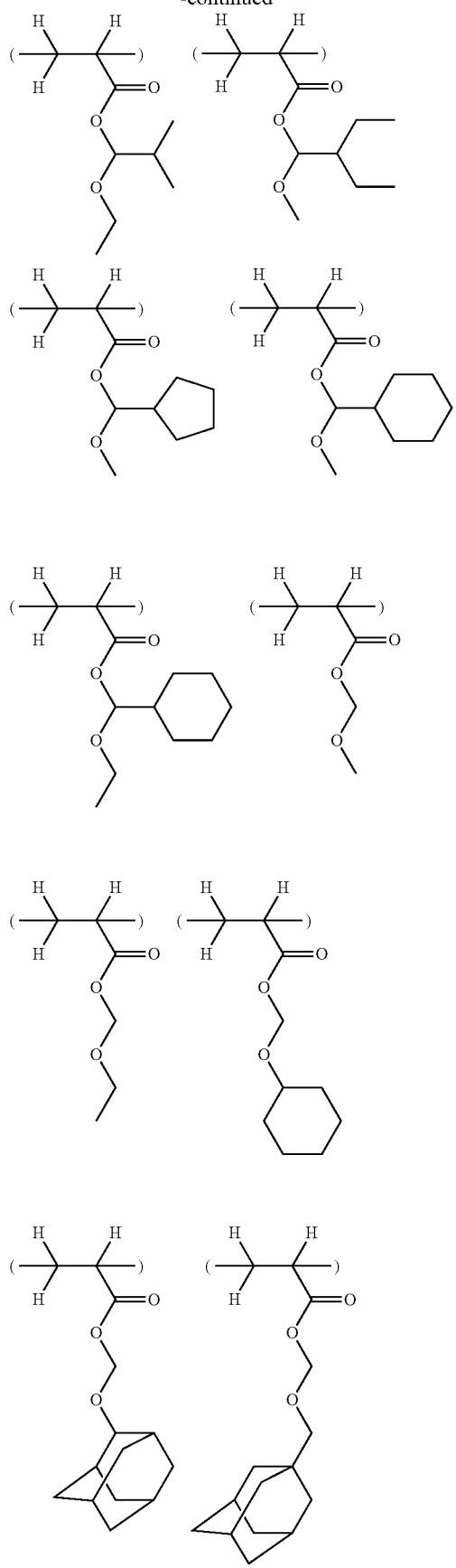
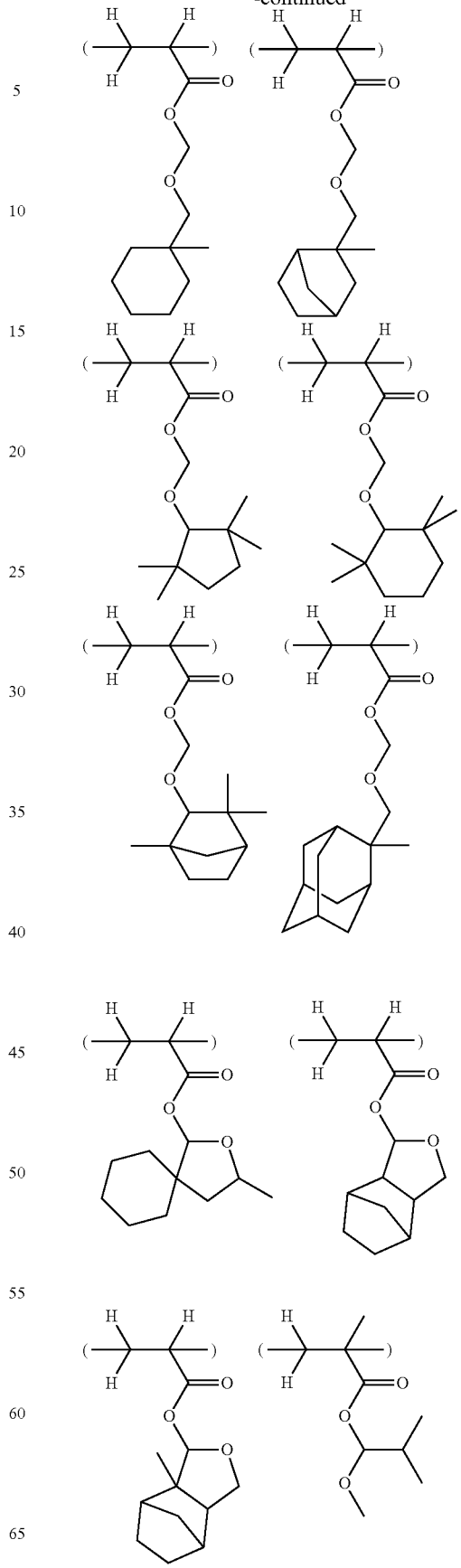

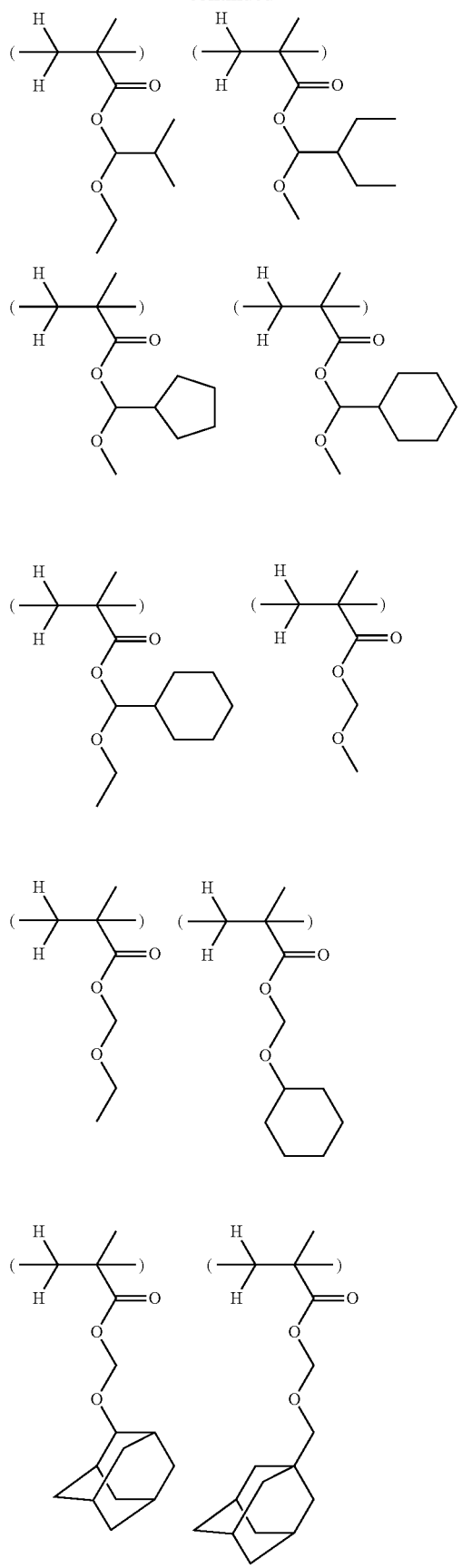
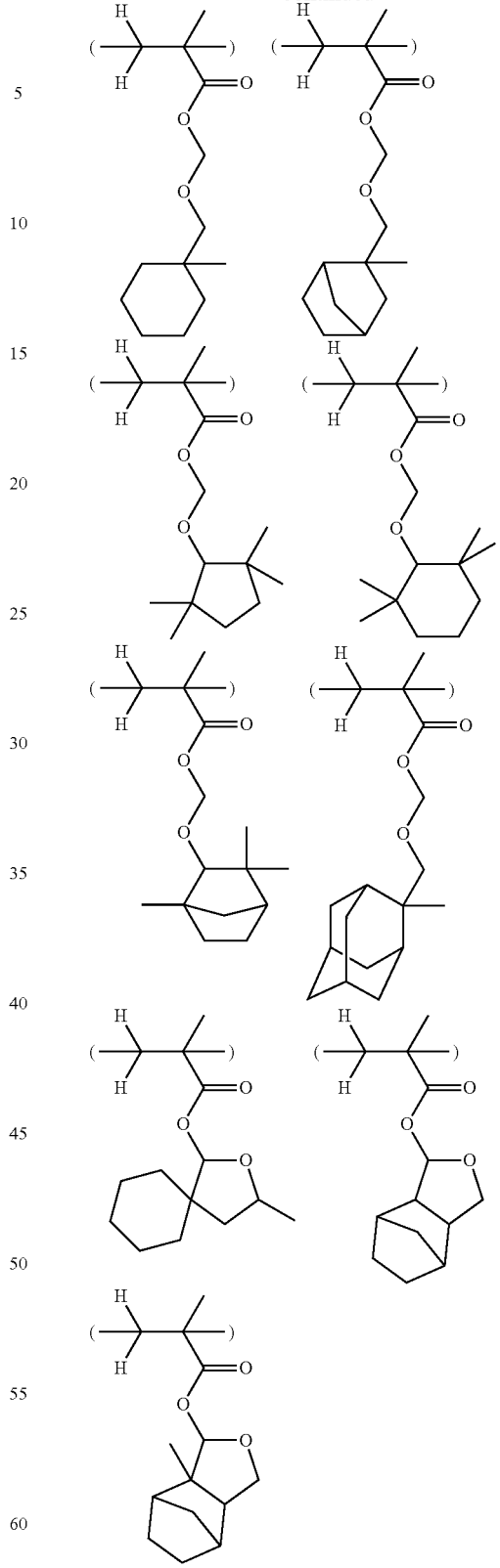
The above-mentioned examples are the case that Z is a single bond. In the case that Z is other than the single bond, it may be combined with the same acid-labile group likewise. Specifically, those in which Z, which is a single bond in the above-mentioned examples, is replaced with a substituent other than the single bond may be mentioned.

In the general formula (3), YL represents a hydrogen atom, or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride. Specifically, it is exemplified by the following, but is not limited to these.

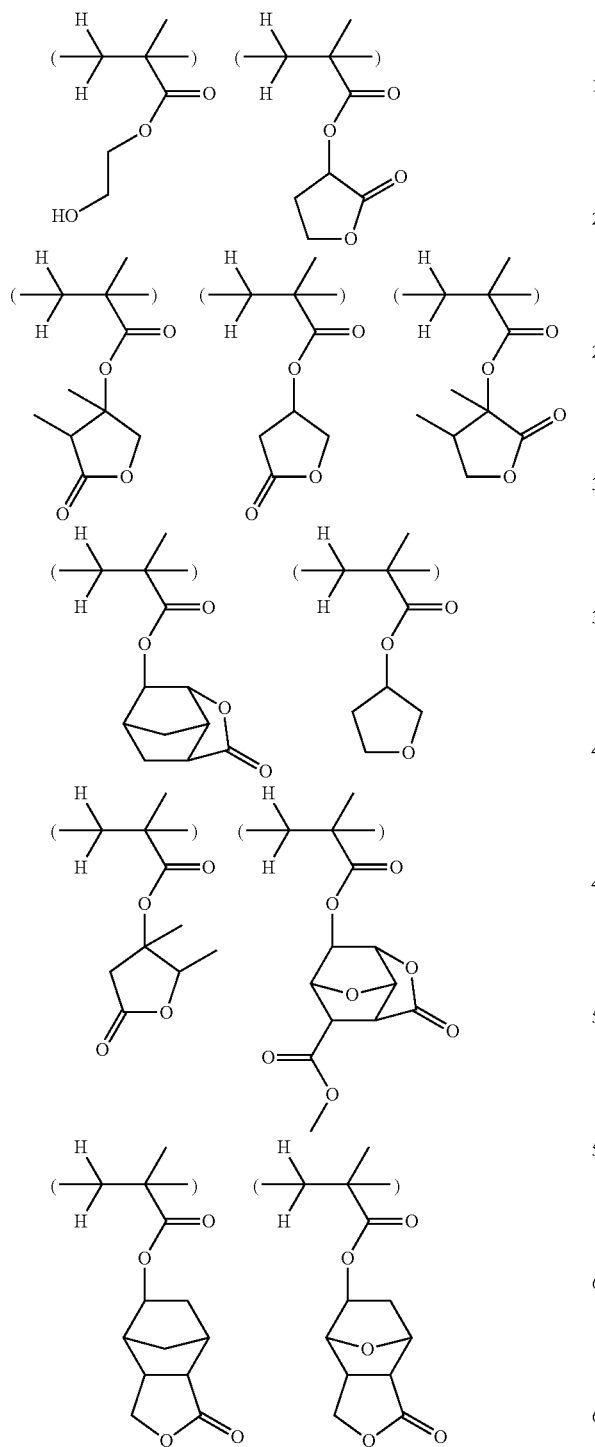

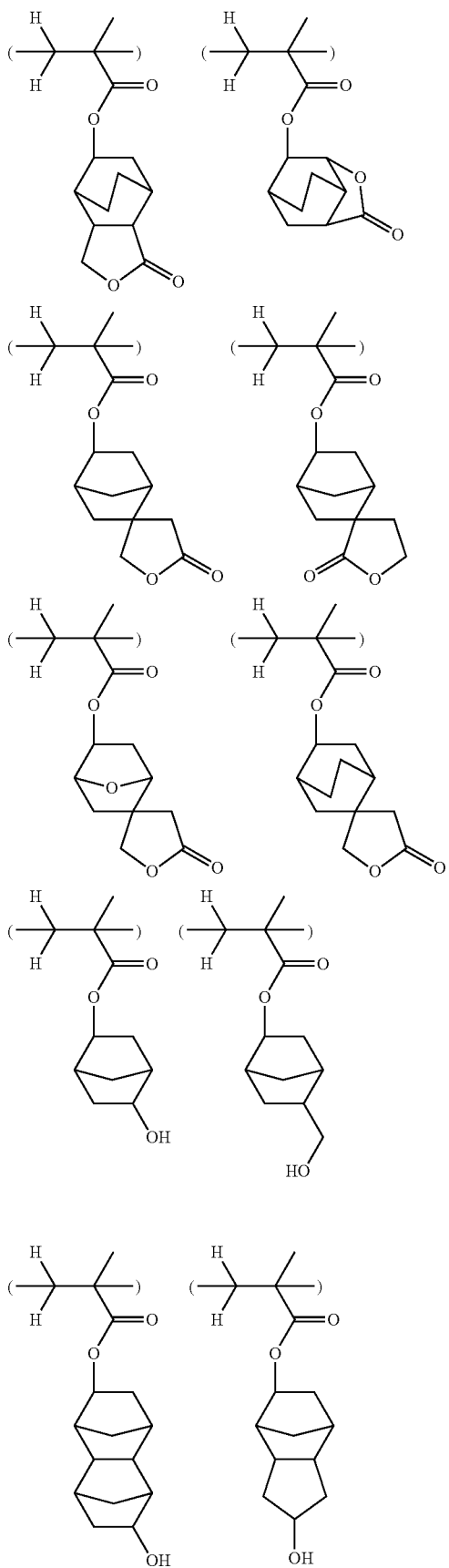

37
-continued
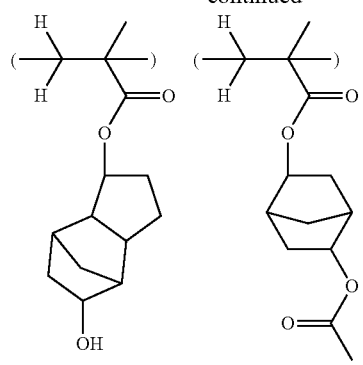
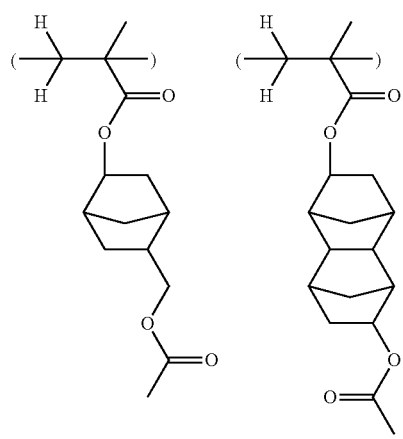
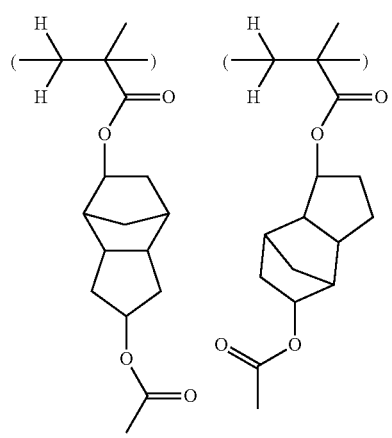
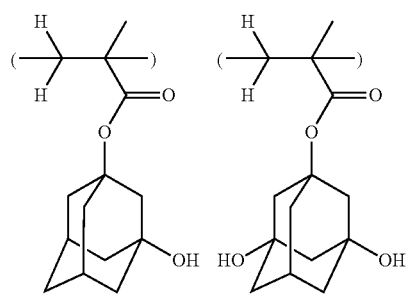
38
-continued
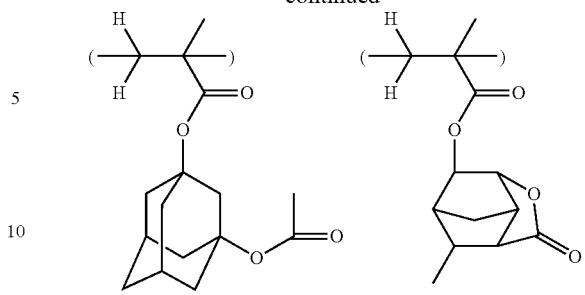
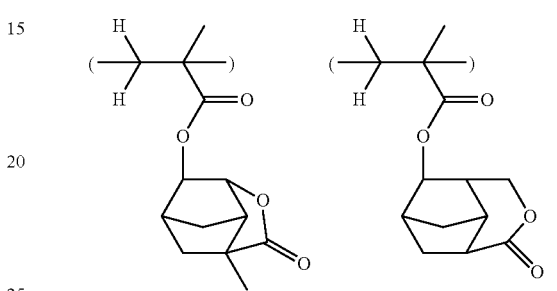
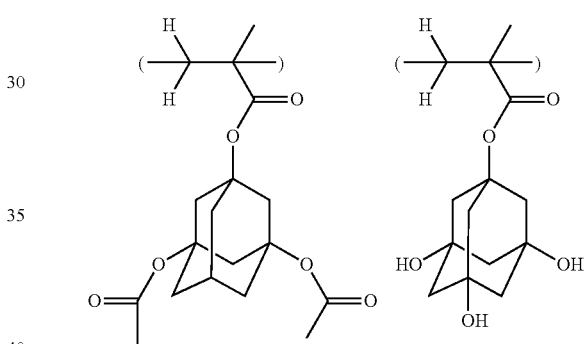
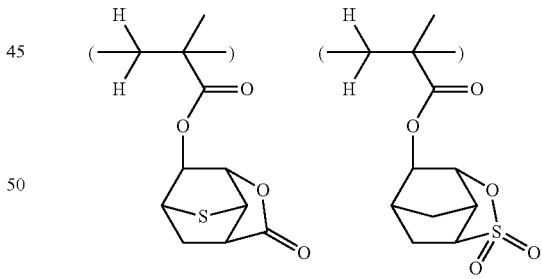
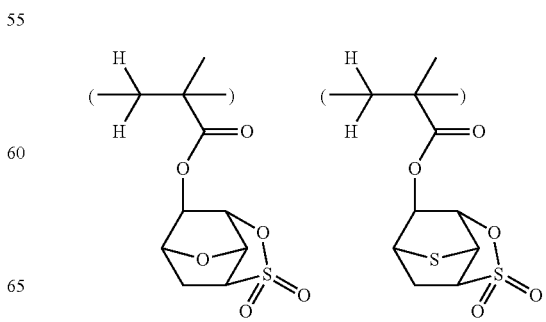

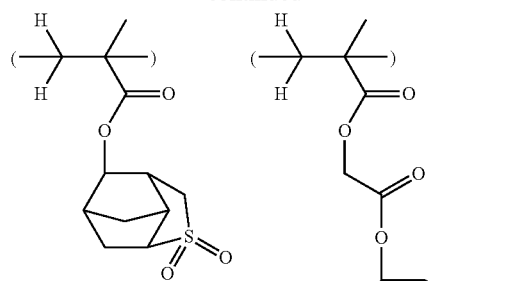
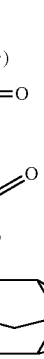
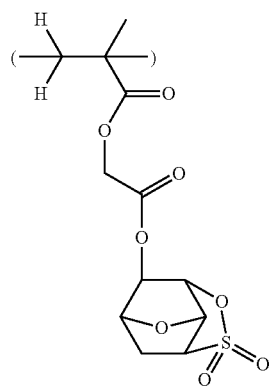
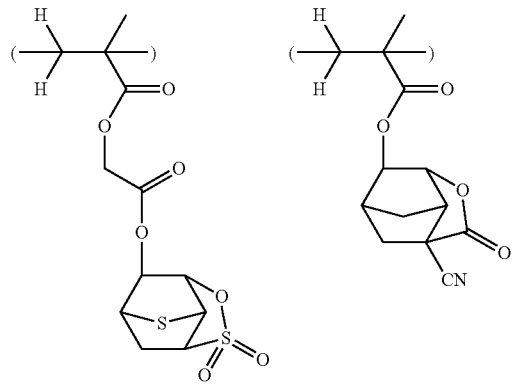
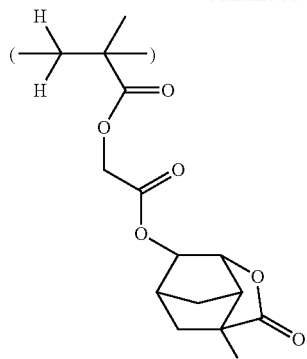
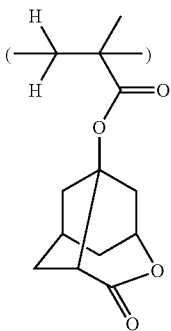
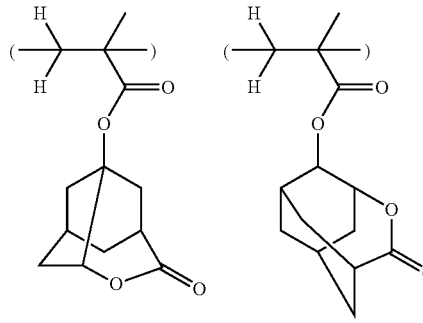
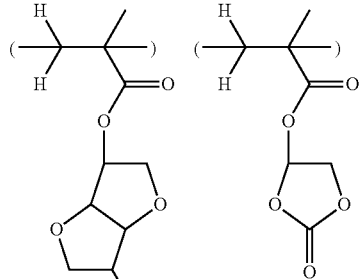
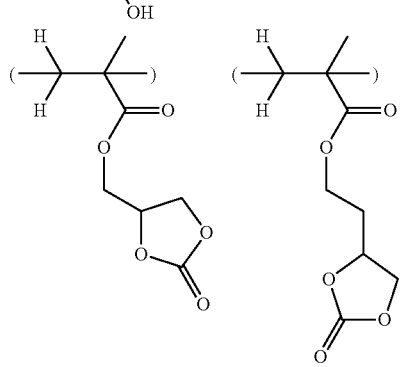
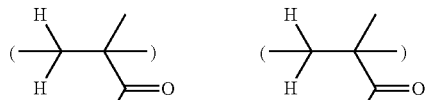
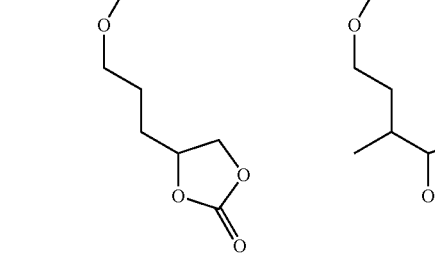

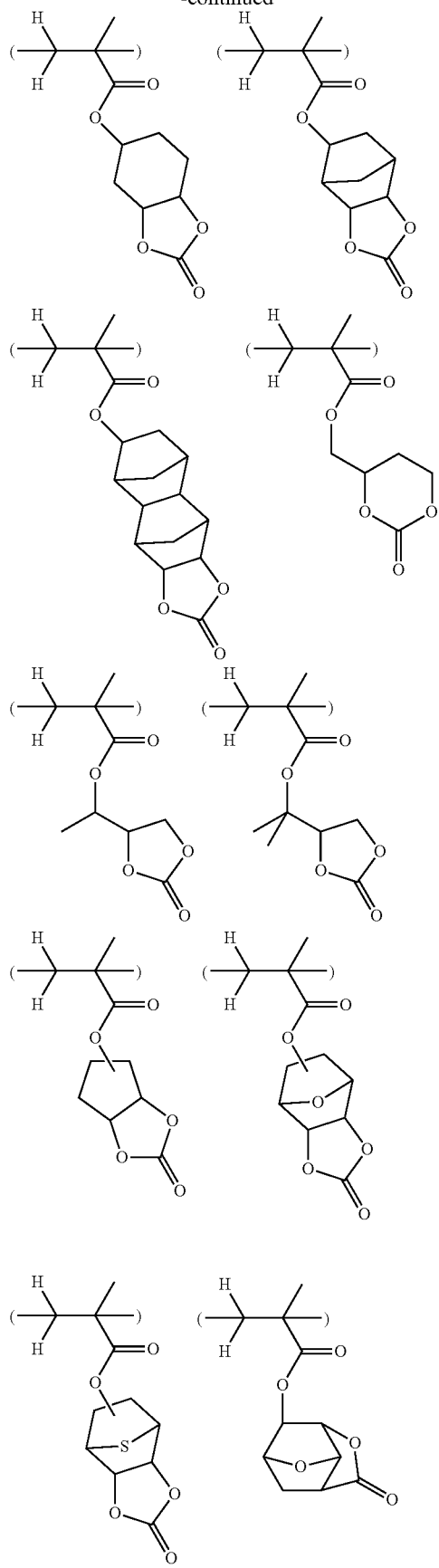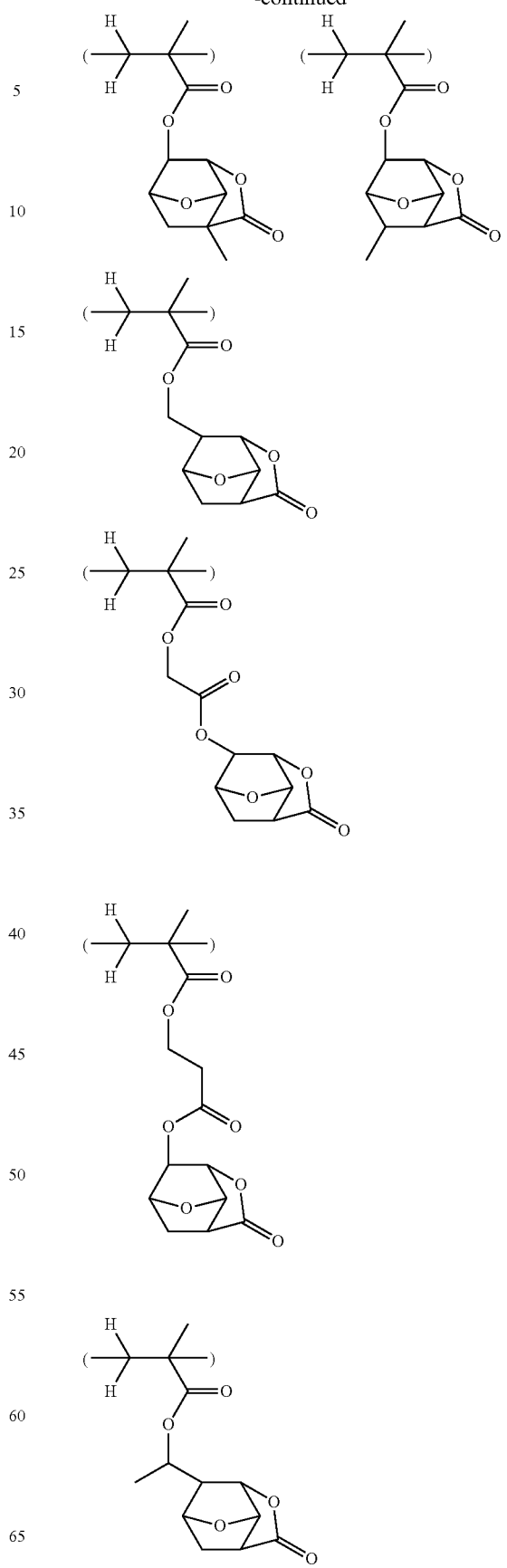

43
-continued
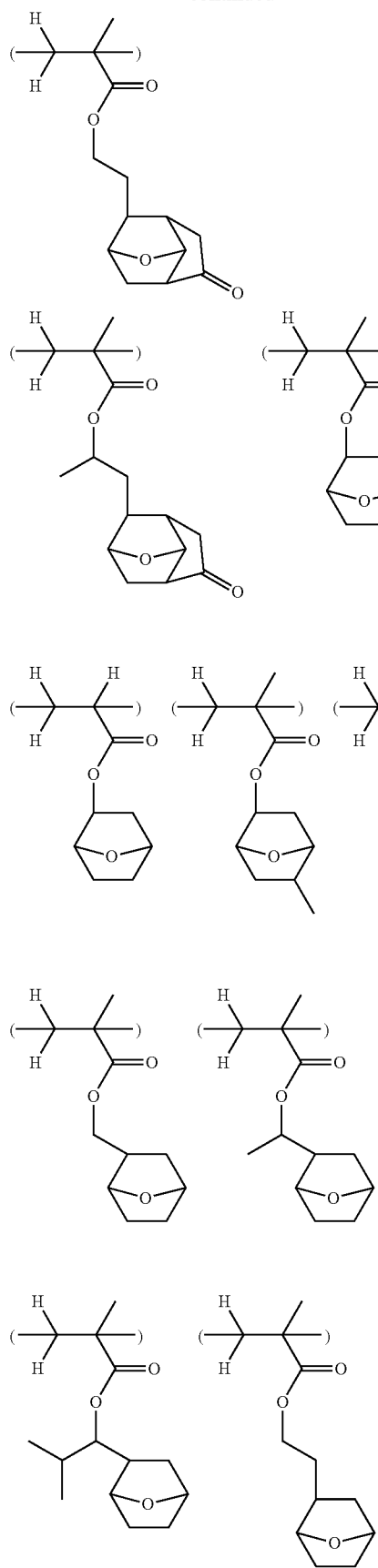
44
-continued
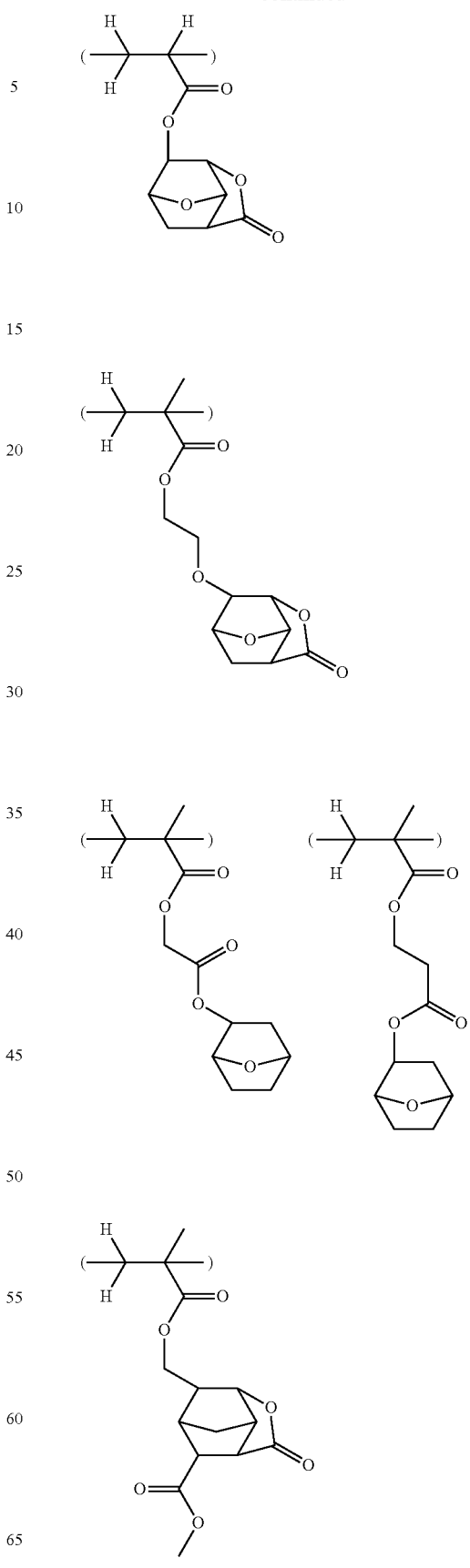

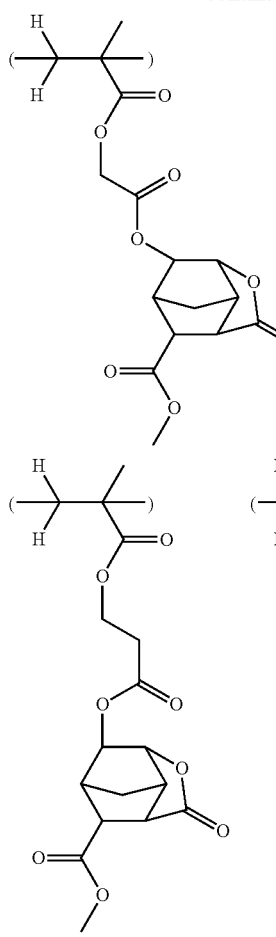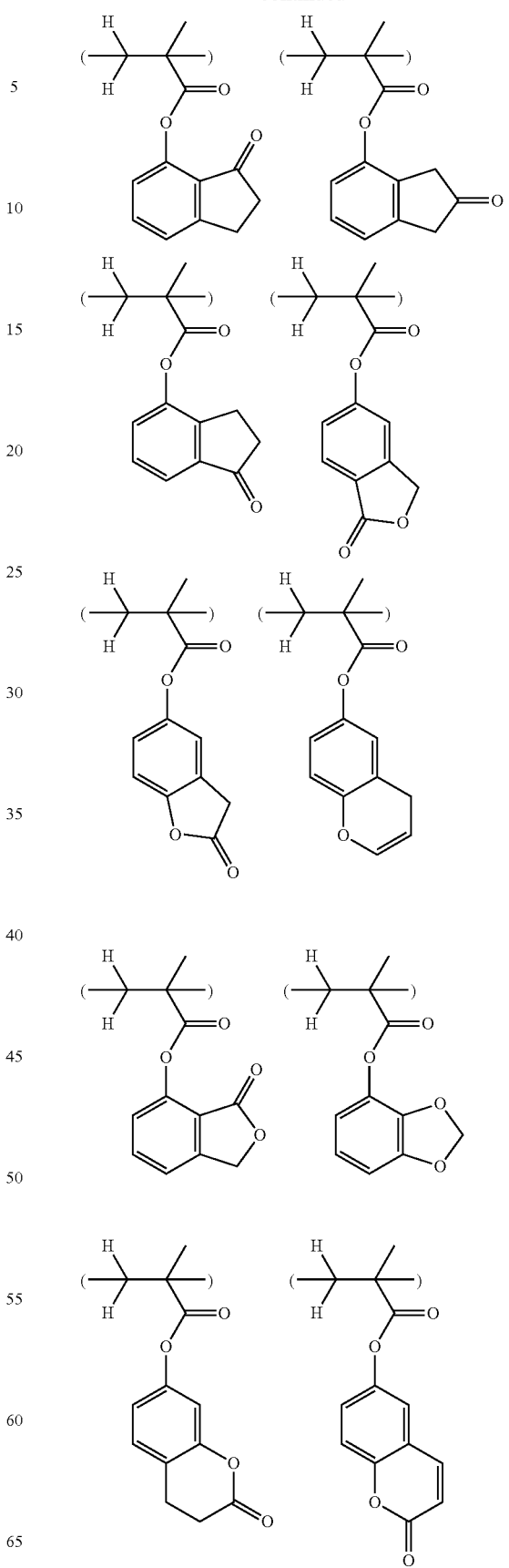

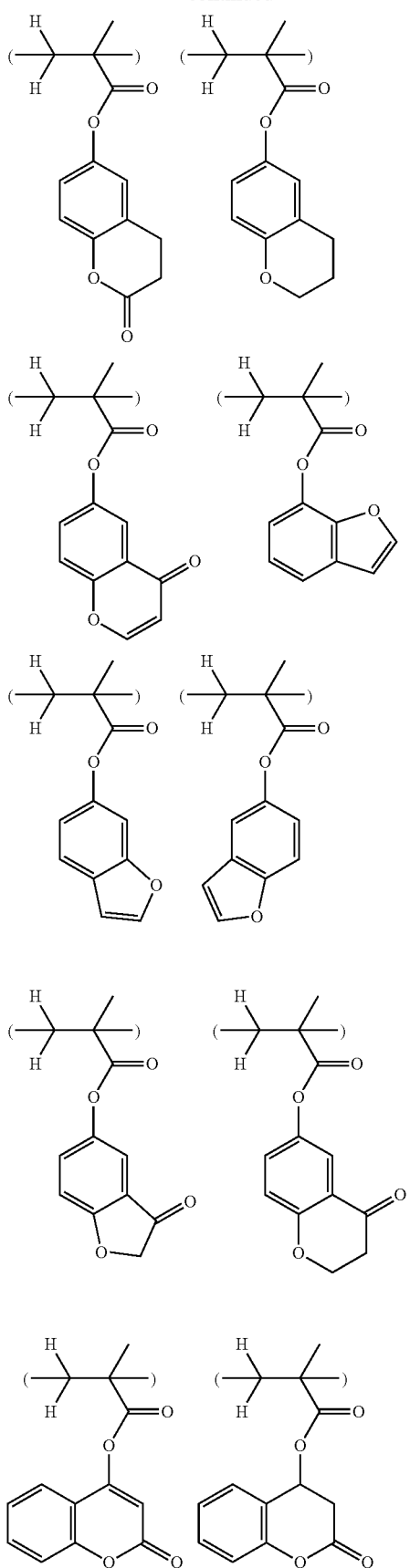
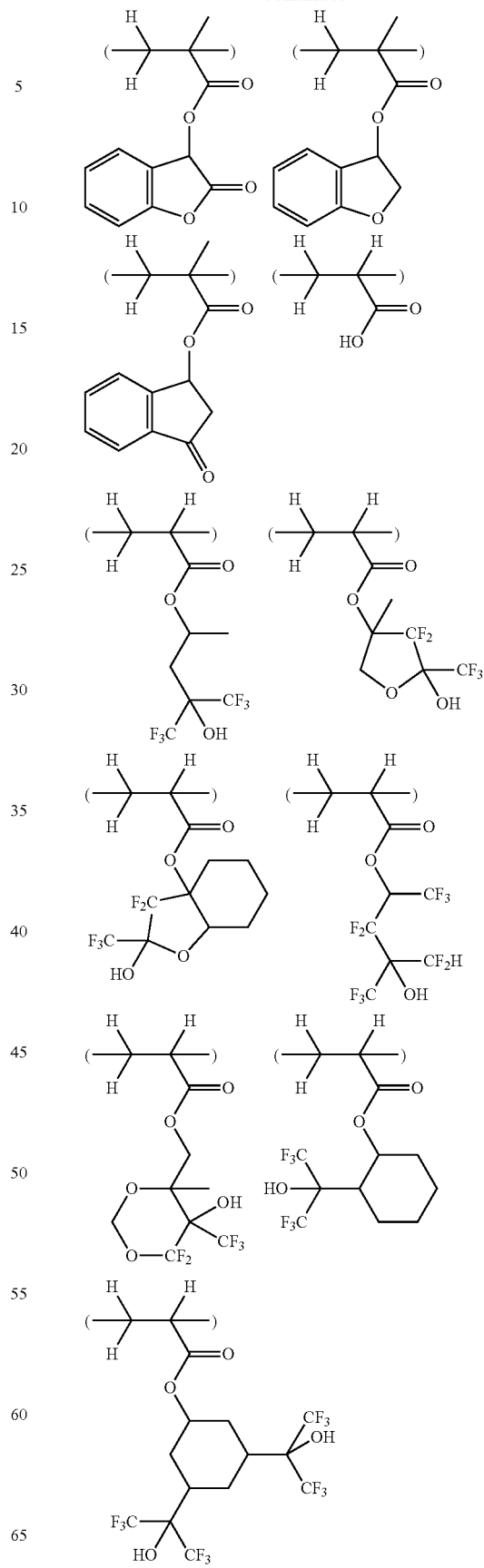

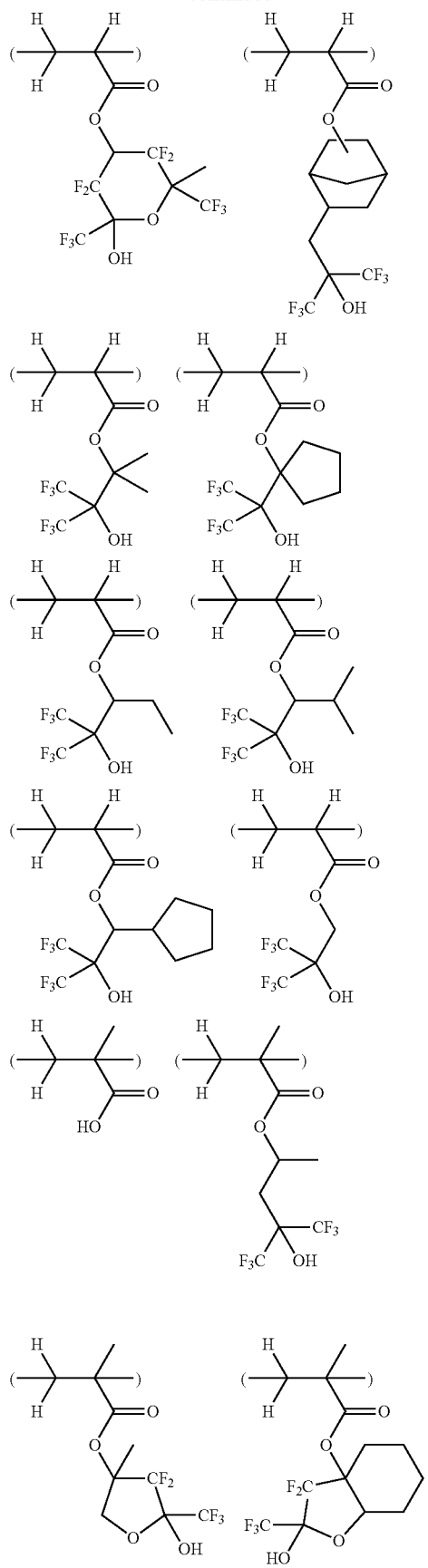
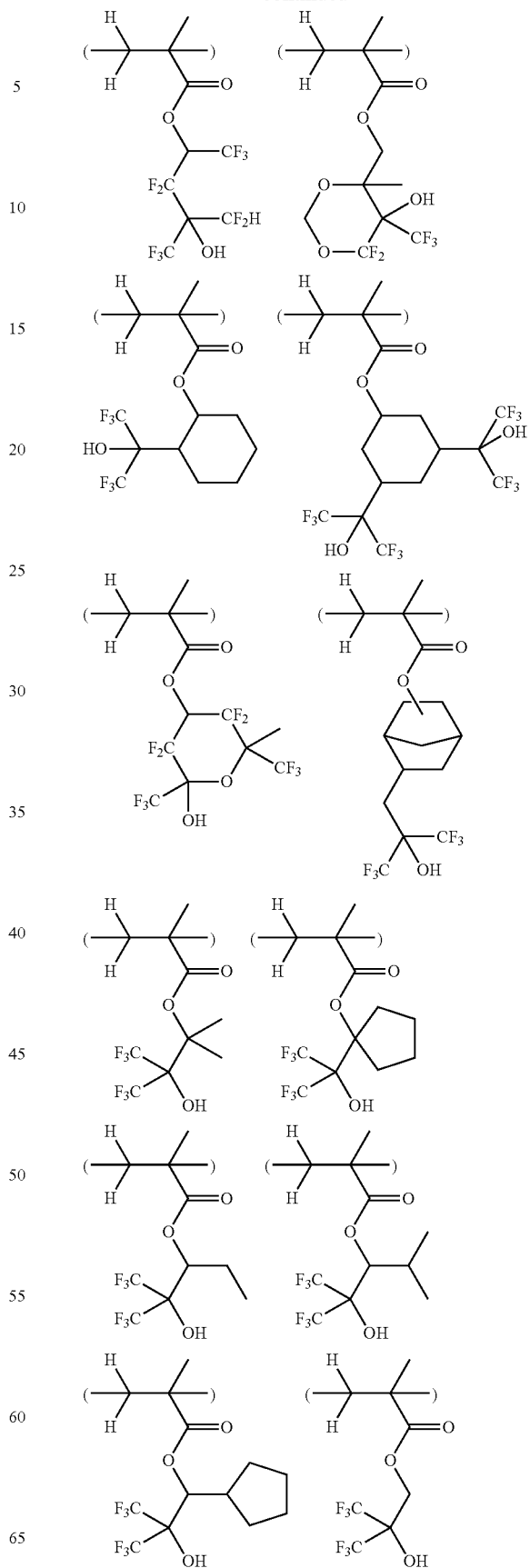

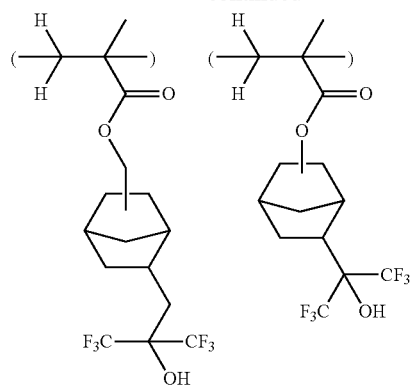
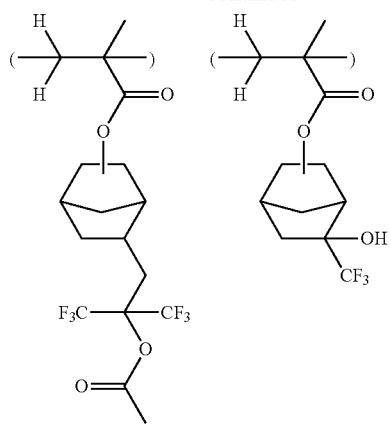
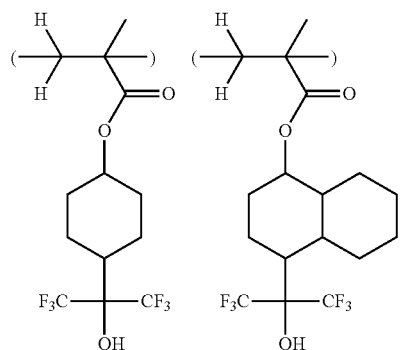
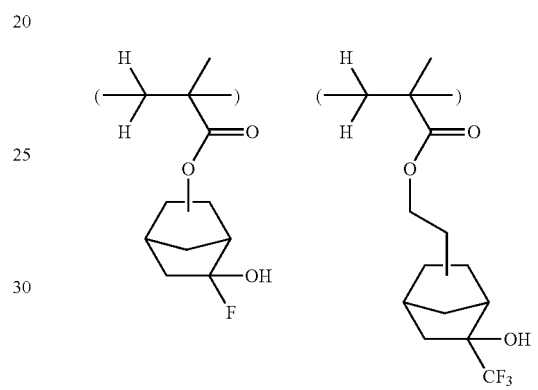
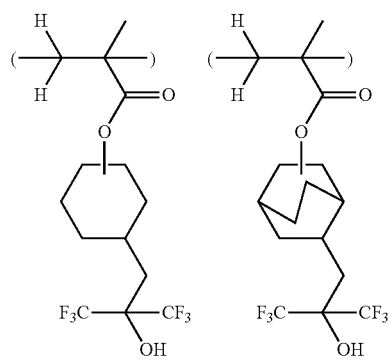
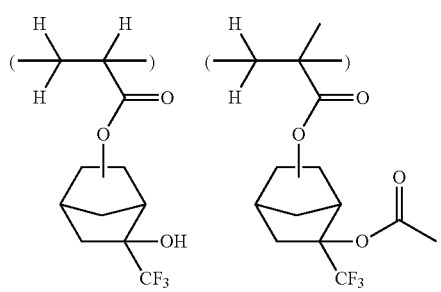
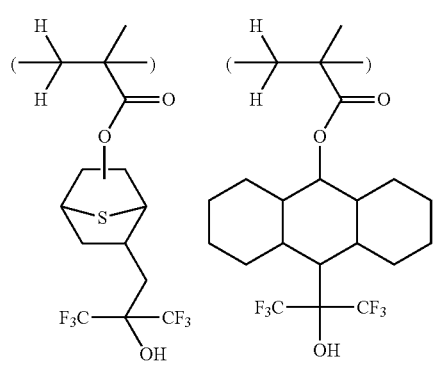
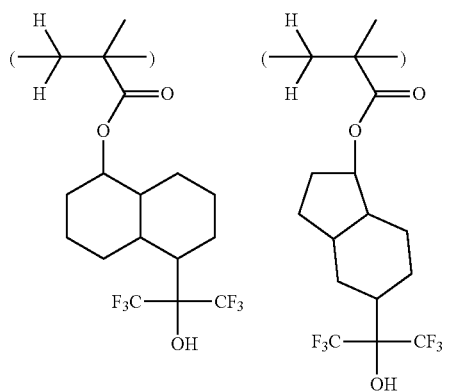

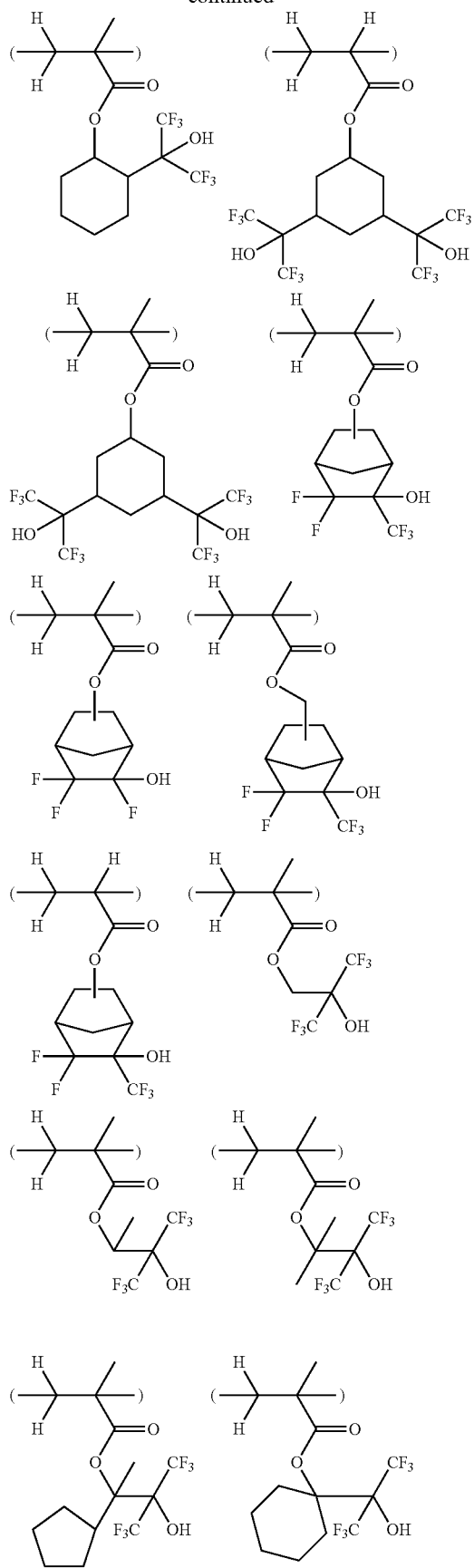
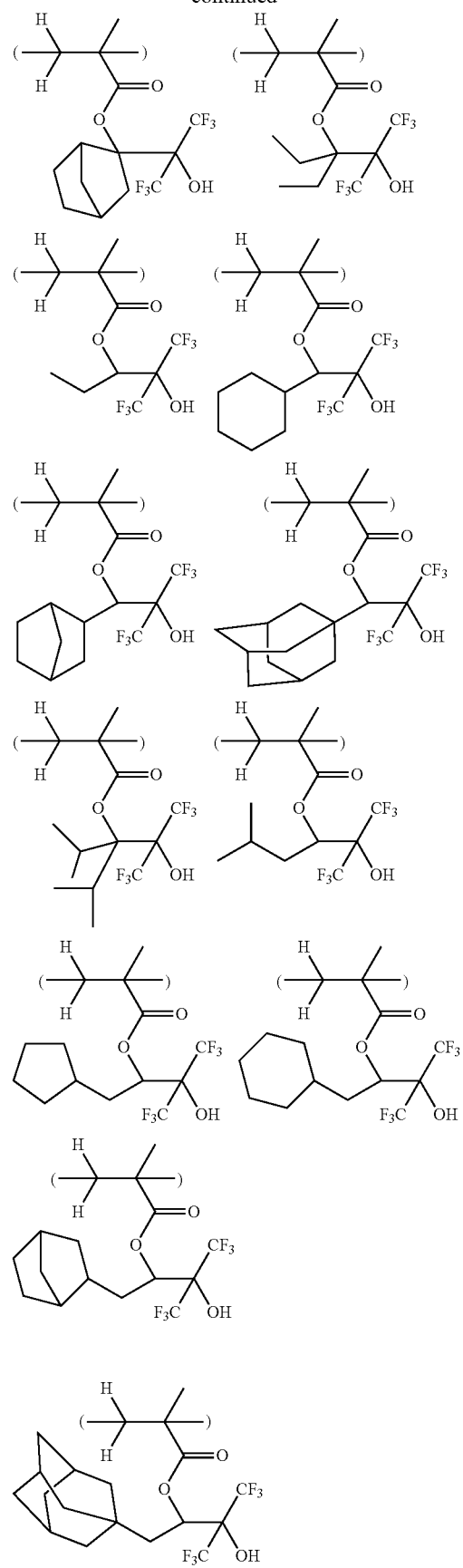

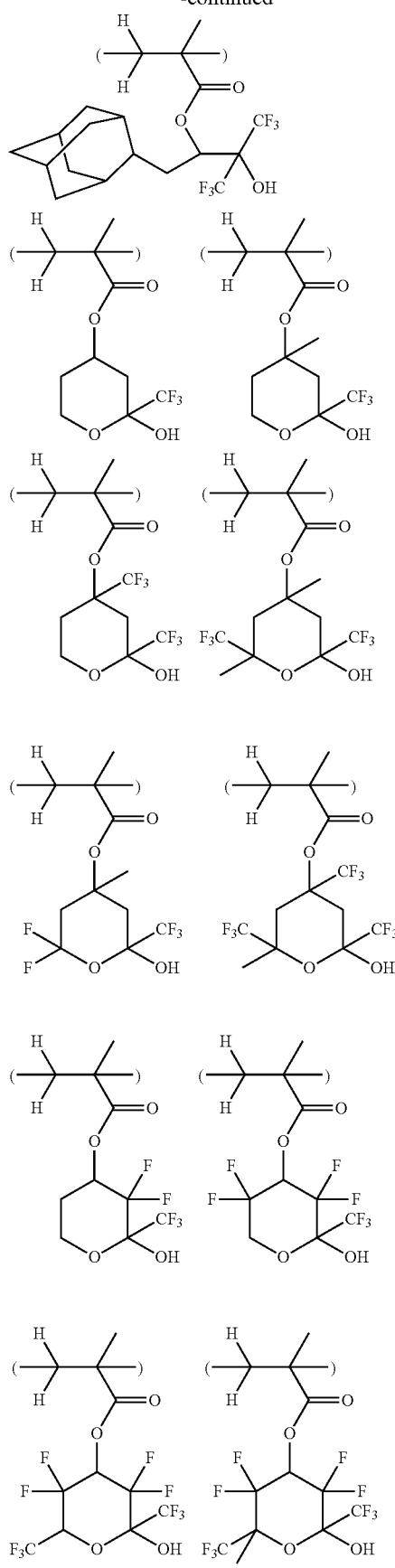
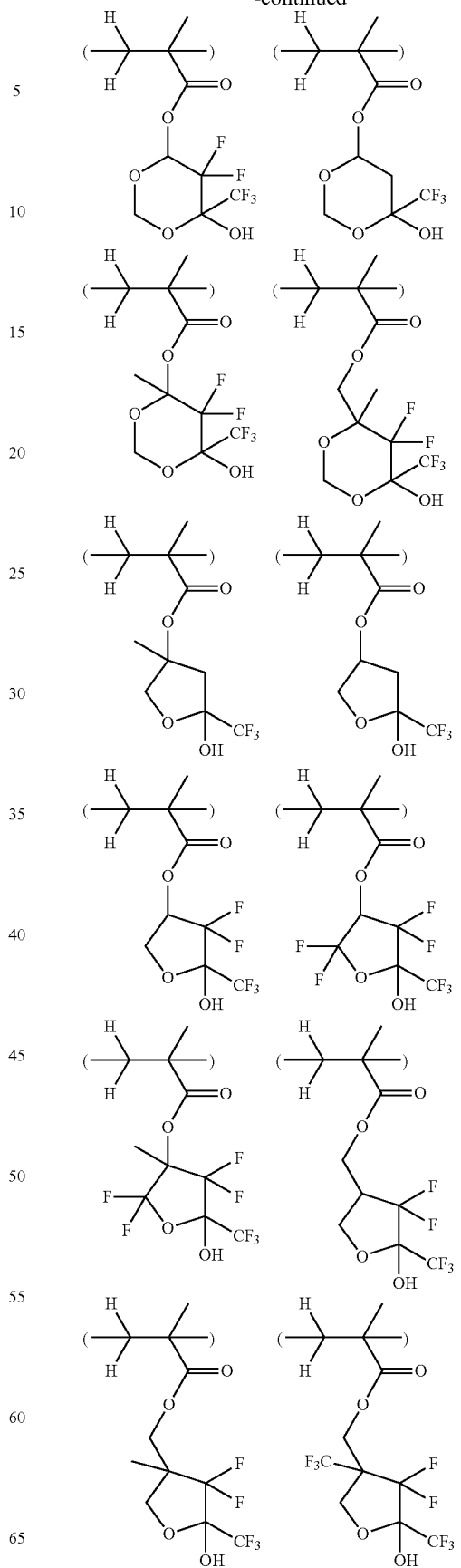

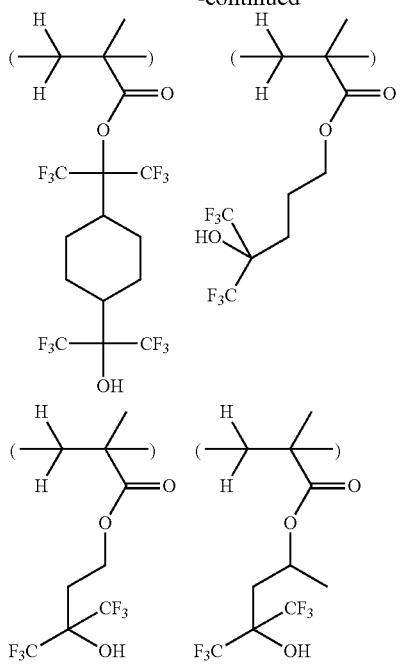
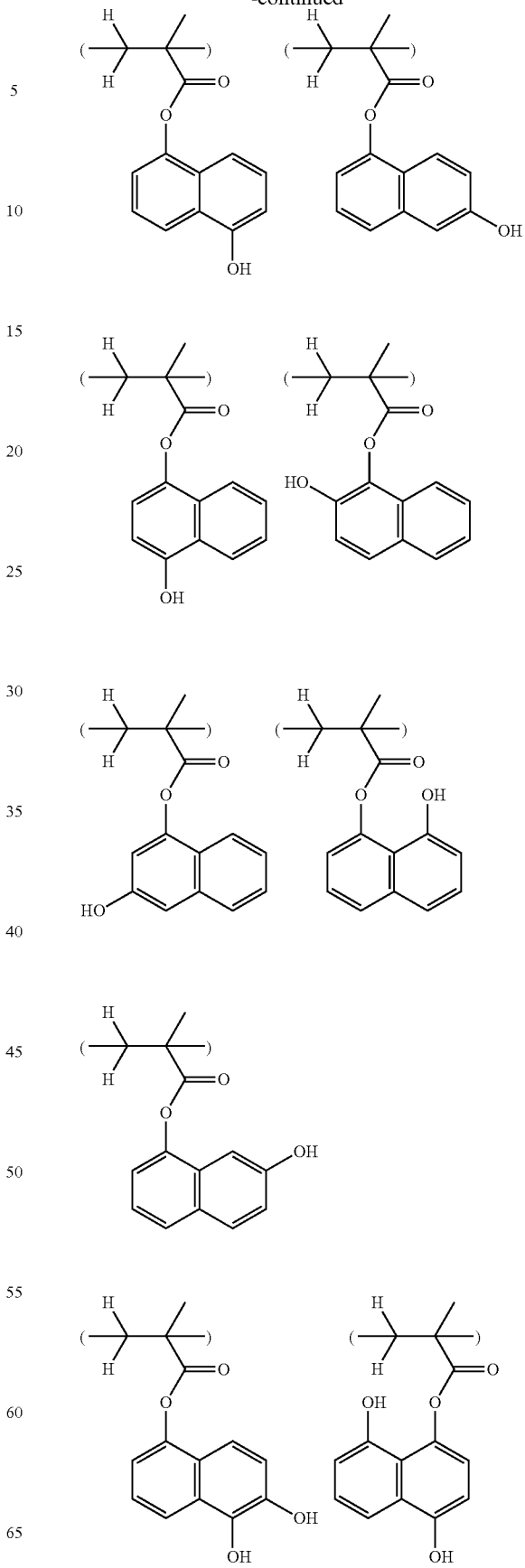

-continued

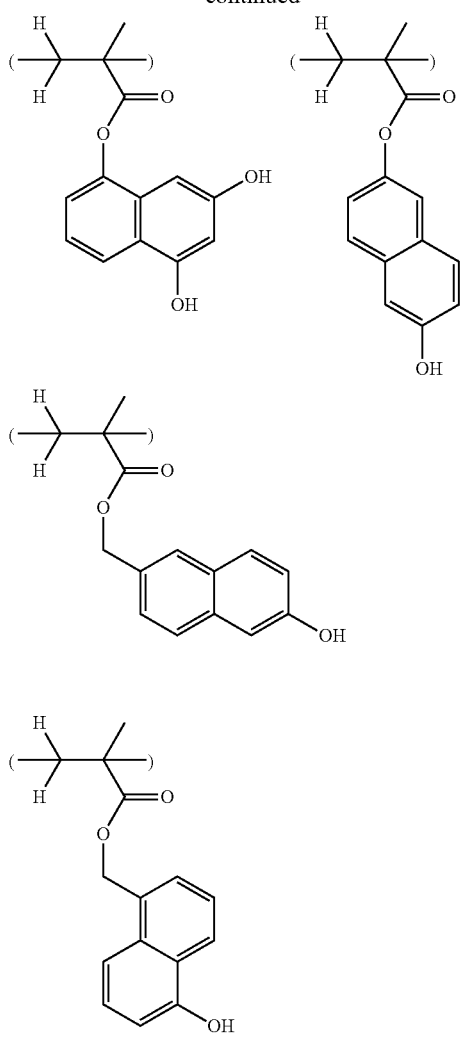

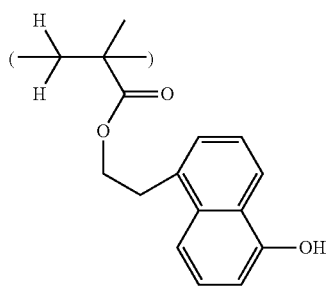

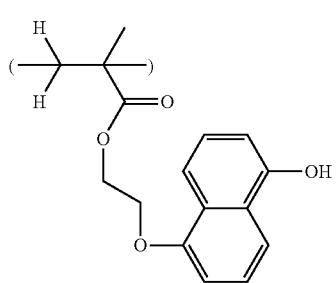

-continued

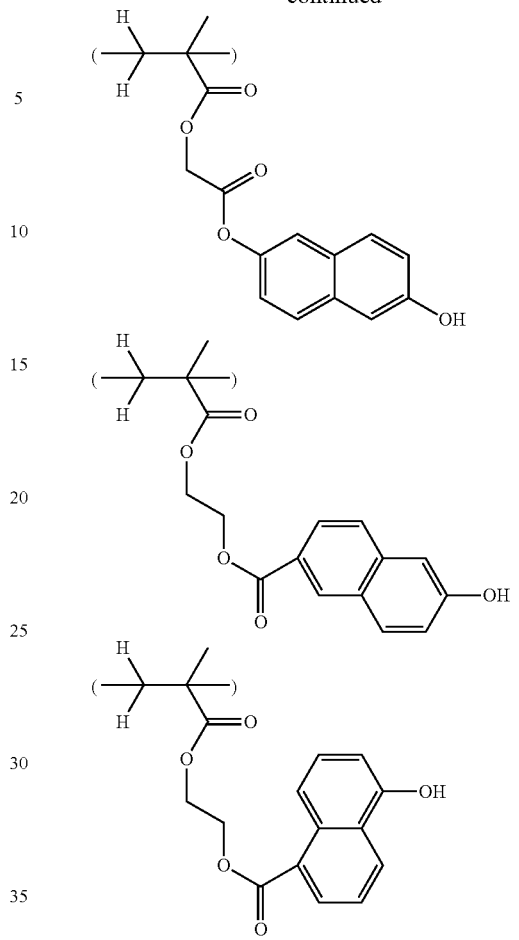

When the repeating unit represented by the general formula (3) is used, in particular, that having a lactone ring as a polar group is most preferably used.

As already mentioned above, the base resin to be used in the chemically amplified resist composition of the present invention preferably contains the repeating units represented by the general formulae (2) and (3), and may be further contains a repeating unit represented by the general formula (d1) or (d2) as an additional repeating unit,

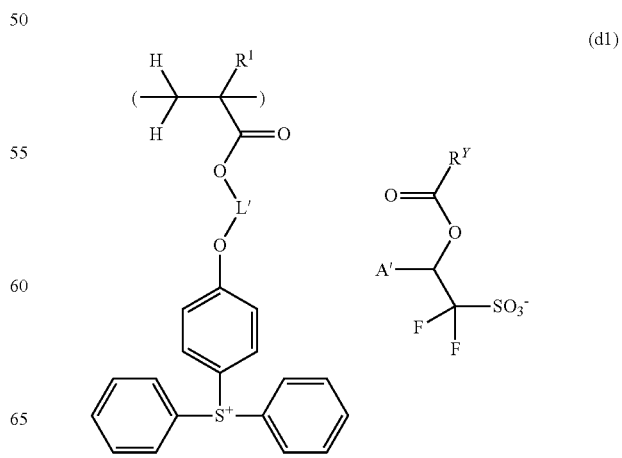

(d1)

-continued (d2)

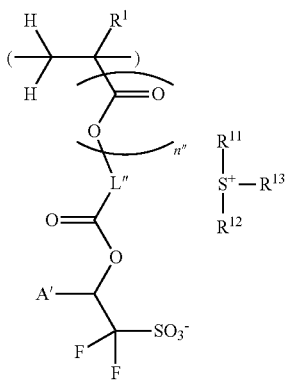

wherein $R^1$ has the same meaning as defined above; $R^Y$ represents a linear monovalent hydrocarbon group having 1 to 20 carbon atoms or a branched or cyclic monovalent hydrocarbon group having 3 to 20 carbon atoms which may be substituted with a heteroatom, or interposed by a heteroatom; A' represents a hydrogen atom or a trifluoromethyl group; L' represents a single bond or an alkylene group having 2 to 5 carbon atoms; L" represents a single bond or a linear divalent hydrocarbon group having 1 to 20 carbon atoms or a branched or cyclic divalent hydrocarbon group having 3 to 20 carbon atoms which may be substituted with a heteroatom, or interposed by a heteroatom; n" is 0 or 1, with the proviso that when L" is a single bond, n" is always 0; and $R^{11}$, $R^{12}$, and $R^{13}$ each represent a linear monovalent hydrocarbon group having 1 to 20 carbon atoms or a branched or cyclic monovalent hydrocarbon group having 3 to 20 carbon atoms which may be substituted with a heteroatom, or interposed by a heteroatom.

In the general formula (d1), details of $R^1$ is as already described above. L' represents a single bond or an alkylene group having 2 to 5 carbon atoms, preferably an ethylene group, a propylene group, or a butylene group. A' represents a hydrogen atom or a trifluoromethyl group, preferably a trifluoromethyl group. $R^Y$ represents a linear monovalent hydrocarbon group having 1 to 20 carbon atoms or a branched or cyclic monovalent hydrocarbon group having 3 to 20 carbon atoms which may be substituted with a heteroatom, or interposed, by a heteroatom.

In the general formula (d1), illustrative examples of the structure of the anion portion include those described in Japanese Patent Laid-Open Publication No. 2010-113209 and No. 2007-145797.

In the general formula (d2), illustrative examples of the structure thereof include those described in Japanese Patent Laid-Open Publication No. 2010-077404 and No. 2010-116550.

The base resin contained in the chemically amplified resist composition of the present invention preferably has the repeating units represented by the general formulae (2) and (3), and if necessary, further has the repeating unit represented by the general formula (d1) or (d2). In addition to these, repeating units having a structure in which a hydroxyl group is protected by an acid-labile group may be further copolymerized as additional repeating units. The repeating unit having the structure in which a hydroxyl group is protected by an acid-labile group is not particularly limited as long as having one or more structures in which a hydroxyl group is protected, and being decomposed by the action of an acid to generate a hydroxyl group; and a repeating unit having a structure represented by the following general formula (10a) is preferable.

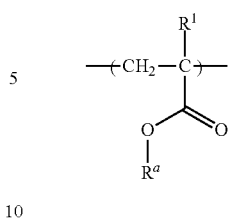

In the formula, $R^1$ has the same meaning as defined above; $R^a$ represents a linear, branched or cyclic monovalent hydrocarbon group having 1 to 20 carbon atoms which may be substituted with a heteroatom, or interposed by a heteroatom, with the proviso that $R^a$ has 1 to 4 substituents represented by the following general formula (10b), $$—OR^b \quad (10b)$$

wherein $R^b$ represents an acid-labile group; and the dotted line represents a bonding arm.

The repeating unit represented by the general formula (10a) may be exemplified by the following, but is not limited to these.

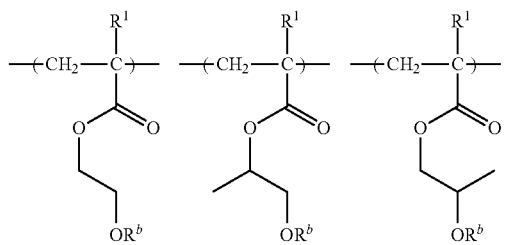

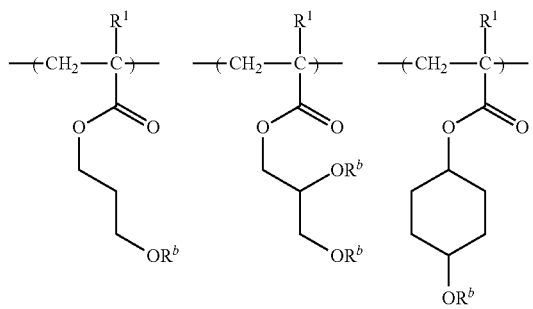

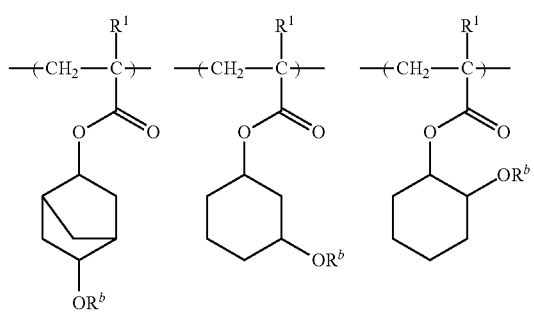

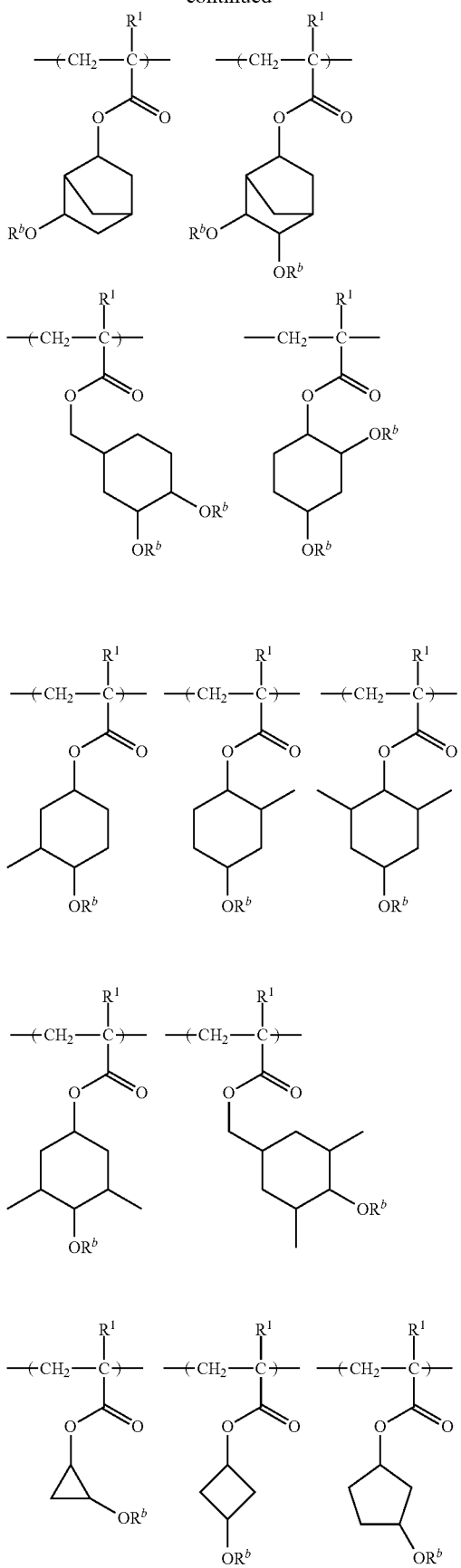
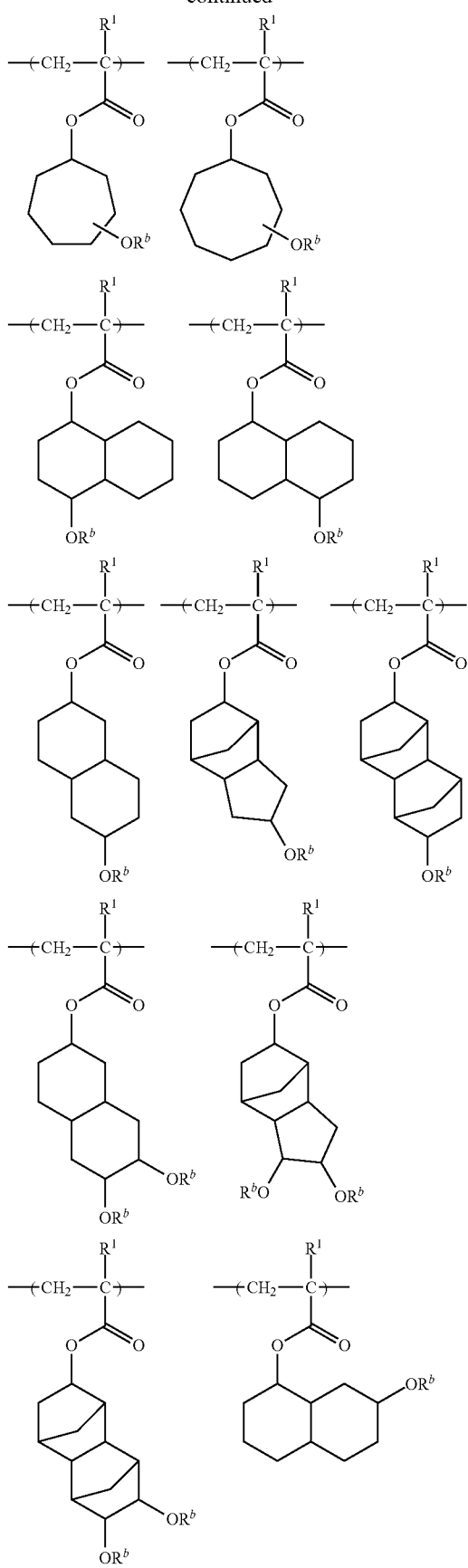

-continued
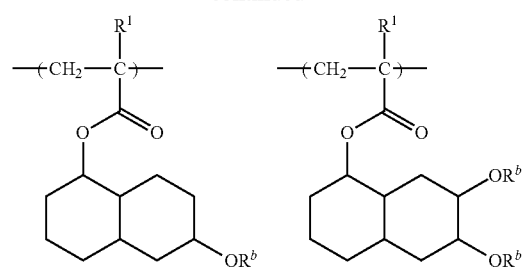
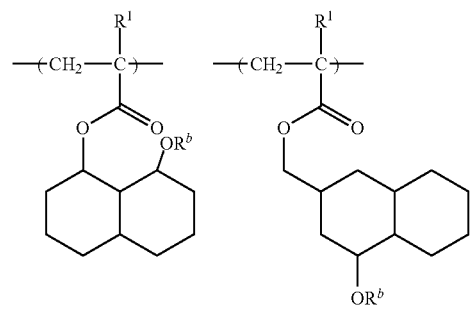
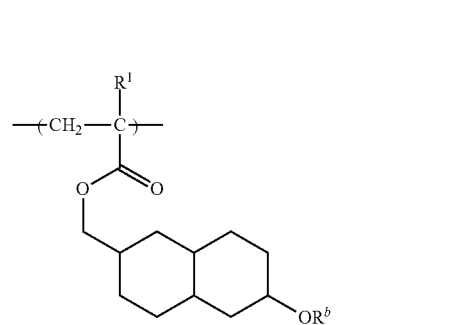
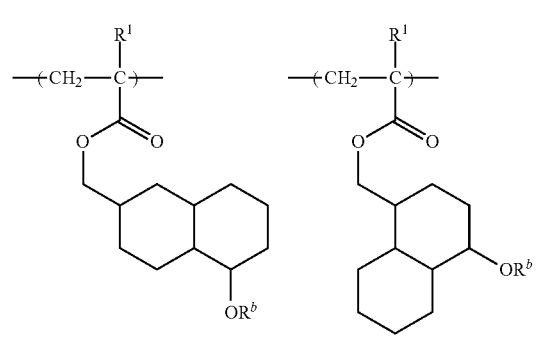
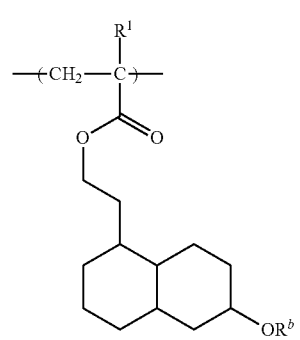
-continued
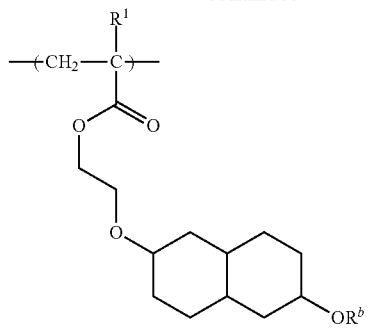
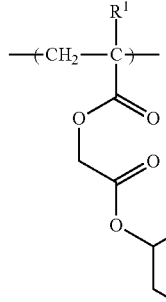
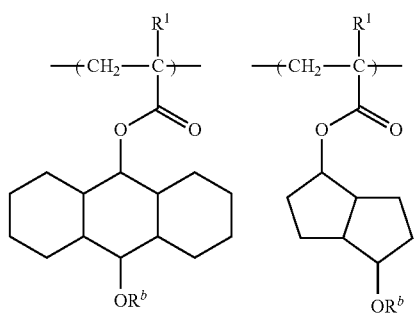
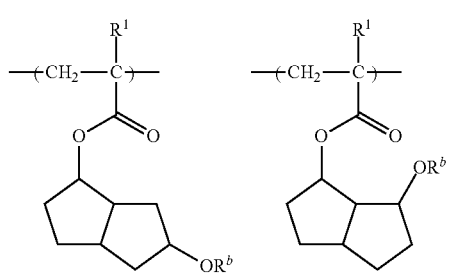
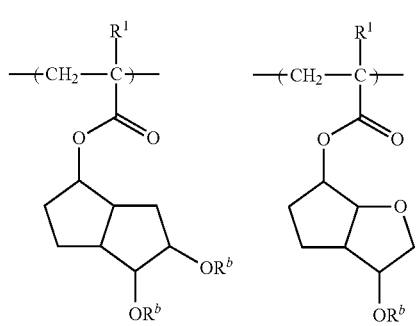

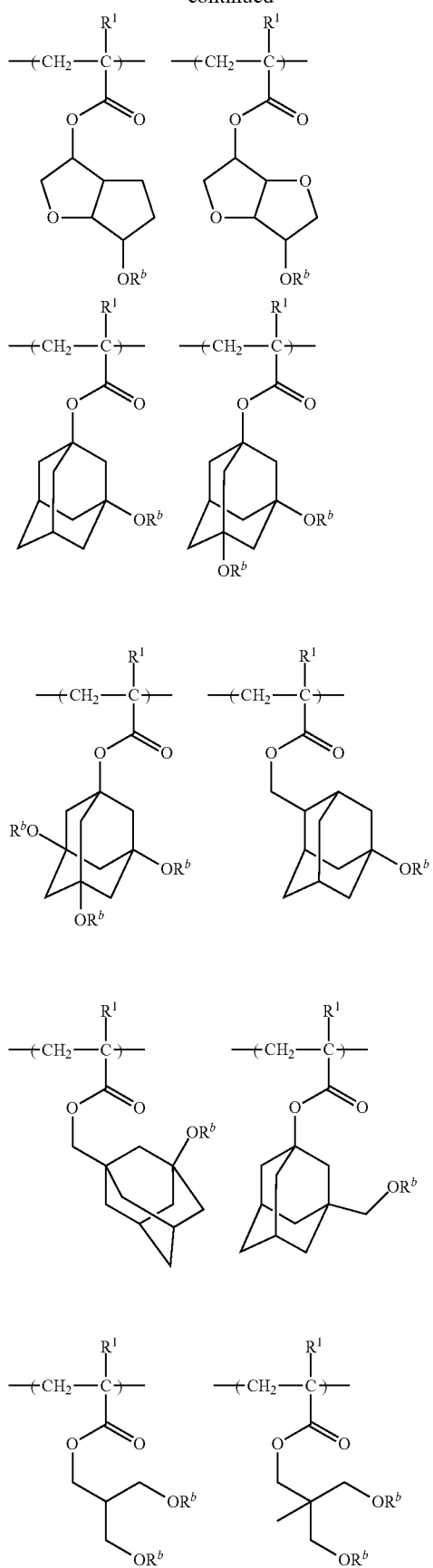
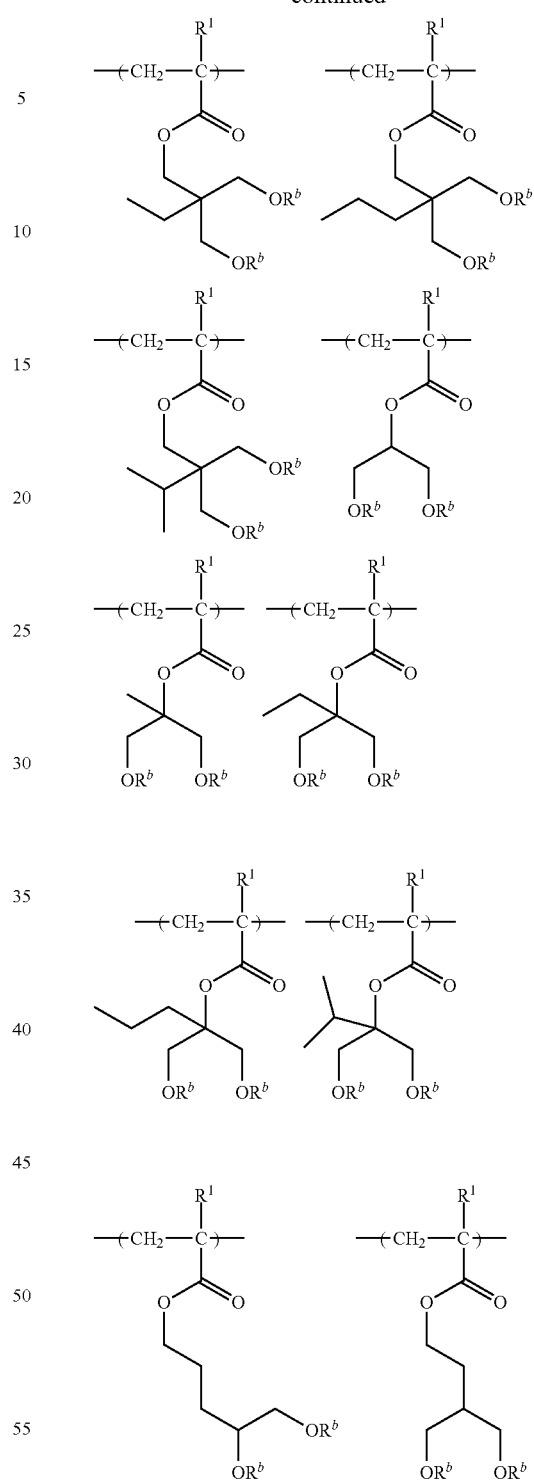

In the above formula, $R^1$ has the same meaning as defined above; and $R^b$ is the same as XA described above.

The structure of the acid-labile group $R^b$ in the general formula (10b) is not particularly limited as long as capable of being decomposed by the action of an acid to generate a hydroxyl group, and may be exemplified by acetal structure, ketal structure, an alkoxycarbonyl group, etc. Illustrative examples thereof include the following structure,

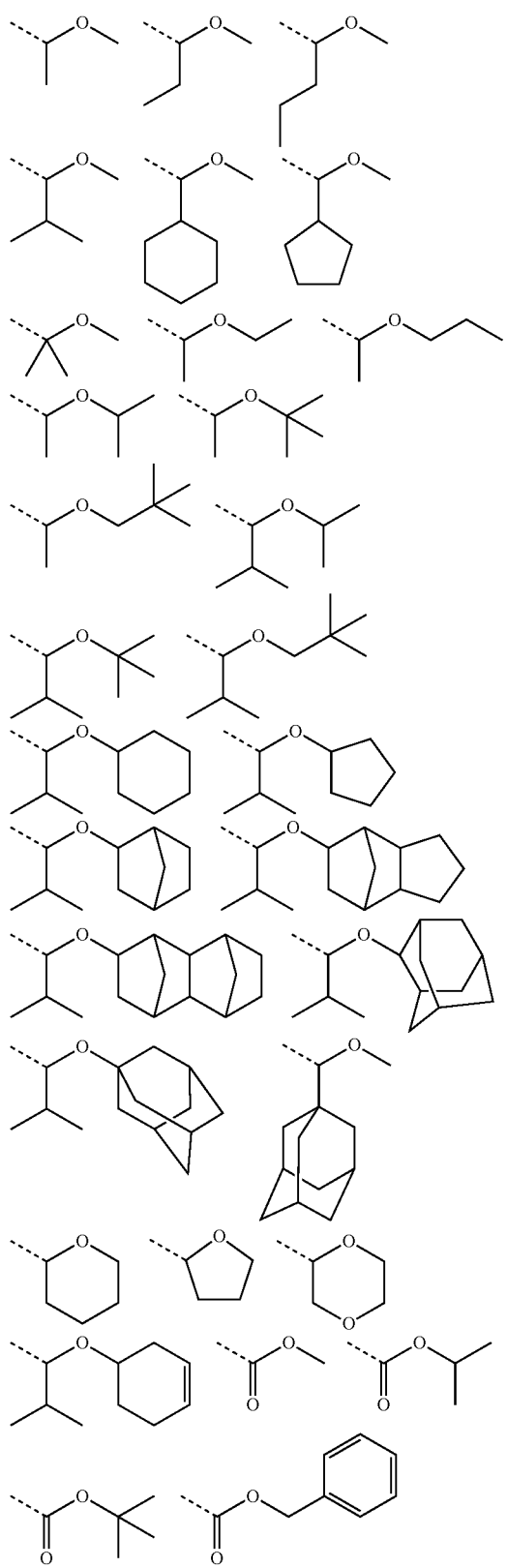

wherein the dotted line represents a bonding arm.

The most preferable acid-labile group of $R^b$ in the general formula (10b) is an alkoxymethyl group represented by the following general formula (10c),

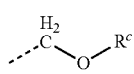
(10c)

wherein the dotted line represents a bonding arm (hereinafter the same); and $R^c$ represents a linear, branched, or cyclic monovalent hydrocarbon group having 1 to 15 carbon atoms and optionally having an oxygen atom.

The acid-labile group represented by the general formula (10c) may be specifically exemplified by the following, but is not limited to these.

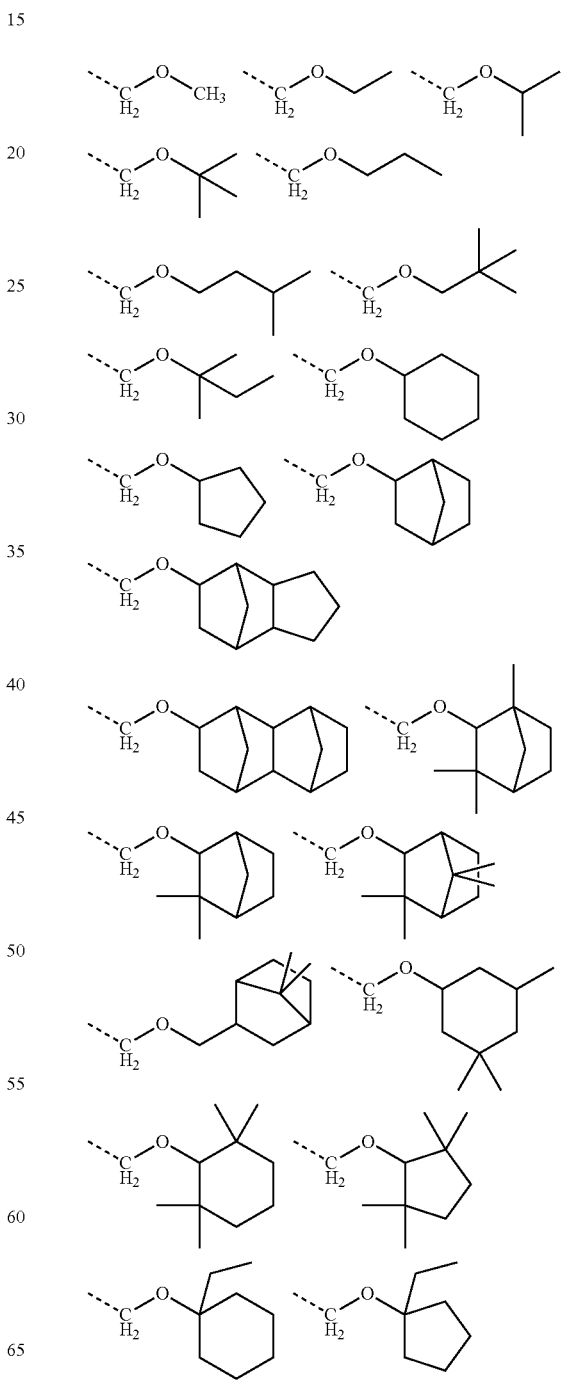

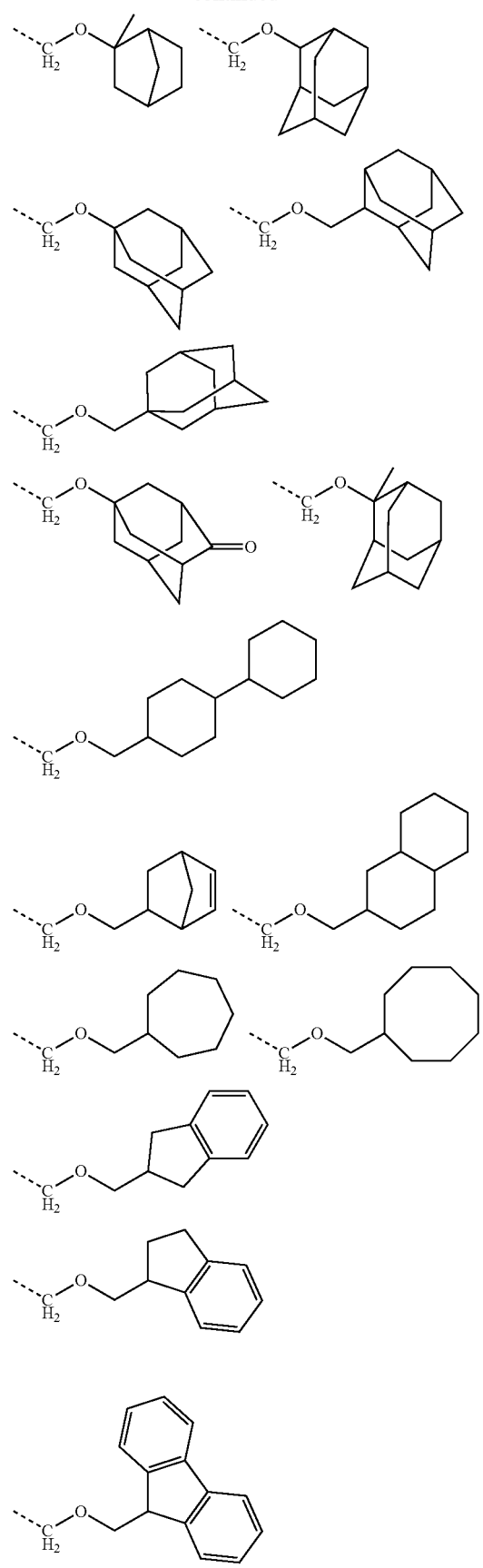
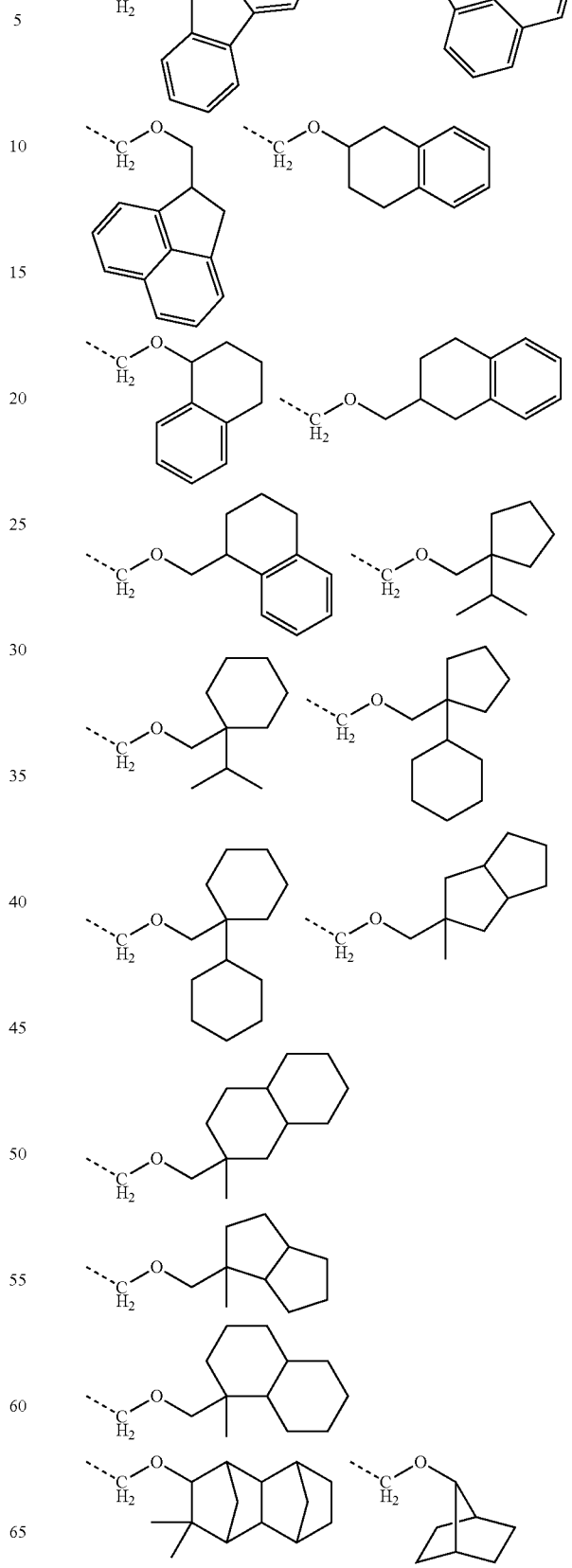

-continued

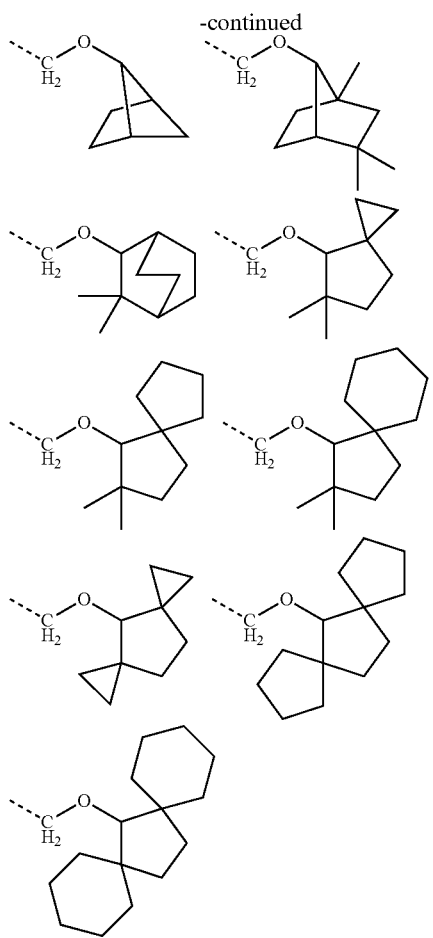

In the polymer compound of the component (A) to be used in the chemically amplified resist composition of the present invention, when the repeating unit represented by the general formula (2) and the repeating unit represented by the general formula (3) are used, the preferable amount of the respective repeating units obtained from respective monomers may be, for example, in the range (mol %) shown below, but is not limited to these.

(I) one kind or two or more kinds of the structural units represented by the general formula (2) are contained in an amount of 1 to 60 mol %, preferably 5 to 50 mol %, more preferably 10 to 50 mol %, (II) one kind or two or more kinds of the structural units represented by the general formula (3) are contained in an amount of 40 to 99 mol %, preferably 50 to 95 mol %, more preferably 50 to 90 mol %, if necessary, (III) one kind or two or more kinds of the structural units represented by the general formula (d1) or (d2) may be contained in an amount of 0 to 30 mol %, preferably 0 to 20 mol %, more preferably 0 to 10 mol %, and if necessary, (IV) one kind or two or more kinds of the structural units based on the other monomers may be contained in an amount of 0 to 80 mol %, preferably 0 to 70 mol %, more preferably 0 to 50 mol %.

Alternatively, the base resin to be used in the chemically amplified resist composition of the present invention is preferably a polymer compound having a repeating unit represented by the general formula (4) and a repeating unit represented by the general formula (5), particularly in the KrF lithography, the EUV lithography, and the electron beam lithography,

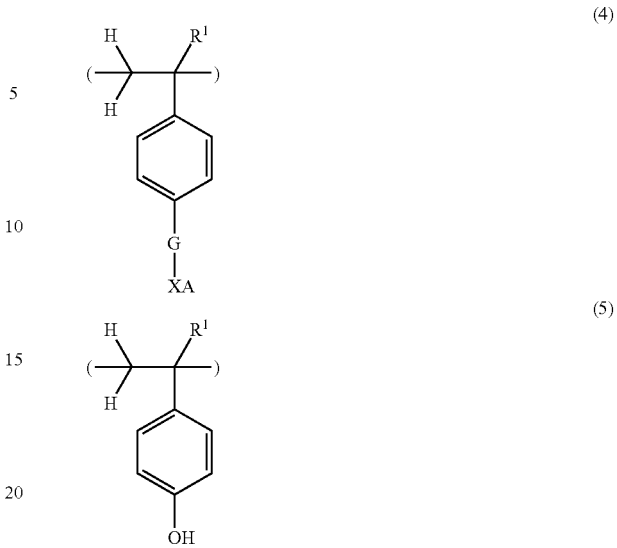

wherein $R^1$ represents a hydrogen atom, a fluorine atom, a methyl group or a trifluoromethyl group; XA represents an acid-labile group; and G represents an oxygen atom or a carbonyloxy group, with the proviso that when G is a carbonyloxy group, a carbon atom of the carbonyloxy group is bonded to the benzene ring in the general formula (4).

The polymer containing the repeating unit represented by the general formula (4) is decomposed by the action of an acid to generate a phenolic hydroxyl group and/or a carboxylic acid, and provides an alkali-soluble polymer. The acid-labile group XA may be exemplified as mentioned above, and acetal structure is preferable in the general formula (4).

The repeating unit represented by the general formula (4) may be specifically exemplified by the following, but is not limited to these.

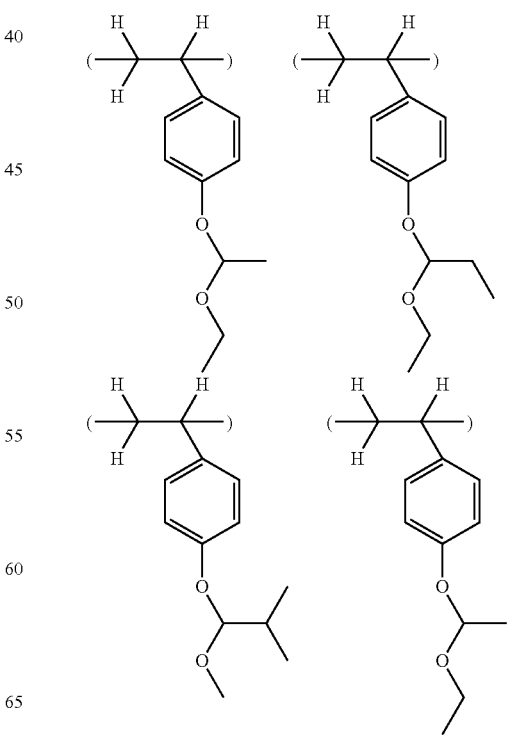

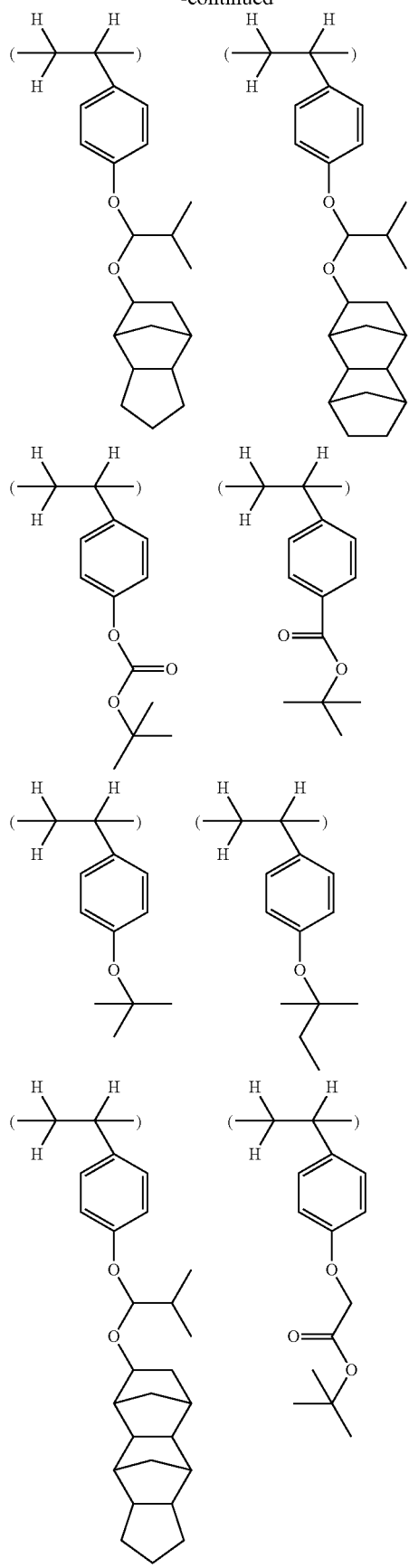
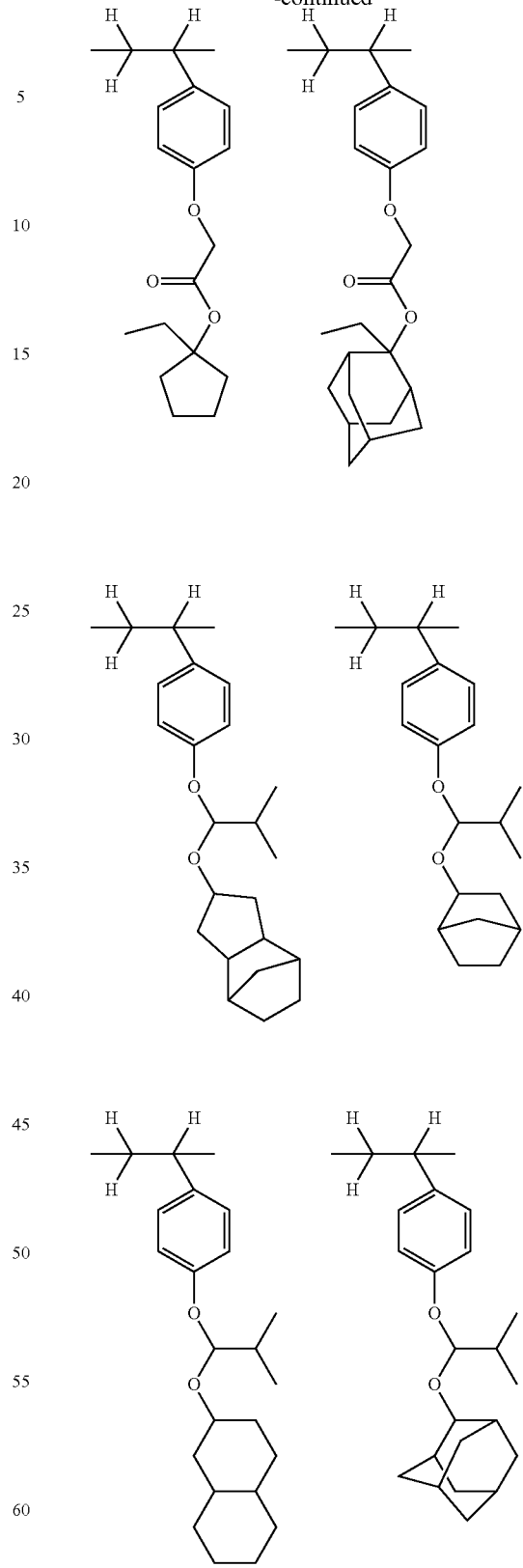
Further, a repeating unit represented by the following general formula (6) or (7) may be contained in addition to the repeating units represented by the general formulae (4) and (5),

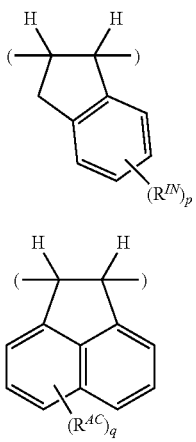

wherein "p" and "q" independently represent an integer of 0 to 6; $R^{IN}$ and $R^{AC}$ independently represent a hydrogen atom or any of an alkyl group, an alkoxy group, and an alkylcarbonyloxy group each having 1 to 6 carbon atoms which may be substituted with a halogen atom.

In the general formula (6), "p" is preferably 0. Also, in the general formula (7), "q" is preferably 0.

In the polymer compound of the component (A) to be used in the chemically amplified resist composition of the present invention, when the repeating units represented by the general formulae (4) and (5) are used, the preferable amount of the respective repeating units obtained from respective monomers may be, for example, in the range (mol %) shown below, but is not limited to these.

(I) one kind or two or more kinds of the structural units represented by the general formula (4) are contained in an amount of 1 to 60 mol %, preferably 5 to 50 mol %, more preferably 10 to 50 mol %, (II) one kind or two or more kinds of the structural units represented by the general formula (5) are contained in an amount of 40 to 99 mol %, preferably 50 to 95 mol %, more preferably 50 to 90 mol %, if necessary, (III) one kind or two or more kinds of the structural units represented by the general formula (6) or (7) may be contained in an amount of 0 to 30 mol %, preferably 0 to 20 mol %, more preferably 0 to 10 mol %, and if necessary, (IV) one kind or two or more kinds of the structural units based on the other monomers may be contained in an amount of 0 to 80 mol %, preferably 0 to 70 mol %, more preferably 0 to 50 mol %.

The weight average molecular weight of the polymer compound of the component (A) to be used in the chemically amplified resist composition of the present invention is preferably in the range of 1,000 to 500,000, more preferably 3,000 to 100,000. The above-described range allows to prevent etching resistance from markedly lowering, and further prevent deterioration of the resolution due to insufficient difference in dissolution rate between before and after the exposure. As the measurement method of the molecular weight, a gel permeation chromatography (GPC) using a polystyrene as standard, a light scattering method, etc., may be mentioned.

The polymer compound of the component (A) to be used in the chemically amplified resist composition of the present invention may be produced in a known manner. For example, radical polymerization and anionic polymerization may be mentioned.

Preferable reaction conditions of the radical polymerization are as follows, though outside these ranges are not excluded:

(a) solvent: hydrocarbons such as benzene, ethers such as tetrahydrofurane, alcohols such as ethanol, or ketones such as methyl isobutyl ketone,
(b) polymerization initiator: an azo compound such as 2,2'-azobisisobutyronitrile, or a peroxide such as benzoylperoxide and lauroylperoxide,
(c) reaction temperature: about 0° C. to about 100° C., and
(d) reaction time: about 0.5 hour to about 48 hours.

Preferable reaction conditions of the anionic polymerization are as follows, though outside these ranges are not excluded:

(a) solvent: hydrocarbons such as benzene, ethers such as tetrahydrofurane, or liquid ammonia,
(b) polymerization initiator: a metal such as sodium and potassium, an alkyl metal such as n-butyl lithium and sec-butyl lithium, a ketyl, or a Grignard reagent,
(c) reaction temperature: about −78° C. to about 0° C.,
(d) reaction time: about 0.5 hour to about 48 hours, and
(e) terminator: a proton-donating compound such as methanol, a halogen compound such as methyl iodide, and other electrophilic substances.

(B) Photo acid generator represented by the general formula (1a), preferably represented by the general formula (1b)

The chemically amplified resist composition of the present invention contains the photo acid generator represented by the general formula (1a), preferably (1b). Illustrative examples thereof are as mentioned above.

(C) Organic Solvent

The organic solvent of the component (C) to be used in the chemically amplified resist composition of the present invention may be any organic solvent as long as the polymer compound, the photo acid generator, the quencher, and the other additives can dissolve therein. Illustrative examples of the organic solvent are disclosed, for example, in paragraphs [0144] and [0145] of Japanese Patent Application Laid-Open No. 2008-111103, and include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and a mixed solvent thereof. When an acetal type acid-labile group is used, an alcohol solvent with high boiling point, such as diethylene glycol, propylene glycol, glycerin, 1,4-butanediol, and 1,3-butanediol, may be added to accelerate the deprotection reaction of the acetal.

In the present invention, among these organic solvents, 1-ethoxy-2-propanol, propylene glycol monomethyl ether acetate, cyclohexanone, γ-butyrolactone, and a mixed solvent thereof, which are particularly excellent in solubility of the acid generator in the resist component, are preferably used.

The amount of the organic solvent to be used is suitably in the range of 200 to 7,000 parts by mass, particularly suitably 400 to 5,000 parts by mass based on 100 parts by mass of the base resin.

(D) Photo Acid Generator Other than the Component (B)

The chemically amplified resist composition of the present invention contains, as essential component, (B) the photo acid generator represented by the general formula (1a), preferably (1b), and may further contains a photo acid generator other than the component (B). As the photo acid generator other than the component (B), any compound may be used as long as it is a compound capable of generating an acid by the irradiation of high energy beam. Preferable examples of the additional photo acid generator include a sulfonium salt, an iodonium salt, sulfonyldiazomethane, N-sulfonyloxyimide, and an oxime-o-sulfonate type acid generator. These may be used alone or as a mixture of two or more kinds.

Illustrative examples of the additional photo acid generator are disclosed in paragraphs [0122] to [0142] of Japanese Patent Laid-Open Publication No. 2008-111103.

Particularly in the KrF lithography and the electron beam lithography, among the illustrative examples of the additional photo acid generator, an arylsulfonate type photoacid generator is preferable since it generates an acid with suitable acid strength.

Also, in the ArF lithography and the EUV lithography, besides the above illustrative examples, those having a structure capable of generating a partially fluorinated sulfonic acid disclosed in Japanese Patent Laid-Open Publication No. 2007-145797, No. 2009-7327, No. 2012-41320, and No. 2010-215608 are preferably used.

The adding amount of the additional photo acid generator (D) is preferably in the range of 0 to 40 parts by mass based on 100 parts by mass of the base resin in the chemically amplified resist composition of the present invention, and when blended, it is preferably in the range of 0.1 to 40 parts by mass, more preferably 0.1 to 20 parts by mass. If the amount is 40 parts by mass or less, it is possible to prevent deterioration of the resolution and causing problems of foreign matters after resist development or during resist removal.

(E) Quencher

To the chemically amplified resist composition of the present invention, a quencher may be added. Herein, the quencher means a compound that can suppress diffusion rate when an acid generated from the photo acid generator is diffused into a resist film. Illustrative examples of the quencher are disclosed in paragraphs [0146] to [0164] of Japanese Patent Laid-Open Publication No. 2008-111103, and include primary, secondary, or tertiary amine compounds, particularly amine compounds having a hydroxyl group, an ether bond, an ester bond, a lactone ring, a cyano group, or a sulfonate ester bond. Other example includes a compound in which a primary or secondary amine is protected by forming a carbamate group as disclosed in Japanese Patent No. 3790649. Also, amineoxide in which amine is oxidized to suppress volatility may also be used.

Meanwhile, these quenchers may be used alone or as a mixture of two or more kinds, and the blending amount thereof is preferably in the range of 0.001 to 12 parts by mass, particularly 0.01 to 8 parts by mass based on 100 parts by mass of the base resin. By blending the quencher, not only resist sensitivity can be readily adjusted, but also diffusion rate of acids in the resist film is suppressed to improve resolution, change in sensitivity after exposure is suppressed, environmental dependency on a substrate can be lowered, and exposure margin and a pattern profile, etc., can be improved. Also, by blending these quenchers, substrate adhesiveness can be also improved.

Also, an onium salt such as a sulfonium salt, an iodonium salt, and an ammonium salt of a carboxylic acid disclosed in the Japanese Patent No. 3991462, may also be used together as a quencher. When a mixture of an onium salt generating a strong acid like a sulfonic acid and an onium salt generating a weak acid like a carboxylic acid is used, a strong acid generated from the photo acid generator by the irradiation of high energy beam collides with the onium salt having an unreacted weak acid anion thereby releasing a weak acid and forming an onium salt having a strong acid anion by the salt-exchange. In this process, the strong acid is exchanged to the weak acid having a lower catalytic activity, and thus the acid is apparently deactivated thereby enabling to control acid diffusion. That is, the weak acid onium salt functions as a quencher.

Here, it is assumed that when the photo acid generator generating a strong acid is an onium salt, a strong acid generated by the irradiation of high energy beam can be exchanged with a weak acid as mentioned above, but a weak acid generated by the irradiation of high energy beam cannot undergo the salt-exchange by collision with an unreacted onium salt generating a strong acid. These are caused by the phenomenon that an onium cation tends to form an ion pair with an anion of a stronger acid.

Also, an onium salt having a substituent containing nitrogen may be used together. Such a compound functions as the so-called photodegradable base in which it acts as the quencher at the unexposed part, and it lost the quencher function at the exposed part by neutralization with the generated acid from itself. By using the photodegradable base, contrast between the exposed part and the unexposed part can be strengthened. The photodegradable base may be used by referring to, for example, Japanese Patent Laid-Open Publication No. 2009-109595, No. 2012-046501, etc.

(F) Surfactant insoluble or difficultly soluble in water and soluble in alkaline developer, and/or surfactant insoluble or difficultly soluble in water and alkaline developer (hydrophobic resin)

To the chemically amplified resist composition of the present invention, a surfactant (F) may be added, and it can be exemplified by referring to the component defined in (S) disclosed in Japanese Patent Laid-Open Publication No. 2010-215608 and No. 2011-16746.

As the surfactant insoluble or difficultly soluble in water and an alkaline developer, among the surfactants disclosed in the above patent documents, FC-4430, Surflon S-381, Surfynol E1004, KH-20, KH-30, and oxetane ring-opened polymers represented by the following structural formula (surf-1) are preferable. These may be used alone or in combination of two or more.

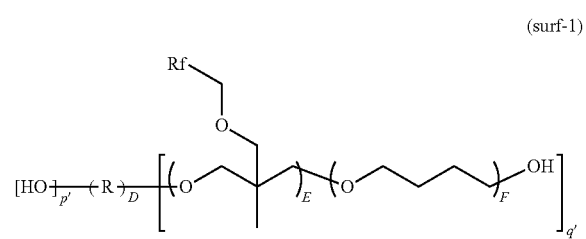

(surf-1)

Here, R, Rf, D, E, F, p' and q' are applied only to the formula (surf-1) irrespective of the above descriptions. R represents a 2- to 4-valent aliphatic group having 2 to 6 carbon atoms, and illustrative examples of the divalent group include ethylene, 1,4-butylene, 1,2-propylene, 2,2-dimethyl-1,3-propylene, and 1,5-pentylene, and the trivalent or tetravalent group may be exemplified by the following,

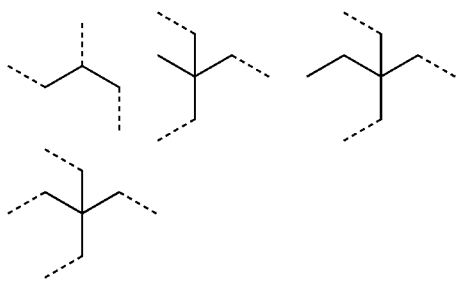

wherein the dotted line represents a bonding arm, and these are partial structures derived from glycerol, trimethylolethane, trimethylolpropane, and pentaerythritol, respectively. Among these, 1,4-butylene or 2,2-dimethyl-1,3-propylene is preferably used. Rf represents a trifluoromethyl group or a pentafluoroethyl group, preferably a trifluoromethyl group: p' is an integer of 0 to 3, q' is an integer of 1 to 4, the sum of p' and q' represents a number of valence of R, and is an integer of 2 to 4. D is 1, E is an integer of 2 to 25, F is an integer of 0 to 10. E is preferably an integer of 4 to 20, and F is preferably 0 or 1. The above structure does not specify the arrangement of the respective constitutional units, and they may be bonded as a block or randomly. The production of the surfactant with the type of a partially fluorinated oxetane ring-opened polymer is described in detail in U.S. Pat. No. 5,650,483, etc.

The surfactant insoluble or difficultly soluble in water and soluble in an alkaline developer has a function of reducing penetration and leaching of water by orientating at the resist surface after spin coating when a resist top coat is not used in the ArF immersion exposure. Thus, it is useful for lowering damage to the exposure apparatus by suppressing elution of the water-soluble component from the resist film. Further, it is also useful since after the exposure, it becomes soluble during alkaline development after post baking, whereby it hardly becomes foreign matters that causes defects. This surfactant has a property that it is insoluble or difficultly soluble in water and soluble in an alkaline developer, and is also called as a hydrophobic resin. Among these surfactant, those having a high water-repellency and capable of improving water-sliding property are particularly preferable. Such a polymer type surfactant can be shown below.

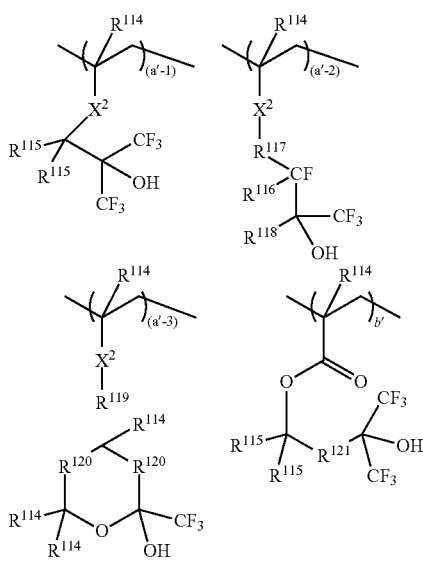

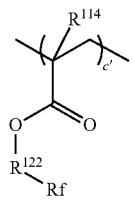

wherein each $R^{114}$ may be the same or different, and represents a hydrogen atom, a fluorine atom, a methyl group, or a trifluoromethyl group; each $R^{115}$ may be the same or different, and represents a hydrogen atom, or a linear, branched, or cyclic alkyl group or fluorinated alkyl group each having 1 to 20 carbon atoms, wherein each $R^{115}$ in the same monomer may be mutually bonded to form a ring with the carbon atoms to which they are bonded, and in such a case, $R^{115}$ represents a linear, branched, or cyclic alkylene group or a fluorinated alkylene group each having 2 to 20 carbon atoms in total; $R^{116}$ represents a fluorine atom or a hydrogen atom, or may be bonded with $R^{117}$ to form a non-aromatic ring having 3 to 10 carbon atoms in total together with the carbon atoms to which they are bonded; $R^{117}$ represents a linear, branched, or cyclic alkylene group having 1 to 6 carbon atoms, wherein one or more hydrogen atoms may be substituted with a fluorine atom; $R^{118}$ represents a linear or branched alkyl group having 1 to 10 carbon atoms, wherein one or more hydrogen atoms are substituted with a fluorine atom, and $R^{117}$ and $R^{118}$ may be mutually bonded to form a non-aromatic ring together with the carbon atoms to which they are bonded, and in such a case, the whole of $R^{117}$, $R^{118}$, and the carbon atoms to which they are bonded represents a trivalent organic group having 2 to 12 carbon atoms in total; $R^{119}$ represents a single bond or an alkylene group having 1 to 4 carbon atoms; each $R^{120}$ may be the same or different, and represent a single bond, —O—, or —$CR^{114}R^{114}$—; $R^{121}$ represents a linear or branched alkylene group having 1 to 4 carbon atoms, and may be bonded with $R^{115}$ in the same monomer to form a non-aromatic ring having 3 to 6 carbon atoms together with the carbon atoms to which they are bonded; $R^{122}$ represents a 1,2-ethylene group, a 1,3-propylene group, or a 1,4-butylene group; Rf represents a linear perfluoroalkyl group having 3 to 6 carbon atoms, a 3H-perfluoropropyl group, a 4H-perfluorobutyl group, a 5H-perfluoropentyl group, or a 6H-perfluorohexyl group; each $X^2$ may be the same or different, and represents —C(=O)—O—, —O—, or —C(=O)—$R^{123}$—C(=O)—O—; and $R^{123}$ represents a linear, branched, or cyclic alkylene group having 1 to 10 carbon atoms. Furthermore, $0 \leq (a'-1) < 1$, $0 \leq (a'-2) < 1$, $0 \leq (a'-3) < 1$, $0 < (a'-1)+(a'-2)+(a'-3) < 1$, $0 \leq b' < 1$, $0 \leq c' < 1$, and $0 < (a'-1)+(a'-2)+(a'-3)+b'+c' \leq 1$.

The above units are more specifically shown below.

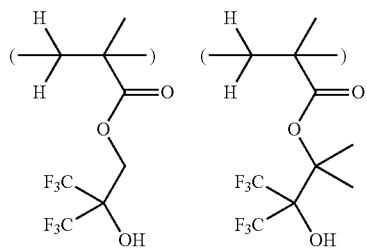

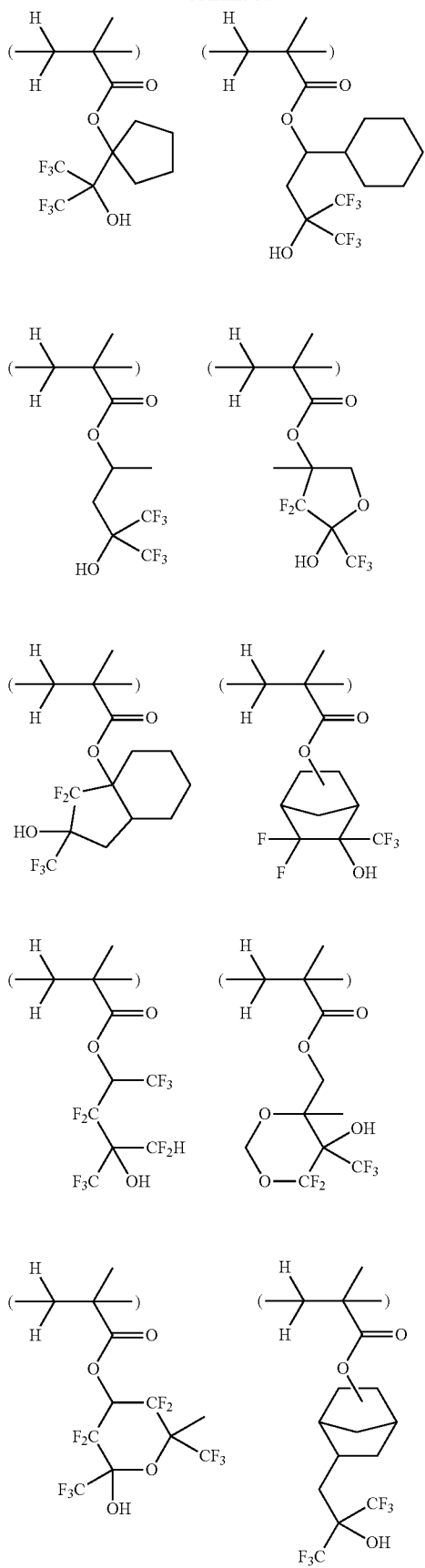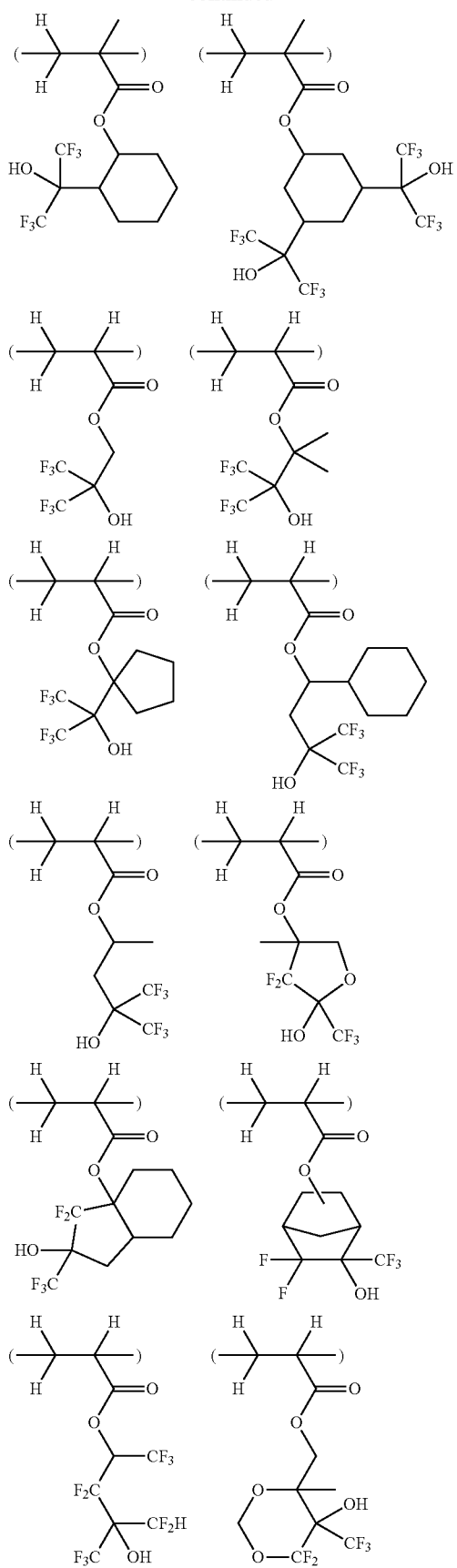

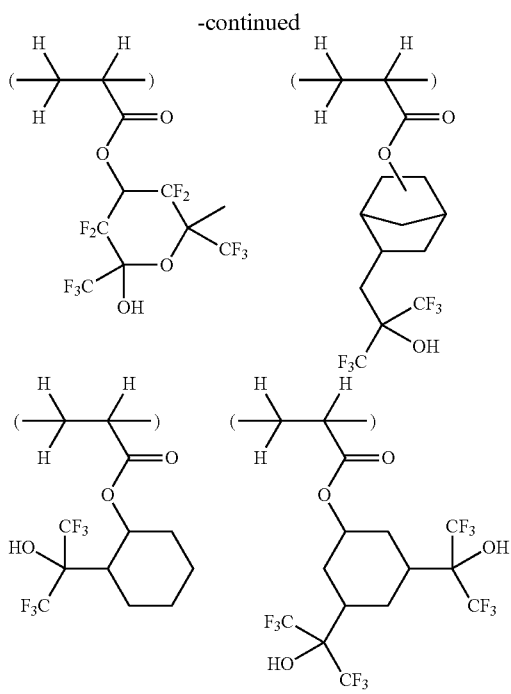

These surfactants insoluble or difficultly soluble in water and soluble in an alkaline developer may also be exemplified by referring to Japanese Patent Laid-Open Publication No. 2008-122932, No. 2010-134012, No. 2010-107695, No. 2009-276363, No. 2009-192784, No. 2009-191151, No. 2009-98638, No. 2010-250105, and No. 2011-42789.

The weight average molecular weight of the above-mentioned polymer type surfactant is preferably in the range of 1,000 to 50,000, more preferably 2,000 to 20,000. If it is out of the above range, the surface modification effect is not sufficient, or development failure occurs in some cases. Meanwhile, the weight average molecular weight is shown by the polystyrene converted value measured by gel permeation chromatography (GPC). The adding amount thereof is preferably in the range of 0.001 to 20 parts by mass, more preferably 0.01 to 10 parts by mass based on 100 parts by mass of the base resin of the resist composition. These are described in detail in Japanese Patent Laid-Open Publication No. 2010-215608.

(G) Organic Acid Derivative and/or Fluorine-Substituted Alcohol

To the chemically amplified resist composition of the present invention may be added a compound (an acid amplifier compound) that are decomposed by an acid to generate an acid. This compound can be exemplified by referring to Japanese Patent Laid-Open Publication No. 2009-269953 and No. 2010-215608.

The amount of the acid amplifier compound to be added to the chemically amplified resist composition of the present invention is preferably 2 parts by mass or less, more preferably 1 part by mass or less based on 100 parts by mass of the base resin in the chemically amplified resist composition. If the amount is 2 parts by mass or less, diffusion is readily controlled, and deterioration of the resolution and deterioration of the pattern shape can be prevented.

Further, addition of the organic acid derivative or a compound (a dissolution inhibitor) that changes solubility in an alkaline developer by the action of an acid and has a weight average molecular weight of 3,000 or less is optional, and these may be exemplified by referring to compounds disclosed in Japanese Patent Laid-Open Publication No. 2009-269953 and No. 2010-215608 like the above-mentioned respective components.

The chemically amplified resist composition as described above can give a pattern excellent in resolution and LER and having a rectangular profile, thereby being extremely useful for a precise and fine processing as a chemically amplified resist composition.

The present invention also provides a patterning process using the above-mentioned chemically amplified resist composition.

When a pattern is formed by using the chemically amplified resist composition of the present invention, a known lithography technique may be adopted. For example, the composition is applied onto a substrate to be processed such as a substrate for manufacturing an integrated circuit (e.g. Si, $SiO_2$, SiN, SiON, TiN, WSi, BPSG, SOG, and an organic antireflection film), or a substrate for manufacturing a mask circuit (e.g. Cr, CrO, CrON, and MoSi) by a procedure such as spin coating so as to give a film thickness of 0.05 to 2.0 μm, and then prebaked on a hot plate preferably at 60 to 150° C. for 1 to 10 minutes, more preferably at 80 to 140° C. for 1 to 5 minutes.

A mask for forming a desired pattern is then placed over the resist film, and the resist film is exposed through the mask to a high energy beam such as a KrF excimer laser, an ArF excimer laser, an electron beam, or a soft X-ray having a wavelength range of 3 to 15 nm such as EUV so that the exposure dose is 1 to 200 $mJ/cm^2$, preferably 10 to 100 $mJ/cm^2$. In the exposure, the general exposure method can be used. In some cases, the immersion method in which immersion is conducted by placing a liquid having a refractive index of 1.0 or more (e.g. water, ethylene glycol, and glycerin) between a resist coat film and a projection lens can be used. In this case, a top coat insoluble in water may be used.

Subsequently, post-exposure bake (PEB) is carried out on a hot plate preferably at 60 to 150° C. for 1 to 5 minutes, more preferably at 80 to 140° C. for 1 to 3 minutes. Thereafter, development is carried out by using a developer composed of an aqueous alkali solution such as a tetramethylammonium hydroxide (TMAH) solution with a concentration of 0.1 to 5% by mass, preferably 2 to 3% by mass, in a conventional manner such as dip, puddle, or spray method for 0.1 to 3 minutes, preferably 0.5 to 2 minutes to form the desired pattern on the substrate.

The top coat insoluble in water serves to prevent a substance eluted from the resist film and increase water-sliding property of the film surface. The top coat is largely classified into two kinds. One is an organic solvent-removing top coat, which needs to be removed before alkaline development by an organic solvent that does not dissolve the resist film. The other is an alkali-soluble top coat, which is soluble in an alkaline developer and is removed together with the soluble part of the resist film.

For the latter top coat, a material which comprises a polymer compound having a 1,1,1,3,3,3-hexafluoro-2-propanol residue, which is insoluble in water and soluble in an alkaline developer, as a base, which is dissolved in an alcohol solvent having 4 or more carbon atoms, an ether solvent having 8 to 12 carbon atoms, or a mixed solvent thereof is preferable.

The above-mentioned surfactant insoluble in water and soluble in an alkaline developer may be dissolved in an alcohol solvent having 4 or more carbon atoms, an ether solvent having 8 to 12 carbon atoms, or a mixed solvent thereof to prepare a material.

As a means of the patterning process of the present invention, after a photoresist film is formed, acid generators may be extracted from the surface of the film, or particles may be washed off, by rinsing with pure water (post-soak). Alternatively, after exposure, water remains on the film may be removed by rinsing (post-soak).

Furthermore, as the life-prolonging technology to the 32 nm ArF lithography, a double patterning method may be mentioned. As to the double patterning method, a trench method including processing an underlay to a 1:3 trench pattern by a first exposure and etching, shifting the position, and forming a 1:3 trench pattern by a second exposure, thereby forming a 1:1 pattern, and a line method including processing a first underlay by a first exposure and etching to a 1:3 isolated pattern to be left, shifting the position, and processing a second underlay formed under the first underlay by a second exposure to a 1:3 isolated pattern to be left, thereby forming a half-pitch 1:1 pattern may be mentioned.

As mentioned above, the developer to be used in the patterning process of the present invention may be an aqueous alkaline solution such as a tetramethylammonium hydroxide (TMAH) solution with a concentration of 0.1 to 5% by mass, preferably 2 to 3% by mass. Alternatively, a means of the negative tone development, which develops/dissolves the unexposed part by using an organic solvent, may be used.

For the organic solvent development, one or more developer selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate may be used.

When such a patterning process is used, acid diffusion and a profile is highly controlled, and thus a pattern excellent in resolution and LER and having a rectangular profile can be formed.

In addition, a pattern also can be formed by the patterning process including the steps of applying the chemically amplified resist composition of the present invention onto a substrate having a layer containing chromium at an outermost layer, imagewise writing with an electron beam after heat treatment, and performing development by using a developer.

Further, a pattern also can be formed by the patterning process including the steps of applying the chemically amplified resist composition of the present invention onto a photomask blank formed with a chromium compound film, imagewise writing with an electron beam after heat treatment, and performing development by using a developer.

EXAMPLES

In the following, the present invention is explained in more detail by referring to Synthesis Examples, Examples, and Comparative Examples, but the present invention is not limited to the following Examples.

Synthesis Example 1

Synthesis of Photo Acid Generator

The photo acid generators of the present invention were synthesized according to the following procedure.

Synthesis Example 1-1-1

Synthesis of PAG Intermediate 1

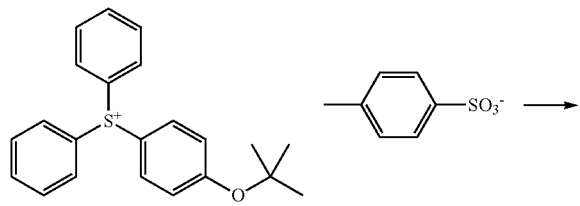

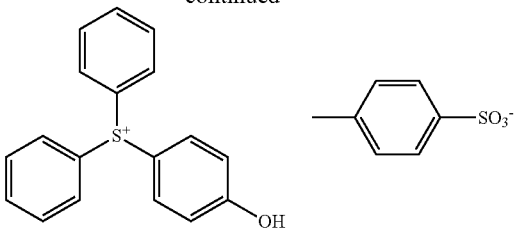

A mixed solution comprising 25 g of (4-tert-butyloxyphenyl)-diphenylsulfonium=p-toluenesulfonate, 0.5 g of p-toluenesulfonic acid monohydrate, and 75 g of methanol was stirred at 80° C. for 5 hours. The reaction mixture was cooled to room temperature, and then concentrated under reduced pressure. Thereto, 100 g of methylene chloride and 50 g of pure water were added to isolate the organic layer. The isolated organic layer was washed with water, and concentrated under reduced pressure. To the residue was added 100 g of methyl isobutyl ketone, followed by concentration under reduced pressure again to obtain 24 g of a target compound, (4-hydroxyphenyl)-diphenylsulfonium=p-toluenesulfonate (PAG intermediate 1), as an oily product (yield: 96%).

Synthesis Example 1-1-2

Synthesis of PAG 1

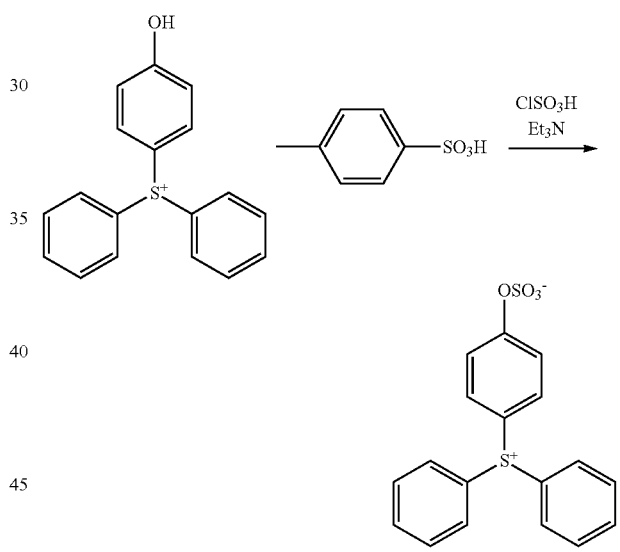

To a mixed solution comprising 4.5 g of PAG intermediate 1 synthesized in Synthesis Example 1-1-1, 2.5 g of triethylamine, and 15 g of methylene chloride was added dropwise 1.3 g of chlorosulfuric acid under ice-cooling, and the mixture was aged for 6 hours. Thereafter, 20 g of pure water was added thereto, and the organic layer was isolated, and washed with water. Subsequently, the organic layer after washing was concentrated under reduced pressure, and methyl isobutyl ketone was added to deposit a crystal. The crystal was collected by filtration, washed with diisopropyl ether, and then dried under reduced pressure to obtain 2.6 g of a target compound, PAG-1 (yield: 73%).

The spectral data of the obtained target compound is shown below. FIG. 1 shows the results of nuclear magnetic resonance spectrum ($^1$H-NMR/DMSO-$d_6$). In $^1$H-NMR, a minute amount of water was observed.

Infrared absorption spectrum (D-ATR; cm$^{-1}$)
1587, 1489, 1478, 1450, 1445, 1309, 1268, 1241, 1174, 1045, 1031, 997, 859, 834, 761, 747, 728, 685, 620, 602 cm$^{-1}$
LC-MS
POSITIVE [M+H]$^+$359

Synthesis Example 1-2-1

Synthesis of PAG Intermediate 2

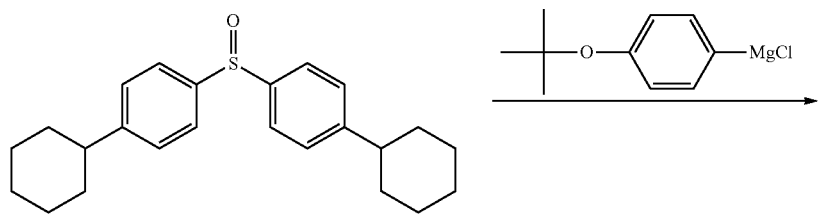

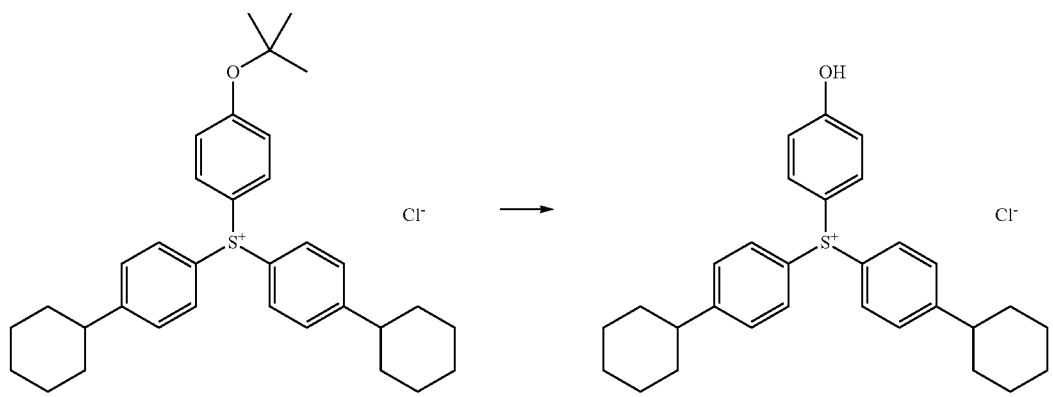

To a mixed solution comprising a tetrahydrofuran solution containing a Grignard reagent (equivalent to 30 mmol) prepared from 4-tert-butyloxychlorobenzene, 3.7 g of bis(4-cyclohexyl)phenylsulfoxide, and 15 g of methylene chloride was added dropwise 3.3 g of chlorotrimethylsilane under ice-cooling, and the mixture was aged for 30 minutes. Then, a saturated ammonium chloride aqueous solution was added dropwise under ice-cooling to quench the reaction. Thereafter, the organic layer was isolated, washed with water, and then concentrated under reduced pressure. The residue of the concentrate was washed with diisopropyl ether, and concentrated under reduced pressure again to obtain (4-tert-butyloxyphenyl)-di-(4-cyclohexylphenyl)sulfonium chloride.

Subsequently, to the obtained (4-tert-butyloxyphenyl)-di-(4-cyclohexylphenyl)sulfonium chloride were added 0.1 g of 35% dilute hydrochloric acid and 20 g of methanol, and the mixture was stirred at 60° C. overnight. Thereafter, 0.3 g of 25% caustic soda, and then 30 g of methylene chloride were added thereto, and the mixture was washed with water, and concentrated under reduced pressure. To the residue of the concentrate was added methyl isobutyl ketone, followed by concentration under reduced pressure. To the obtained residue was added diisopropyl ether to deposit a crystal. The crystal was collected by filtration, and then dried under reduced pressure to obtain 3.9 g of a target compound, 4-hydroxyphenyl-di-(4-cyclohexylphenyl)sulfonium chloride (PAG intermediate 2), as a white crystal (yield: 81%).

Synthesis Example 1-2-2

Synthesis of PAG 2

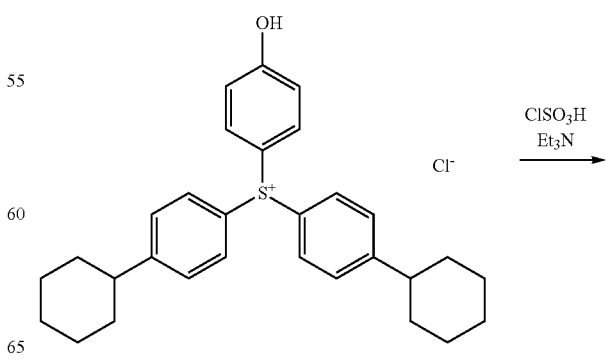

PAG-2

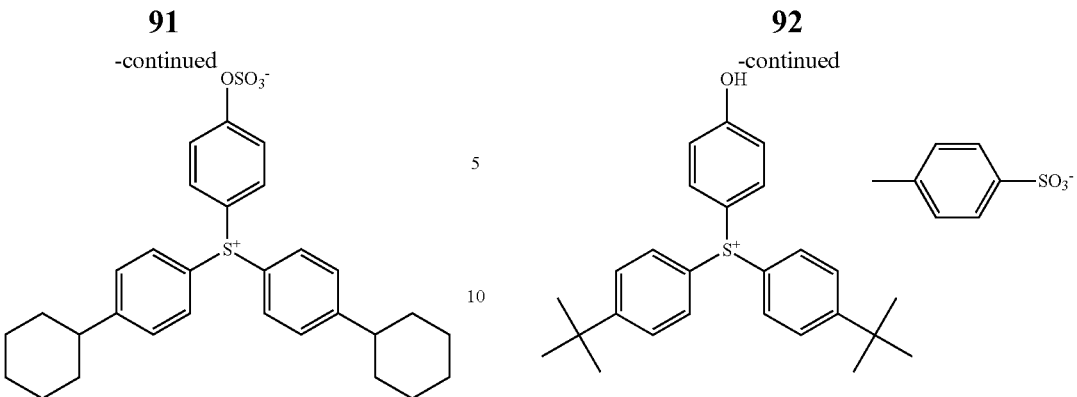

To a mixed solution comprising 3.9 g of PAG intermediate 2 synthesized in Synthesis Example 1-2-1, 2.5 g of triethylamine, and 40 g of methylene chloride was added dropwise 1.3 g of chlorosulfuric acid under ice-cooling, and the mixture was aged for 6 hours. Thereafter, 20 g of pure water was added thereto, and the organic layer was isolated, and washed with water. Subsequently, the organic layer after washing was concentrated under reduced pressure, and methyl isobutyl ketone was added, followed by concentration under reduced pressure again. To the residue was added diisopropyl ether to deposit a crystal. The crystal was collected by filtration, washed with diisopropyl ether, and then dried under reduced pressure to obtain 3.1 g of a target compound, PAG-2 (yield: 59%).

Figure 2:
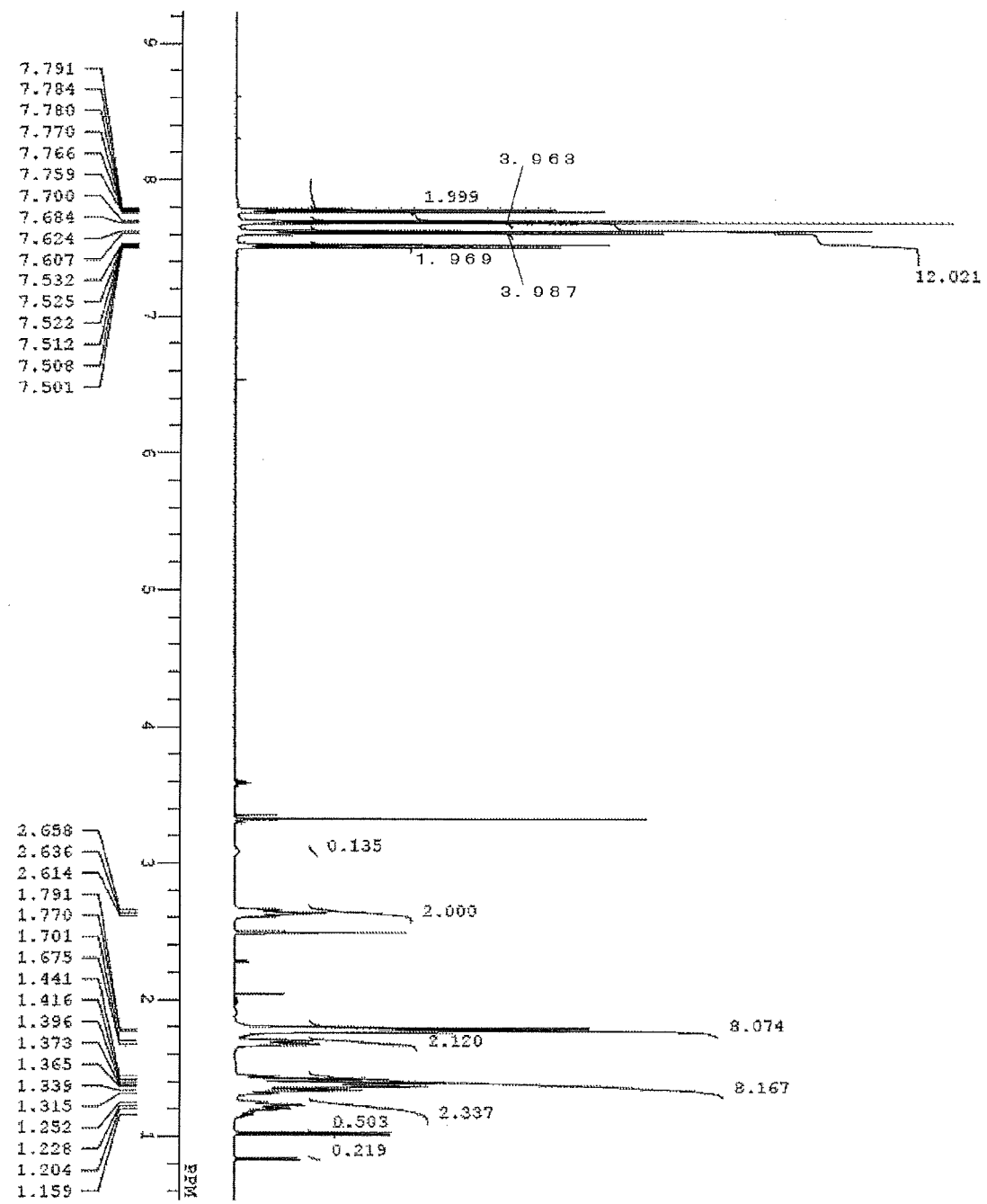
FIG. 2 shows ¹H-NMR/DMSO-d₆ of PAG-2 in Synthesis Example 1-2-2.

The spectral data of the obtained target compound is shown below. FIG. 2 shows the results of nuclear magnetic resonance spectrum ($^1$H-NMR/DMSO-$d_6$). In $^1$H-NMR, a minute amount of residual solvents (methyl isobutyl ketone, diisopropyl ether, water) was observed.

Infrared absorption spectrum (D-ATR; cm$^{-1}$)

2922, 2850, 1584, 1488, 1264, 1045, 857, 839, 730, 621, 603, 551 cm$^{-1}$

LC-MS

POSITIVE [M+H]$^+$ 523

Synthesis Example 1-3-1

Synthesis of PAG Intermediate 3

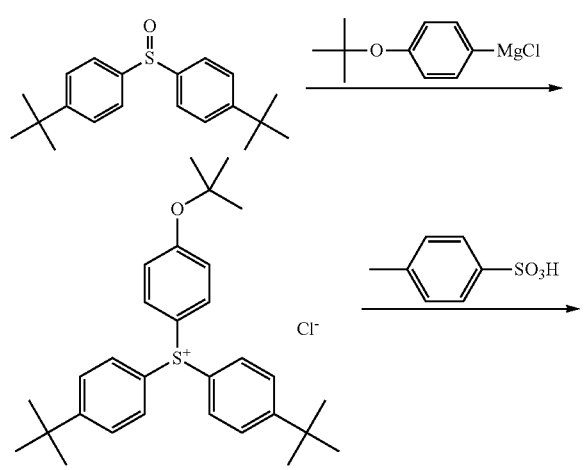

To a mixed solution comprising a tetrahydrofuran solution containing a Grignard reagent (equivalent to 90 mmol) prepared from 4-tert-butyloxychlorobenzene, 9.4 g of bis(4-tert-butylphenyl)sulfoxide, and 50 g of methylene chloride was added dropwise 9.8 g of chlorotrimethylsilane under ice-cooling, and the mixture was aged for 30 minutes. Then, an ammonium chloride aqueous solution was added dropwise under ice-cooling to quench the reaction. Thereafter, 60 g of methylene chloride was added, and the organic layer was isolated, and washed with water to prepare (4-tert-butyloxyphenyl)-di-(4-tert-butylphenyl)sulfonium chloride. Subsequently, 8.6 g of tosyl acid monohydrate was added thereto, and the mixture was stirred at 40° C. overnight. Then, the reaction mixture was washed with water, and methyl isobutyl ketone was added, followed by concentration under reduced pressure again. The residue of the concentrate was washed with diisopropyl ether to obtain a target compound, 4-hydroxyphenyl-di-(4-tert-butylphenyl)sulfonium tosylate (PAG intermediate 3), as an oily product. The obtained PAG intermediate 3 was dissolved in methylene chloride, and used in the next reaction as a solution.

Synthesis Example 1-3-2

Synthesis of PAG 3

PAG-3

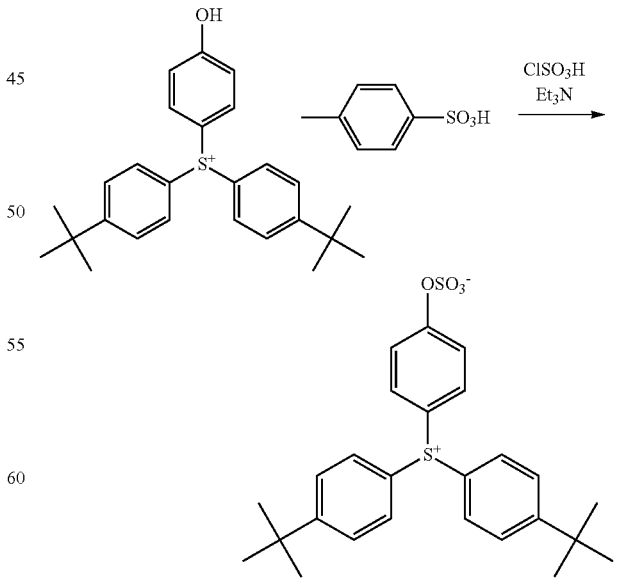

To a mixed solution comprising a methylene chloride solution containing PAG intermediate 3 synthesized in Synthesis Example 1-3-1 (equivalent to 10 mmol), 2.5 g of triethylamine, and 20 g of methylene chloride was added dropwise a mixed solution comprising 1.3 g of chlorosulfuric acid and 10 g of methylene chloride under ice-cooling, and the mixture was aged for 12 hours. Thereafter, 60 g of diisopropyl ether was added to deposit a crystal. The crystal was washed with a mixed solution comprising 30 g of methanol and 60 g of water, further washed with water, and then dried at 60° C. under reduced pressure to obtain 3.9 g of a target compound, PAG-3 (yield: 83%).

Figure 3:
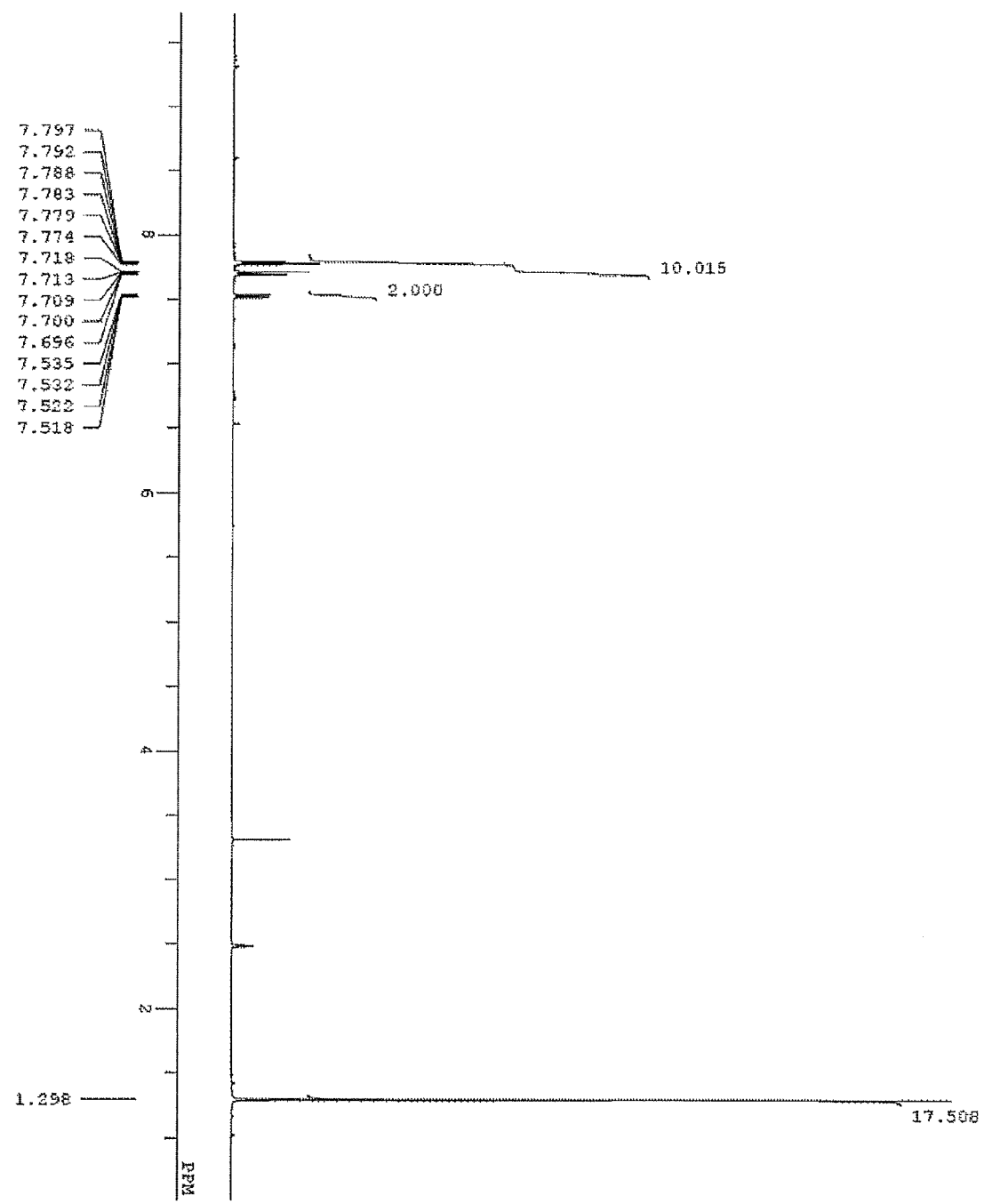
FIG. 3 shows ¹H-NMR/DMSO-d₆ of PAG-3 in Synthesis Example 1-3-2.

The spectral data of the obtained target compound is shown below. FIG. 3 shows the results of nuclear magnetic resonance spectrum ($^1$H-NMR/DMSO-$d_6$). In $^1$H-NMR, a minute amount of water was observed.

Infrared absorption spectrum (D-ATR; cm$^{-1}$)
2963, 1586, 1490, 1286, 1253, 1042, 852, 843, 831, 717, 620, 602, 558 cm$^{-1}$
LC-MS
POSITIVE [M+H]$^+$471

Synthesis Example 2

Synthesis of Polymer Compound

The polymer compounds used as the base resin in the chemically amplified resist composition of the present invention were synthesized according to the following procedure.

Synthesis Example 2-1

Synthesis of Polymer Compound (P-1)

Under nitrogen atmosphere, 22 g of methacrylate=1-tert-butylcyclopentyl, 17 g of methacrylate=2-oxotetrahydrofuran-3-yl, 0.48 g of V-601 (available from Wako Pure Chemical Industries, Ltd.), 0.41 g of 2-mercaptoethanol, and 50 g of methyl ethyl ketone were charged to prepare a monomers-polymerization initiator solution. In another flask under nitrogen atmosphere was charged 23 g of methyl ethyl ketone, the solvent was heated to 80° C. under stirring, and then, the above-mentioned monomers-polymerization initiator solution was added dropwise thereto over 4 hours. After completion of the dropwise addition, stirring was continued for 2 hours while maintaining the temperature of the polymer solution at 80° C., and then, the mixture was cooled to room temperature. The obtained polymer solution was added dropwise to 640 g of methanol under vigorous stirring, and the deposited copolymer was collected by filtration. The copolymer was washed twice with 240 g of methanol, dried under vacuum at 50° C. for 20 hours to obtain 36 g of white powder copolymer (Polymer compound (P-1)) (yield: 90%). When it was analyzed by GPC, the weight average molecular weight (Mw) in terms of polystyrene was 8,755, and the dispersity was 1.94.

Synthesis Examples 2-2 to 2-12

Synthesis of Polymer Compounds (P-2 to P-12)

Polymer compounds (P-2 to P-12) were synthesized according to the same procedure as in Synthesis Example 2-1 except for changing kinds of respective monomers and blending ratio as shown in Table 1.

Synthesis Example 2-13

Synthesis of Polymer Compound (P-13)

To a 3 L flask were added 407.5 g of acetoxystyrene, 42.5 g of acenaphthylene, and as a solvent, 1,275 g of toluene. The reaction vessel was cooled to −70° C. under nitrogen atmosphere, and degassing under reduced pressure and nitrogen flow were repeated three times. After the temperature was raised to room temperature, 34.7 g of 2,2'-azobis(2,4-dimethylvaleronitrile) (V-65 available from Wako Pure Chemical Industries, Ltd.) was added to the mixture as a polymerization initiator, and after the temperature was further raised to 55° C., the reaction was performed over 40 hours. To the reaction mixture was added dropwise a mixed solution comprising 970 g of methanol and 180 g of water under stirring, and 30 minutes later, the lower layer (polymer layer) was concentrated under reduced pressure. The polymer layer was dissolved again in 0.45 L of methanol and 0.54 L of tetrahydrofuran, and 160 g of triethylamine and 30 g of water were added. The mixture was then heated at 60° C., to perform the deprotection reaction for 40 hours. The resulting deprotection reaction solution was concentrated under reduced pressure, and 548 g of methanol and 112 g of acetone were added to the concentrated solution to make a solution. 990 g of hexane was added dropwise thereto under stirring, and 30 minutes later, 300 g of tetrahydrofuran was added to the lower layer (polymer layer). Then, 1,030 g of hexane was added dropwise thereto under stirring, and 30 minutes later, the lower layer (polymer layer) was concentrated under reduced pressure. The obtained polymer solution was neutralized with 82 g of acetic acid, and the reaction solution was concentrated, dissolved in 0.3 L of acetone, precipitated in 10 L of water, filtered, and dried to obtain 280 g of a white polymer. When the obtained polymer was analyzed by $^1$H-NMR and GPC, the following results could be obtained. Copolymerization composition ratio
hydroxystyrene:acenaphthylene=89.3:10.7
Weight average molecular weight (Mw)=5000
Molecular weight distribution (Mw/Mn)=1.63
100 g of the obtained polymer was reacted with 50 g of (2-methyl-1-propenyl)methyl ether under acidic condition, and subjected to steps of neutralization, separation, and crystallization to obtain Polymer compound (P-13). The yield was 125 g.

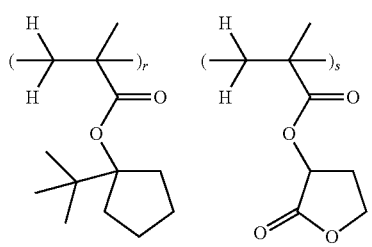

(P-1)

(r = 0.50, s = 0.50)

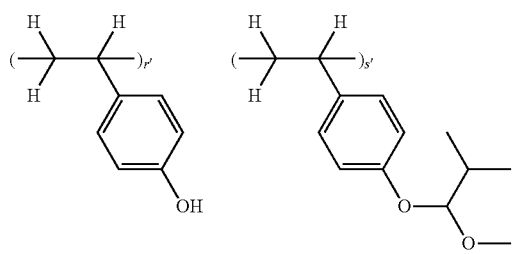

(P-13)

-continued

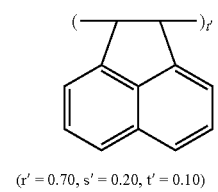

(r' = 0.70, s' = 0.20, t' = 0.10)

Synthesis Examples 2-14 to 2-20

Synthesis of Polymer Compounds (P-14 to P-20)

Polymer compounds (P-14 to P-20) were synthesized according to the same procedure as in Synthesis Example 2-13 except for changing kinds of respective monomers and blending ratio as shown in Table 1.

The composition of the produced Polymer compounds (P-1 to P-20) are shown in Table 1. Meanwhile, in Table 1, the introducing ratio means a molar ratio. Also, the structures of the respective units in Table 1 are shown in Tables 2 and 3.

TABLE 1

| Polymer compound | Unit 1 (introducing ratio) | | Unit 2 (introducing ratio) | | Unit 3 (introducing ratio) | | Unit 4 (introducing ratio) | |
|---|---|---|---|---|---|---|---|---|
| P-1 | A-1 | (0.50) | B-1 | (0.50) | — | | — | |
| P-2 | A-1 | (0.40) | B-1 | (0.50) | B-3 | (0.10) | — | |
| P-3 | A-1 | (0.50) | B-2 | (0.20) | B-3 | (0.20) | B-5 | (0.10) |
| P-4 | A-2 | (0.40) | B-1 | (0.60) | — | | — | |
| P-5 | A-2 | (0.40) | B-2 | (0.60) | — | | — | |
| P-6 | A-2 | (0.20) | A-3 | (0.30) | B-1 | (0.40) | B-5 | (0.10) |
| P-7 | A-2 | (0.20) | A-3 | (0.30) | B-2 | (0.40) | B-5 | (0.10) |
| P-8 | A-1 | (0.25) | A-2 | (0.25) | B-3 | (0.40) | B-5 | (0.10) |
| P-9 | A-1 | (0.20) | A-2 | (0.25) | B-1 | (0.35) | B-3 | (0.20) |
| P-10 | A-3 | (0.25) | A-5 | (0.25) | B-1 | (0.35) | B-5 | (0.15) |
| P-11 | A-4 | (0.50) | B-4 | (0.50) | — | | — | |
| P-12 | A-6 | (0.35) | B-3 | (0.65) | — | | — | |
| P-13 | A-7 | (0.20) | B-6 | (0.70) | B-7 | (0.10) | — | |
| P-14 | A-7 | (0.22) | B-6 | (0.68) | B-8 | (0.10) | — | |
| P-15 | A-8 | (0.12) | B-6 | (0.78) | B-7 | (0.10) | — | |
| P-16 | A-8 | (0.14) | B-6 | (0.76) | B-8 | (0.10) | — | |
| P-17 | A-9 | (0.11) | B-6 | (0.79) | B-7 | (0.10) | — | |
| P-18 | A-9 | (0.13) | B-6 | (0.77) | B-8 | (0.10) | — | |
| P-19 | A-10 | (0.20) | B-6 | (0.70) | B-7 | (0.10) | — | |
| P-20 | A-10 | (0.23) | B-6 | (0.67) | B-8 | (0.10) | — | |

TABLE 2

A-1

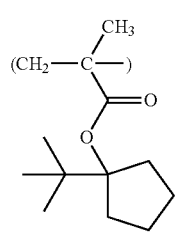

TABLE 2-continued

A-2

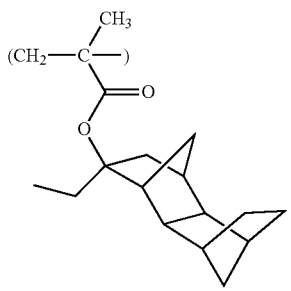

A-3

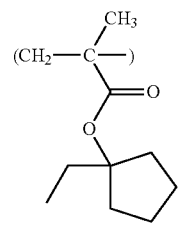

A-4

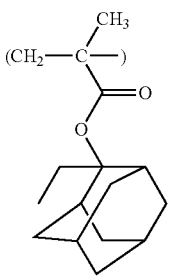

A-5

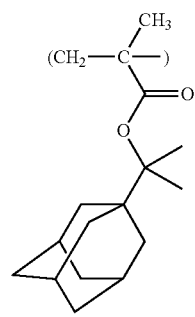

A-6

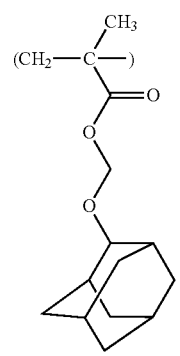

TABLE 2-continued
A-7
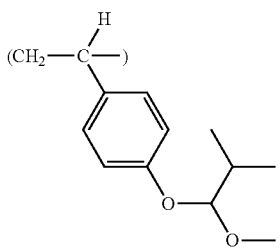
A-8
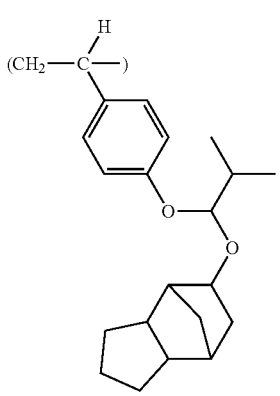
A-9
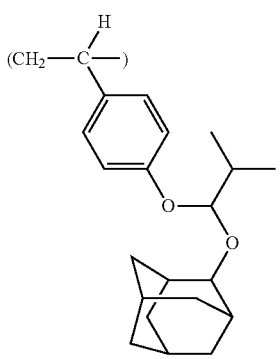
A-10
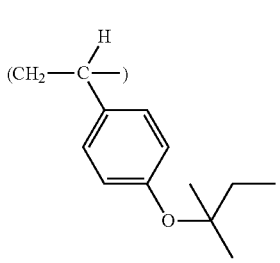
TABLE 3
B-1
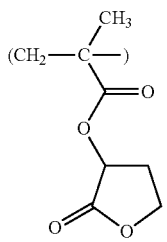
B-2
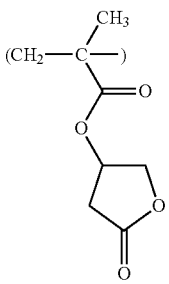
B-3
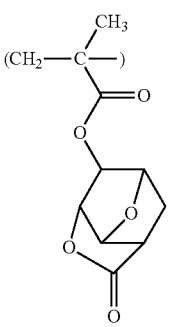
B-4
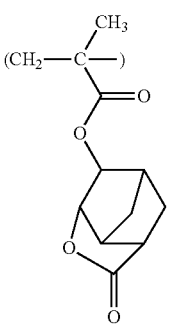
B-5
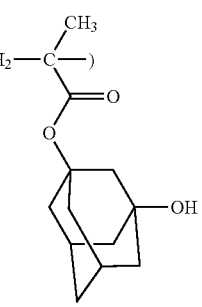

TABLE 3-continued

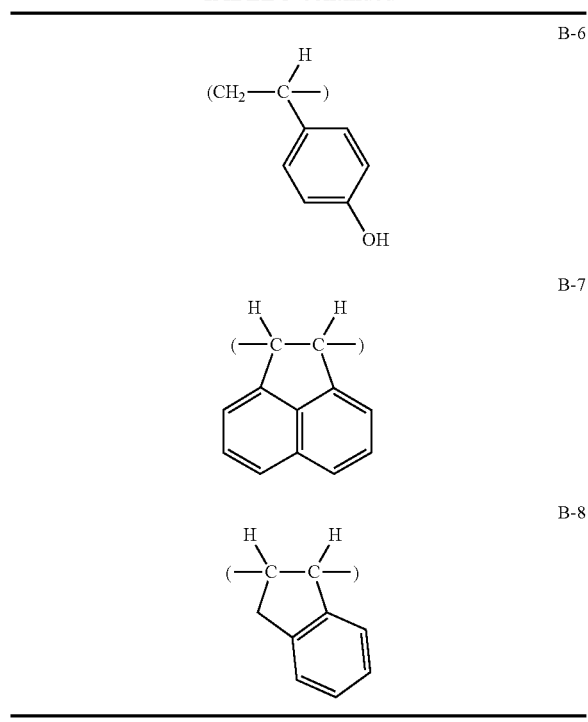

EXAMPLES 1-1 to 1-22

Comparative Examples 1-1 to 1-4

Preparation of Resist Solution

The photo acid generators and the polymer compound shown in Synthesis Examples, Photo acid generators (PAG-X to PAG-Z) other than the photo acid generators shown in Synthesis Examples, Quenchers (Q-1 and Q-2), and as needed, Alkali-soluble surfactant (F-1) were dissolved in a solvent containing 0.01% by mass of Surfactant (F-2) (available from Omnova Solutions, Inc.) to prepare resist compositions. Further, each of the resist compositions was filtered through a 0.2 μm filter made of Teflon (Registered Trademark) to prepare respective resist solutions. Each composition of Resist solutions (R-01 to R-26) thus prepared are shown in Table 4.

Details of PAG-X to PAG-Z, Quenchers Q-1 and Q-2, solvents, Alkali-soluble surfactant (F-1), and Surfactant (F-2) in Table 4 are shown below.

(Photo Acid Generator)

PAG-X: triphenylsulfonium=2-(adamantane-1-carbonyloxy)-1,1,3,3,3-pentafluoropropane-1-sulfonate (a compound described in Japanese Patent Laid-Open Publication No. 2007-145797, whose structural formula is shown below.)

PAG-Y: triphenylsulfonium=2,4,6-triisopropylbenzene-sulfonate (the structural formula is shown below.)

PAG-Z: triphenylsulfonium=4-oxo-1-adamantylsulfate (a compound described in Japanese Patent Laid-Open Publication No. 2012-150449, whose structural formula is shown below.)

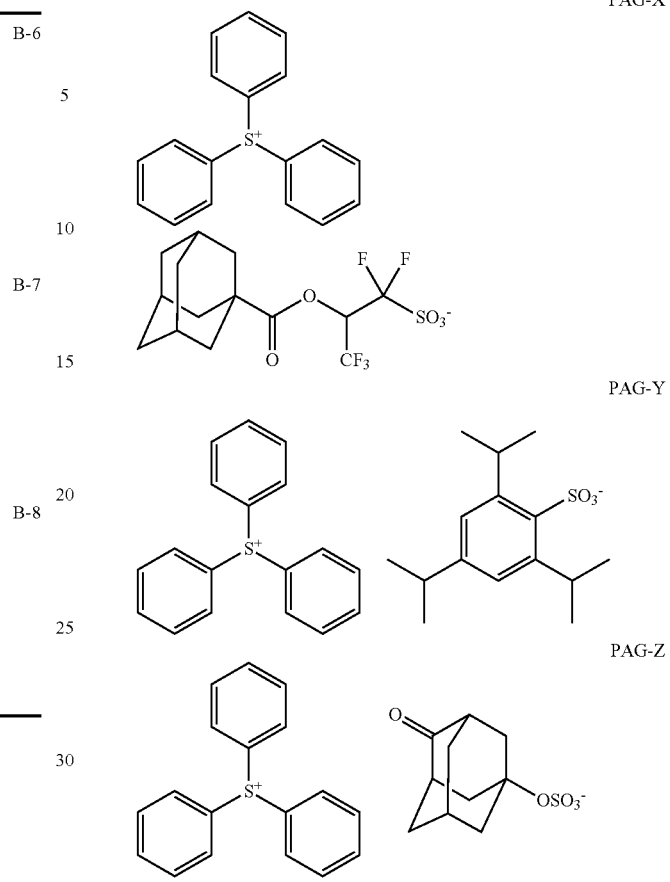

(Quencher)
Q-1: 2-(4-morpholinyl)ethyl octadecanoate
Q-2: tris(2-(methoxymethoxy)ethyl)amine
(Solvent)
PGMEA: propylene glycol monomethyl ether acetate
GBL: γ-butyrolactone
EL: ethyl lactate
PGME: propylene glycol monomethyl ether
(Surfactant)
Alkali-soluble surfactant (F-1): a compound shown by the following formula
Poly(methacrylate=2,2,3,3,4,4,4-heptafluoro-1-isobutyl-1-butyl.methacrylate=9-(2,2,2-trifluoro-1-trifluoromethyl-ethyloxycarbonyl)-4-oxatricyclo[4.2.1.0$^{3,7}$]nonane-5-one-2-yl)
Molecular weight (Mw)=7,700
Dispersity (Mw/Mn)=1.82

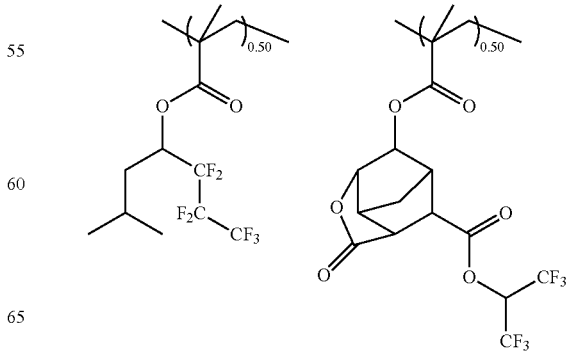

Surfactant (F-2):

3-methyl-3-(2,2,2-trifluoroethoxymethyl)oxetane. tetrahydrofuran (THF).2,2-dimethyl-1,3-propanediol copolymer (available from Omnova Solutions, Inc.) (shown by the following formula)

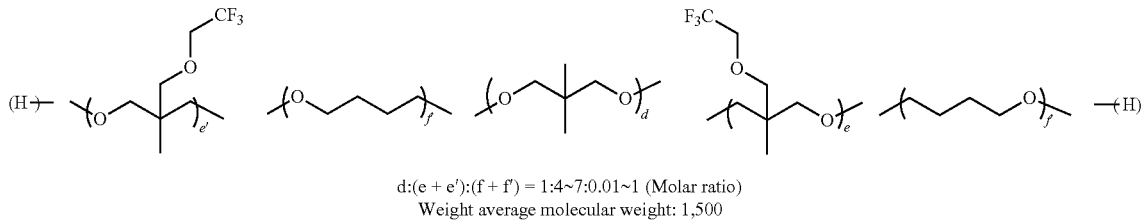

d:(e + e'):(f + f') = 1:4~7:0.01~1 (Molar ratio)
Weight average molecular weight: 1,500

TABLE 4

| | Resist | Base resin (parts by mass) | | Photo acid generator (parts by mass) | | Quencher (parts by mass) | | Surfactant (parts by mass) | | Solvent 1 (parts by mass) | | Solvent 2 (parts by mass) | | Solvent 3 (parts by mass) | |
|---|---|---|---|---|---|---|---|---|---|---|---|---|---|---|---|
| Example 1-1 | R-01 | P-1 | (80) | PAG-1 | (6.9) | Q-1 | (1.7) | F-1 | (3.0) | PGMEA | (1728) | GBL | (192) | — | — |
| Example 1-2 | R-02 | P-1 | (80) | PAG-2 | (9.1) | Q-1 | (1.7) | F-1 | (3.0) | PGMEA | (1728) | GBL | (192) | — | — |
| Example 1-3 | R-03 | P-1 | (80) | PAG-3 | (10.1) | Q-1 | (1.7) | F-1 | (3.0) | PGMEA | (1728) | GBL | (192) | — | — |
| Example 1-4 | R-04 | P-2 | (80) | PAG-3 | (10.1) | Q-1 | (1.7) | F-1 | (3.0) | PGMEA | (1728) | GBL | (192) | — | — |
| Example 1-5 | R-05 | P-3 | (80) | PAG-3 | (10.1) | Q-1 | (1.7) | F-1 | (3.0) | PGMEA | (1728) | GBL | (192) | — | — |
| Example 1-6 | R-06 | P-4 | (80) | PAG-3 | (10.1) | Q-1 | (1.7) | F-1 | (3.0) | PGMEA | (1728) | GBL | (192) | — | — |
| Example 1-7 | R-07 | P-5 | (80) | PAG-3 | (10.1) | Q-1 | (1.7) | F-1 | (3.0) | PGMEA | (1728) | GBL | (192) | — | — |
| Example 1-8 | R-08 | P-6 | (80) | PAG-3 PAG-X | (5.1) (3.8) | Q-1 | (1.7) | F-1 | (3.0) | PGMEA | (1728) | GBL | (192) | — | — |
| Example 1-9 | R-09 | P-7 | (80) | PAG-3 PAG-X | (5.1) (3.8) | Q-1 | (1.7) | F-1 | (3.0) | PGMEA | (1728) | GBL | (192) | — | — |
| Example 1-10 | R-10 | P-8 | (80) | PAG-3 | (10.1) | Q-1 | (1.7) | F-1 | (3.0) | PGMEA | (1728) | GBL | (192) | — | — |
| Example 1-11 | R-11 | P-9 | (80) | PAG-3 | (10.1) | Q-1 | (1.7) | F-1 | (3.0) | PGMEA | (1728) | GBL | (192) | — | — |
| Example 1-12 | R-12 | P-10 | (80) | PAG-3 PAG-X | (5.1) (3.8) | Q-1 | (1.7) | F-1 | (3.0) | PGMEA | (1728) | GBL | (192) | — | — |
| Example 1-13 | R-13 | P-11 | (80) | PAG-3 PAG-X | (5.1) (3.8) | Q-1 | (1.7) | F-1 | (3.0) | PGMEA | (1728) | GBL | (192) | — | — |
| Example 1-14 | R-14 | P-12 | (80) | PAG-3 | (10.1) | Q-1 | (1.7) | F-1 | (3.0) | PGMEA | (1728) | GBL | (192) | — | — |
| Example 1-15 | R-15 | P-13 | (80) | PAG-3 | (7.1) | Q-2 | (1.1) | — | — | PGMEA | (1000) | EL | (1000) | PGME | (1300) |
| Example 1-16 | R-16 | P-14 | (80) | PAG-3 | (7.1) | Q-2 | (1.1) | — | — | PGMEA | (1000) | EL | (1000) | PGME | (1300) |
| Example 1-17 | R-17 | P-15 | (80) | PAG-3 | (7.1) | Q-2 | (1.1) | — | — | PGMEA | (1000) | EL | (1000) | PGME | (1300) |
| Example 1-18 | R-18 | P-16 | (80) | PAG-3 | (7.1) | Q-2 | (1.1) | — | — | PGMEA | (1000) | EL | (1000) | PGME | (1300) |
| Example 1-19 | R-19 | P-17 | (80) | PAG-3 | (7.1) | Q-2 | (1.1) | — | — | PGMEA | (1000) | EL | (1000) | PGME | (1300) |
| Example 1-20 | R-20 | P-18 | (80) | PAG-3 | (7.1) | Q-2 | (1.1) | — | — | PGMEA | (1000) | EL | (1000) | PGME | (1300) |
| Example 1-21 | R-21 | P-19 | (80) | PAG-3 | (7.1) | Q-2 | (1.1) | — | — | PGMEA | (1000) | EL | (1000) | PGME | (1300) |
| Example 1-22 | R-22 | P-20 | (80) | PAG-3 | (7.1) | Q-2 | (1.1) | — | — | PGMEA | (1000) | EL | (1000) | PGME | (1300) |
| Comparative Example 1-1 | R-23 | P-1 | (80) | PAG-X | (7.6) | Q-1 | (1.7) | F-1 | (3.0) | PGMEA | (1728) | GBL | (192) | — | — |
| Comparative Example 1-2 | R-24 | P-1 | (80) | PAG-Z | (9.6) | Q-1 | (1.7) | F-1 | (3.0) | PGMEA | (1728) | GBL | (192) | — | — |
| Comparative Example 1-3 | R-25 | P-13 | (80) | PAG-Y | (8.5) | Q-2 | (1.1) | — | — | PGMEA | (1000) | EL | (1000) | PGME | (1300) |
| Comparative Example 1-4 | R-26 | P-13 | (80) | PAG-Z | (9.6) | Q-2 | (1.1) | — | — | PGMEA | (1000) | EL | (1000) | PGME | (1300) |

Examples 2-1 to 2-14

Comparative Examples 2-1 and 2-2

ArF Exposure Evaluation 1

(Evaluation Method)

On a silicon substrate (wafer), an antireflection film solution (ARC-29A, available from Nissan Chemical Industries, Ltd.) is applied, and baked at 200° C. for 60 seconds. On the antireflection film substrate (having a film thickness of 100 nm) thus prepared, each of Resist compositions R-01 to R-14, R-23, and R-24 shown in Table 4 was spin coated, and baked by using a hot plate at 100° C. for 60 seconds to prepare a resist film having a thickness of 80 nm. This was subjected to immersion exposure with water by using an ArF excimer laser scanner (NSR-S610C manufactured by Nikon Corporation, NA=1.30, dipolar, 6% halftone phase shift mask), baked (PEB) at appropriate temperature for 60 seconds, and developed with a 2.38% by mass tetramethylammonium hydroxide aqueous solution for 60 seconds.

For the evaluation of resist film, a 1:1 line and space pattern with 40 nm was observed as a subject by using an electron microscope. The optimum exposure dose (Eop, mJ/cm$^2$) was an exposure dose that provided a line width of 40 nm. The pattern shapes at this optimum exposure dose were compared each other, and rectangularity was visually evaluated.

The roughness of the sidewall of the line pattern at the optimum exposure dose was converted into a numerical value by determining variation of width (LWR; measurement was performed at 30-point, and 3σ value was calculated) and the values were compared each other (see LWR (nm) in Table).

The minimum size to be resolved without fall of line when the line size is thinned by increasing the exposure dose was determined. This size was defined as fall limit (nm). A smaller value indicates higher fall resistance, and is preferable.

Exposure was conducted through a mask in which the pitch was fixed (80 nm) and only the line width was changed (38 to 42 nm, in units of 1 nm) in the size of on-wafer at the above-mentioned optimum exposure dose, and after transcription of the wafer, the size was measured. Regarding the line width, the size of the transferred pattern relative to the size of mask design was plotted, and the slope was calculated by using collinear approximation as a mask error factor (MEF). As the MEF is smaller, the effect of manufacturing error of the mask pattern is suppressed. Therefore, it is good.
(Evaluation Result)
The evaluation results are shown in Table 5.

TABLE 5

| | Resist | EoP (mJ/cm$^2$) | MEF | LWR (nm) | Fall limit (nm) | Pattern profile |
|---|---|---|---|---|---|---|
| Example 2-1 | R-01 | 32 | 2.3 | 2.8 | 31 | Rectangular |
| Example 2-2 | R-02 | 31 | 2.4 | 2.9 | 31 | Rectangular |
| Example 2-3 | R-03 | 31 | 2.5 | 3.1 | 30 | Rectangular |
| Example 2-4 | R-04 | 33 | 2.4 | 3.2 | 29 | Rectangular |
| Example 2-5 | R-05 | 32 | 2.4 | 3.0 | 28 | Rectangular |
| Example 2-6 | R-06 | 37 | 2.6 | 2.9 | 30 | Rectangular |
| Example 2-7 | R-07 | 38 | 2.7 | 2.8 | 29 | Rectangular |
| Example 2-8 | R-08 | 39 | 2.6 | 2.8 | 28 | Rectangular |
| Example 2-9 | R-09 | 38 | 2.5 | 2.8 | 28 | Rectangular |
| Example 2-10 | R-10 | 29 | 2.7 | 3.0 | 30 | Rectangular |
| Example 2-11 | R-11 | 32 | 2.4 | 2.9 | 30 | Rectangular |
| Example 2-12 | R-12 | 40 | 2.3 | 3.2 | 31 | Rectangular |
| Example 2-13 | R-13 | 41 | 2.6 | 3.3 | 31 | Rectangular |
| Example 2-14 | R-14 | 28 | 2.8 | 3.3 | 32 | Rectangular |
| Comparative Example 2-1 | R-23 | 26 | 4.1 | 4.6 | 38 | Rounding profile |
| Comparative Example 2-2 | R-24 | 36 | 3.9 | 4.8 | 44 | Rounding profile |

The results shown in Table 5 reveal that the chemically amplified resist composition of Examples 2-1 to 2-14 using the photo acid generator of the present invention can give a pattern excellent in LWR, MEF, and fall limit and having a rectangular profile in the ArF exposure with alkaline development, as compared with the chemically amplified resist composition of Comparative Examples 2-1 and 2-2 without the photo acid generator of the present invention.

Examples 3-1 to 3-14

Comparative Examples 3-1 and 3-2

ArF Exposure Evaluation 2
(Evaluation Method)
Spin-on carbon film ODL-50 (80% by mass of the carbon content, manufactured by Shin-Etsu Chemical Co., Ltd.) was formed on a silicon wafer with a film thickness of 200 nm, and then, silicon-containing spin-on hard mask SHB-A940 (43% by mass of the silicon content) was formed thereon with a film thickness of 35 nm to obtain a substrate for a tri-layer process. On the substrate thus prepared, each of Resist compositions R-01 to R-14, R-23, and R-24 shown in Table 4 was applied by spin coating, and then baked (PAB) by using a hot plate at 100° C. for 60 seconds to obtain the resist film having a film thickness of 90 nm.

This was subjected to exposure by using an ArF excimer laser immersion scanner (NSR-610C, manufactured by Nikon Corporation, NA: 1.30, σ: 0.98/0.74, dipole opening degree: 90°, s-polarized illumination) while changing the exposure dose. After then, the film was baked (PEB) at appropriate temperature for 60 seconds, developed for 30 seconds with butyl acetate, and then rinsed with diisoamyl ether. The pattern shape at the optimum exposure dose was compared, and rectangularity was visually evaluated.

A halftone phase shift mask having a transmittance of 6% was used as a mask, and a trench pattern formed in the light-shielding part of the pattern printed from the on-mask design of 45 nm line/90 nm pitch (the actual dimension is four times larger due to ¼ reduction projection exposure) was measured with a length measuring SEM (CG4000, manufactured by Hitachi High-Technologies Corp.). The optimum exposure dose (Eop, mJ/cm$^2$) was an exposure dose that provided a trench width of 45 nm. At this optimum exposure dose, variation (3σ) of the trench width in intervals of 10 nm over the range of 200 nm was determined, and defined as LWR (nm).

As the exposure dose is decreased, the trench size is increased and the line size is decreased. The maximum trench width to be resolved without line fall was determined as fall limit (nm). A larger value indicates higher fall resistance, and is preferable.
(Evaluation Result)
The evaluation results are shown in Table 6.

TABLE 6

| | Resist | EoP (mJ/cm$^2$) | LWR (nm) | Fall limit (nm) | Pattern profile |
|---|---|---|---|---|---|
| Example 3-1 | R-01 | 35 | 3.6 | 56 | Rectangular |
| Example 3-2 | R-02 | 34 | 3.7 | 55 | Rectangular |
| Example 3-3 | R-03 | 34 | 3.9 | 55 | Rectangular |
| Example 3-4 | R-04 | 37 | 4.0 | 54 | Rectangular |
| Example 3-5 | R-05 | 36 | 3.8 | 53 | Rectangular |
| Example 3-6 | R-06 | 42 | 3.7 | 55 | Rectangular |
| Example 3-7 | R-07 | 42 | 3.6 | 54 | Rectangular |
| Example 3-8 | R-08 | 43 | 3.6 | 53 | Rectangular |
| Example 3-9 | R-09 | 43 | 3.5 | 53 | Rectangular |
| Example 3-10 | R-10 | 33 | 3.8 | 54 | Rectangular |
| Example 3-11 | R-11 | 36 | 3.7 | 51 | Rectangular |
| Example 3-12 | R-12 | 44 | 3.9 | 56 | Rectangular |
| Example 3-13 | R-13 | 45 | 4.1 | 57 | Rectangular |
| Example 3-14 | R-14 | 32 | 4.0 | 57 | Rectangular |
| Comparative Example 3-1 | R-23 | 30 | 5.5 | 31 | T-top |
| Comparative Example 3-2 | R-24 | 40 | 5.6 | 32 | T-top |

The results shown in Table 6 reveal that the chemically amplified resist composition of Examples 3-1 to 3-14 using the photo acid generator of the present invention can give a pattern excellent in LWR and fall limit and having a rectangular profile in the ArF exposure with organic solvent development, as compared with the chemically amplified resist composition of Comparative Examples 3-1 and 3-2 without the photo acid generator of the present invention.

Examples 4-1 to 4-8, Comparative Examples 4-1 and 4-2

Electron Beam Lithography Evaluation
(Evaluation Method)
Each of resist compositions R-15 to R-22, R-25, and R-26 shown in Table 4 was applied by spin coating onto a mask blank with the size of 152-mm square having a chromium oxynitride film on its outermost surface by using an ACT-M (manufactured by Tokyo Electron, Ltd.), and then pre-baked on a hot plate at 90° C. for 600 seconds to obtain a resist film having a film thickness of 90 nm. The thickness of the obtained resist film was measured with an optical measurement apparatus Nanospec (manufactured by Nanometrics, Inc.). The film thickness was measured at 81 in-plate positions of a blank substrate except for an outer edge portion within 10 mm from the blank outer circumference to calculate the average film thickness value and the range of the film thickness.

Further, the resist film was exposed by using an electron beam exposure apparatus (EBM-5000plus, manufactured by NuFlare Technology, Inc. with acceleration voltage of 50 keV), baked (PEB) at 90° C. for 600 seconds, and developed with a 2.38% by mass tetramethylammonium hydroxide aqueous solution to obtain a positive resist pattern. The obtained resist pattern was evaluated as follows.

The patterned mask blank thus obtained was observed with a top-down SEM (scanning electron microscope). The exposure dose for resolving a 1:1 line and space (LS) with 400 nm so as to be 1:1 was defined as the optimal exposure dose ($\mu C/cm^2$), and the minimum size at the exposure dose for resolving a 400 nm 1:1 LS so as to be 1:1 was defined as resolution (limiting resolution) to measure the edge roughness (LER) of 200 nm LS by using SEM. It was visually determined whether the pattern shape is rectangular or not. To evaluate CDU, the line width when subjected to the exposure dose ($\mu C/cm^2$) for resolving a 400 nm 1:1 line and space so as to be 1:1 was measured at 49 in-plate positions of the blank substrate except for an outer edge portion within 20 mm from a blank outer circumference to calculate $3\sigma$ value from a value obtained by deducting each measuring points from the average line width value.

(Evaluation Result)

The evaluation results are shown in Table 7.

TABLE 7

| Resist | EoP ($\mu C/cm^2$) | Limiting resolution (nm) | LER (nm) | CDU ($3\sigma$) (nm) | Pattern profile |
|---|---|---|---|---|---|
| Example 4-1 | R-15 | 26 | 45 | 4.8 | 2.4 | Rectangular |
| Example 4-2 | R-16 | 26 | 45 | 4.7 | 2.5 | Rectangular |
| Example 4-3 | R-17 | 24 | 40 | 4.8 | 2.3 | Rectangular |
| Example 4-4 | R-18 | 24 | 40 | 4.7 | 2.4 | Rectangular |
| Example 4-5 | R-19 | 25 | 40 | 4.6 | 2.2 | Rectangular |
| Example 4-6 | R-20 | 24 | 40 | 4.6 | 2.3 | Rectangular |
| Example 4-7 | R-21 | 27 | 45 | 4.9 | 2.5 | Rectangular |
| Example 4-8 | R-22 | 27 | 45 | 4.9 | 2.5 | Rectangular |
| Comparative Example 4-1 | R-25 | 26 | 55 | 6.0 | 3.4 | Rounding profile |
| Comparative Example 4-2 | R-26 | 26 | 55 | 7.6 | 3.6 | Rounding profile |

The results shown in Table 7 reveal that the chemically amplified resist composition of Examples 4-1 to 4-8 using the photo acid generator of the present invention can give a pattern excellent in resolution, LER, and CDU and having a rectangular profile also in the electron beam exposure, as compared with the chemically amplified resist composition of Comparative Examples 4-1 and 4-2 without the photo acid generator of the present invention.

As explained above, it is revealed that when the chemically amplified resist composition containing the photo acid generator of the present invention is used to form a pattern, the obtained pattern is excellent in LER, CDU, and resolution and has a rectangular profile.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

What is claimed is:

1. A photo acid generator represented by the following general formula (1b),

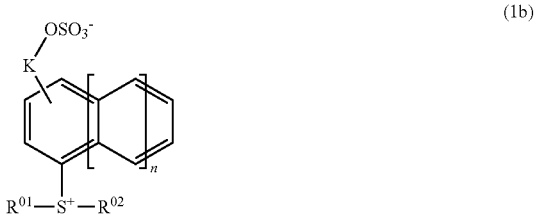

(1b)

wherein $R^{01}$ and $R^{02}$ each independently represent a linear monovalent hydrocarbon group having 1 to 20 carbon atoms or a branched or cyclic monovalent hydrocarbon group having 3 to 20 carbon atoms which may be substituted with a heteroatom, or interposed by a heteroatom; and $R^{01}$ and $R^{02}$ may be mutually bonded to form a ring together with the sulfur atom in the formula; K represents a single bond or a linear divalent hydrocarbon group having 1 to 20 carbon atoms or a branched or cyclic divalent hydrocarbon group having 3 to 20 carbon atoms which may be substituted with a heteroatom, or interposed by a heteroatom; and "n" is 0 or 1.

2. A chemically amplified resist composition comprising (A) a base resin, (B) the photo acid generator according to claim 1, and (C) an organic solvent.

3. The chemically amplified resist composition according to claim 2, wherein the component (A) is a polymer compound having a repeating unit represented by the following general formula (2) and a repeating unit represented by the following general formula (3),

(2)

(3)

wherein $R^1$ represents a hydrogen atom, a fluorine atom, a methyl group or a trifluoromethyl group; Z represents any of a single bond, a phenylene group, a naphthylene group, and a (main chain)—C(═O)—O—Z'—; Z' represents a phenylene group, a naphthylene group, or a linear alkylene group having 1 to 10 carbon atoms or a branched or cyclic alkylene group having 3 to 10 carbon atoms which may have any of a hydroxyl group, an ether bond, an ester bond, and a lactone ring; XA represents an acid-labile group; and YL represents a hydrogen atom, or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride.

4. The chemically amplified resist composition according to claim 2, wherein the component (A) is a polymer compound having a repeating unit represented by the following general formula (4) and a repeating unit represented by the following general formula (5),

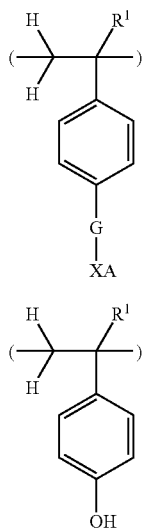

wherein $R^1$ represents a hydrogen atom, a fluorine atom, a methyl group or a trifluoromethyl group; XA represents an acid-labile group; and G represents an oxygen atom or a carbonyloxy group, with the proviso that when G is a carbonyloxy group, a carbon atom of the carbonyloxy group is bonded to the benzene ring in the general formula (4).

5. The chemically amplified resist composition according to claim 2, further comprising a photo acid generator besides the component (B).

6. The chemically amplified resist composition according to claim 2, further comprising a quencher.

7. The chemically amplified resist composition according to claim 2, further comprising a surfactant insoluble in water and soluble in alkaline developer.

8. A chemically amplified resist composition comprising (A) a base resin, (B) a photo acid generator, and (C) an organic solvent, the photo acid generator being represented by the following general formula (1a),

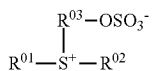

wherein $R^{01}$ and $R^{02}$ each independently represent a linear monovalent hydrocarbon group having 1 to 20 carbon atoms or a branched or cyclic monovalent hydrocarbon group having 3 to 20 carbon atoms which may be substituted with a heteroatom, or interposed by a heteroatom; $R^{03}$ represents a linear divalent hydrocarbon group having 1 to 30 carbon atoms or a branched or cyclic divalent hydrocarbon group having 3 to 30 carbon atoms which may be substituted with a heteroatom, or interposed by a heteroatom; and $R^{01}$ and $R^{02}$ may be mutually bonded to form a ring together with the sulfur atom in the formula.

9. The chemically amplified resist composition according to claim 8, wherein the component (A) is a polymer compound having a repeating unit represented by the following general formula (2) and a repeating unit represented by the following general formula (3),

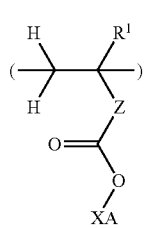

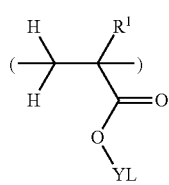

wherein $R^1$ represents a hydrogen atom, a fluorine atom, a methyl group or a trifluoromethyl group; Z represents any of a single bond, a phenylene group, a naphthylene group, and a (main chain)-C(=O)—O—Z'—; Z' represents a phenylene group, a naphthylene group, or a linear alkylene group having 1 to 10 carbon atoms or a branched or cyclic alkylene group having 3 to 10 carbon atoms which may have any of a hydroxyl group, an ether bond, an ester bond, and a lactone ring; XA represents an acid-labile group; and YL represents a hydrogen atom, or a polar group having one or more structures selected from a hydroxyl group, a cyano group, a carbonyl group, a carboxyl group, an ether bond, an ester bond, a sulfonate ester bond, a carbonate bond, a lactone ring, a sultone ring, and a carboxylic anhydride.

10. The chemically amplified resist composition according to claim 8, wherein the component (A) is a polymer compound having a repeating unit represented by the following general formula (4) and a repeating unit represented by the following general formula (5),

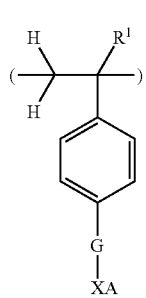

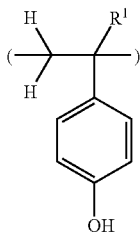

(5)

wherein $R^1$ represents a hydrogen atom, a fluorine atom, a methyl group or a trifluoromethyl group; XA represents an acid-labile group; and G represents an oxygen atom or a carbonyloxy group, with the proviso that when G is a carbonyloxy group, a carbon atom of the carbonyloxy group is bonded to the benzene ring in the general formula (4).

11. The chemically amplified resist composition according to claim 8, further comprising a photo acid generator besides the component (B).

12. The chemically amplified resist composition according to claim 8, further comprising a quencher.

13. The chemically amplified resist composition according to claim 8, further comprising a surfactant insoluble in water and soluble in alkaline developer.

14. A patterning process comprising the steps of: applying the chemically amplified resist composition according to claim 8 onto a substrate; performing exposure by a high energy beam after heat treatment; and performing development by using a developer.

15. The patterning process according to claim 14, wherein in the exposure step, a liquid having a refractive index of 1.0 or more is placed between a resist coat film and a projection lens to perform immersion exposure.

16. The patterning process according to claim 15, wherein a top coat is applied on the resist coat film, and the liquid having a refractive index of 1.0 or more is placed between the top coat and the projection lens to perform the immersion exposure.

17. The patterning process according to claim 14, wherein the high energy beam for exposure is a KrF excimer laser, an ArF excimer laser, an electron beam, or a soft X-ray having a wavelength range of 3 to 15 nm.

18. A patterning process comprising the steps of: applying the chemically amplified resist composition according to claim 8 onto a substrate having a layer containing chromium at an outermost layer; imagewise writing with an electron beam after heat treatment; and performing development by using a developer.

19. A patterning process comprising the steps of: applying the chemically amplified resist composition according to claim 8 onto a photomask blank formed with a chromium compound film; imagewise writing with an electron beam after heat treatment; and performing development by using a developer.

* * * * *